(12) United States Patent
Whetsel

(10) Patent No.: US 9,625,525 B2
(45) Date of Patent: Apr. 18, 2017

(54) IC DECOMPRESS AND MASKABLE COMPRESS TAM WITH SFIR AND SFCR

(71) Applicant: TEXAS INSTRUMENTS INCORPORATED, Dallas, TX (US)

(72) Inventor: Lee D. Whetsel, Parker, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 15/077,322

(22) Filed: Mar. 22, 2016

(65) Prior Publication Data

US 2016/0202318 A1 Jul. 14, 2016

Related U.S. Application Data

(62) Division of application No. 14/314,475, filed on Jun. 25, 2014, now Pat. No. 9,322,875, which is a division of application No. 13/693,709, filed on Dec. 4, 2012, now Pat. No. 8,799,712, which is a division of application No. 13/157,927, filed on Jun. 10, 2011, now Pat. No. 8,352,792, which is a division of application No. 12/638,498, filed on Dec. 15, 2009, now Pat. No. 7,984,331, which is a division of application No. 11/694,115, filed on Mar. 30, 2007, now Pat. No. 7,657,790.

(60) Provisional application No. 60/744,312, filed on Apr. 5, 2006.

(51) Int. Cl.
| | |
|---|---|
| G06F 11/00 | (2006.01) |
| G01R 31/3177 | (2006.01) |
| G01R 31/317 | (2006.01) |
| G01R 31/3185 | (2006.01) |

(52) U.S. Cl.
CPC ... *G01R 31/3177* (2013.01); *G01R 31/31727* (2013.01); *G01R 31/318536* (2013.01); *G01R 31/318544* (2013.01)

(58) Field of Classification Search
CPC ........ G01R 31/3177; G01R 31/318536; G06F 11/2236
See application file for complete search history.

(56) References Cited

U.S. PATENT DOCUMENTS

| | | | |
|---|---|---|---|
| 5,526,365 | A | 6/1996 | Whetsel |
| 5,606,566 | A | 2/1997 | Whetsel |
| 5,831,922 | A | 11/1998 | Choi |
| 6,389,565 | B2 | 5/2002 | Ryan et al. |
| 6,701,476 | B2 | 3/2004 | Pouya et al. |
| 6,769,080 | B2 | 7/2004 | Whetsel |
| 7,296,200 | B2 | 11/2007 | Park et al. |
| 7,487,419 | B2 | 2/2009 | Mukherjee et al. |
| 7,493,540 | B1 | 2/2009 | Rajski et al. |

(Continued)

OTHER PUBLICATIONS

DaSilva et al. "Overview of the IEEE P1500 Standard." Proc 2003 International Test Conference. Sep. 28-Oct. 3, 2003.

*Primary Examiner* — Philip Guyton
(74) *Attorney, Agent, or Firm* — Lawrence J. Bassuk; Charles A. Brill; Frank D. Cimino

(57) ABSTRACT

Testing of an electrical device is achieved by providing a test access mechanism within the device that can receive scan frames from an external tester. The received scan frames contain stimulus data to be applied to circuitry within the device to be tested, a command for enabling a test control operation, and a frame marker bit to indicate the end of the scan frame pattern. The inputting of scan frames can occur continuously and simultaneous with a commanded test control operation.

5 Claims, 34 Drawing Sheets

(56) References Cited

U.S. PATENT DOCUMENTS

| | | |
|---|---|---|
| 7,506,231 B2 | 3/2009 | Chang et al. |
| 7,620,866 B2 | 11/2009 | Marinissen et al. |
| 8,352,792 B2 | 1/2013 | Whetsel |
| 8,799,712 B2 | 8/2014 | Whetsel |
| 2008/0265906 A1 | 10/2008 | Waayers |
| 2009/0193303 A1 | 7/2009 | Giles et al. |
| 2014/0304564 A1 | 10/2014 | Whetsel |

IC DECOMPRESS AND MASKABLE COMPRESS TAM WITH SFIR AND SFCR

CROSS REFERENCE TO RELATED APPLICATIONS

This application is a divisional of prior application Ser. No. 14/314,475, filed Jun. 25, 2014, now U.S. Pat. No. 9,322,875, issued Apr. 26, 2016;

Which was a divisional of prior application Ser. No. 13/693,709, filed Dec. 4, 2012, now U.S. Pat. No. 8,799,712, granted Aug. 5, 2014;

Which was a divisional of prior application Ser. No. 13/157,927, filed Jun. 10, 2011, now U.S. Pat. No. 8,352,792, granted Jan. 8, 2013;

Which is a divisional of prior application Ser. No. 12/638,498, filed Dec. 15, 2009, now U.S. Pat. No. 7,984,331, granted Jul. 19, 2011;

Which is a divisional of prior application Ser. No. 11/694,115, filed Mar. 30, 2007, now U.S. Pat. No. 7,657,790, granted Feb. 2, 2010;

Which claims priority from Provisional Application No. 60/744,312, filed Apr. 5, 2006.

The following documents and paper reference include subject matter which is related to the subject matter of this application. The documents have been assigned to the assignee of this application, and are incorporated herein by reference.

TI-27442, application Ser. No. 09/257,760, filed Feb. 25, 1999, now U.S. Pat. No. 6,405,335, granted Jun. 11, 2002;

TI-60187, application Ser. No. 11/370,017, filed Mar. 7, 2006, now U.S. Pat. No. 7,421,633, granted Sep. 2, 2008;

TI-61778, application Ser. No. 11/565,979, filed Dec. 1, 2006, now U.S. Pat. No. 7,417,450, granted Aug. 28, 2008;

TI-61921, application Ser. No. 11/670,241, filed Feb. 1, 2007;

Test Data Compression and Compaction for Embedded Test of Nanometer Technology Designs, Proceedings of 21$^{st}$ IEEE International Conference on Computer Design 2003.

BACKGROUND OF THE INVENTION

Field of the Invention

The present invention relates generally to testing of electrical circuits and, more particularly, to testing of electrical circuits using scan framing circuits and techniques which allow circuits to be tested in a more efficient manner than achieved using conventional test approaches.

Description of Related Art

FIG. 1A illustrates a prior art device 100 having a core 102 with parallel scan paths 104. The core is tested by an external tester inputting stimulus to the scan path inputs, receiving response from the scan paths outputs, and inputting test control to operate the scan paths. This type of testing is well known.

FIG. 1B illustrates a prior art device 106 having a core 108 with parallel scan paths 110. The stimulus inputs to the scan paths come from a parallel scan distributor (PSC) 112 and the response outputs from the scan paths are input to a parallel scan collector (PSC) 114. The core is tested by an external tester serially inputting stimulus to the PSD via a scan input, serially outputting response from the PSC via a scan output, and inputting test control to operate the PSD, PSC and scan paths. This type of serial to parallel and parallel to serial scan testing was described in U.S. Pat. No. 6,405,335 (Position Independent Testing of Circuits), which is incorporated herein by reference.

FIG. 1C illustrates a prior art device 116 having a core 118 with parallel scan paths 120. The stimulus inputs to the scan paths come from a decompressor (DEC) circuit 122 and the response outputs from the scan paths are input to a compressor (COM) 124, sometimes referred to as a multiple input shift register (MISR) or compactor. The core is tested by an external tester serially inputting compressed stimulus patterns to the DEC via one or more scan inputs, decompressing the stimulus patterns and inputting them to the scan paths, while simultaneously compressing the response outputs from the scan paths in the COM and outputting the compressed response patterns from the COM via one or more scan outputs. The tester inputs control to operate the DEC, COM, and scan paths during test. This type of response compression and stimulus decompression testing is well known as indicated by a paper referenced in the Reference to Related Art section.

FIG. 1D illustrates a prior art device 126 having a core 128 with parallel scan paths 130. The stimulus inputs to the scan paths come from a stimulus pattern generator (GEN) circuit 132 and the response outputs from the scan paths are input to a response pattern compressor (COM) circuit 134. The core is tested by an external tester inputting control to operate the GEN, COM, and scan paths during test. This type of testing is referred to a built in self test (BIST), which is very well known.

SUMMARY OF THE INVENTION

The present invention describes test access mechanisms (TAM) circuits that can be used to improve the scan testing of cores. The TAMs are based on a new method of inputting and outputting scan test data to and from core scan paths using a scan framing technique.

DESCRIPTION OF THE VIEWS OF THE INVENTION

DETAILED DESCRIPTION OF THE INVENTION

Figure 2:
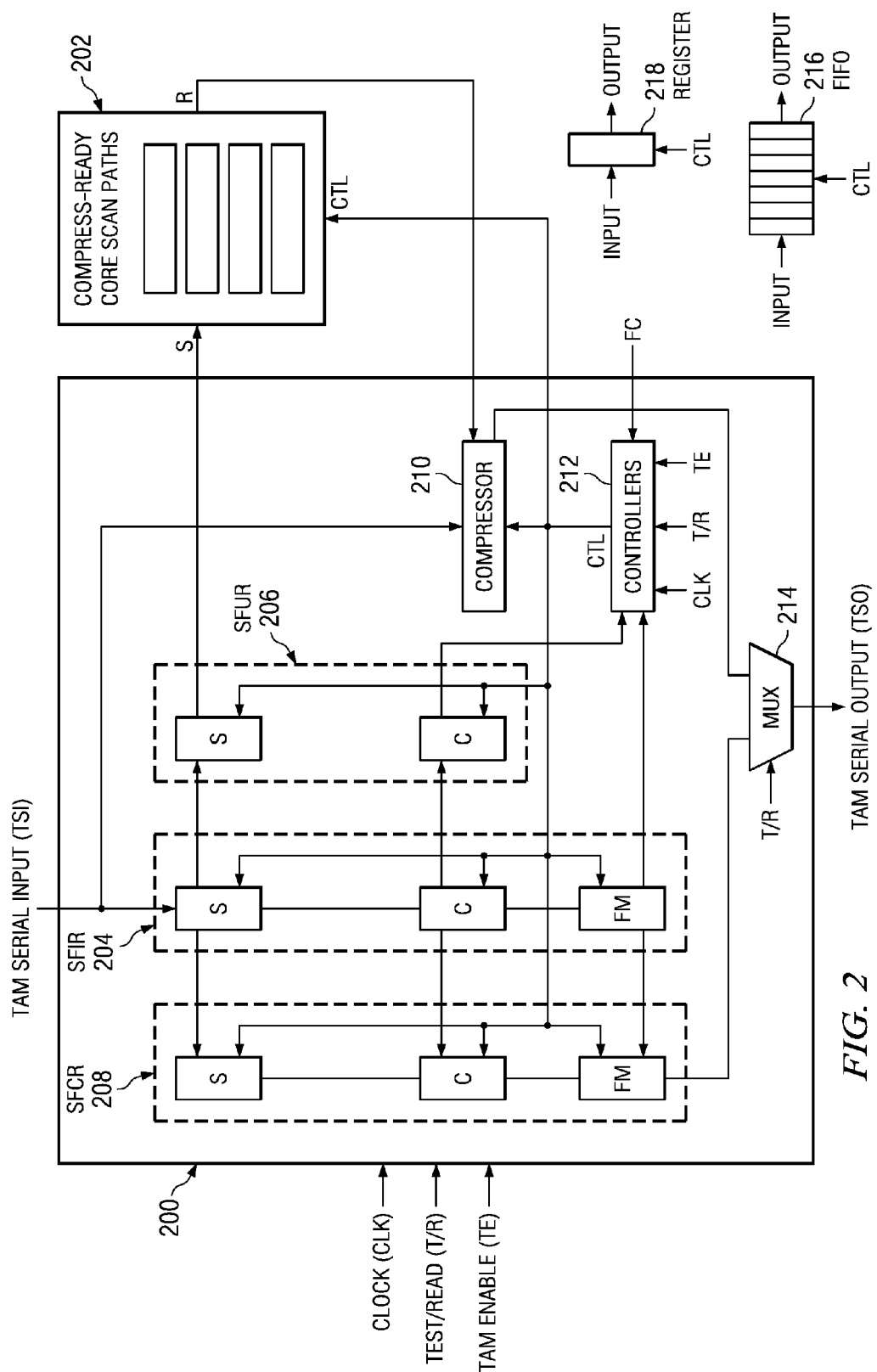
FIG. 2 illustrates a test access mechanism for testing a core according to the present invention.

FIG. 2 illustrates a Stimulus & Compress TAM 200 that can be coupled to a core within a device, or integrated circuit, to enable testing of the core according to the present invention. This TAM is for use with Compress-Ready Core Scan Paths 202, i.e. the response from the scan paths does not contain unknown states. The TAM includes a Scan Frame Input Register (SFIR) 204, a Scan Frame Copy Register (SFCR) 208, a Scan Frame Update Register (SFUR) 206, a Compressor 210, a Controller 212, and multiplexer 214. The SFIR and SFCR both comprise a Stimulus (S) section, a Command (C) section, and a Frame Marker (FM) section. The SFUR comprises a Stimulus (S) section and a Command (C) section. The TAM has a TAM Serial Input (TSI), a TAM Serial Output (TSO), a Clock (CLK) input, a Test/Read (T/R) mode input, a TAM Enable (TE) input, a Functional Clock (FC) input, a Stimulus (S) output bus to the core, a Response (R) input bus from the core, and a Control (CTL) output bus to the core. These TAM inputs and outputs form a standardized interface for all TAMs described in this disclosure. The Stimulus (S) bus from the SFUR is input to the core scan paths, the Response (R) bus from the core scan paths is input to the Compressor, and the Control (CTL) bus from the Controller provides control for the TAM circuits and core scan paths. When TE is set high and T/R is set for Test operation, the Controller is enabled to shift scan frames into the SFIR from TSI and shift scan frames out of the SFCR on TSO, in response to the CLK input. When the FM signal from the SFIR goes high, the Controller transfers the contents of the S and C sections of the SFIR into the S and C sections of the SFUR, the S, C, and FM sections of the SFIR into the S, C, and FM sections of the SFCR, and then clears the SFIR. Clearing the SFIR to logic zeros allows for detecting the FM (a logic one) in the next scan frame input. Following the transfer and clear operation, the Controller executes the Command (C) output from the SFUR. The Controller can execute the Command timed by either the CLK input or a Functional Clock (FC) input. During the Command execution, the stimulus (S) data from the SFUR is input to the stimulus inputs of the core scan paths while the response (R) outputs from the core scan paths are compressed into a signature using the Compressor. While the Command is being executed, the next scan frame is shifted into the SFIR via TSI and the previous scan frame is shifted out of the SFCR via TSO. This process of shifting in a new scan frame from TSI, shifting out a previous scan frame from TSO, and executing a Command continues until the TE signal goes low to end the test operation. Following the test operation, the signature contained within the Compressor needs to be shifted out for inspection. This is accomplished by setting TE high and setting T/R for Read operation. During the read operation the Controller causes the Compressor to shift data from TSI to TSO via multiplexer 214 in response to the CLK input to unload the signature.

The S section of the SFUR 206 can be realized as either a register 218 or a FIFO 216. If the S section is a register, only one stimulus pattern is loaded into the register from the S section of the SFIR to be input to the core scan paths, and only one response pattern from the core scan paths is compressed in the compressor. If the S section is a FIFO a number of stimulus patterns can be stored in the FIFO from the S section of the SFIR to be output to the core scan paths while an equal number of response patterns from the core scan path are compressed in the compressor. As seen, the register 218 and FIFO 216 both have parallel inputs that are coupled to the S section of the SFIR, parallel outputs that are coupled to the stimulus inputs of the core scan paths, and control inputs from controller 212. The advantage of using the FIFO is that, in response to a command, multiple stimulus inputs, buffered up in the FIFO, can be rapidly input to the core scan paths, while an equal number of response outputs from the core scan paths can be rapidly compressed into the compressor.

Figure 3:
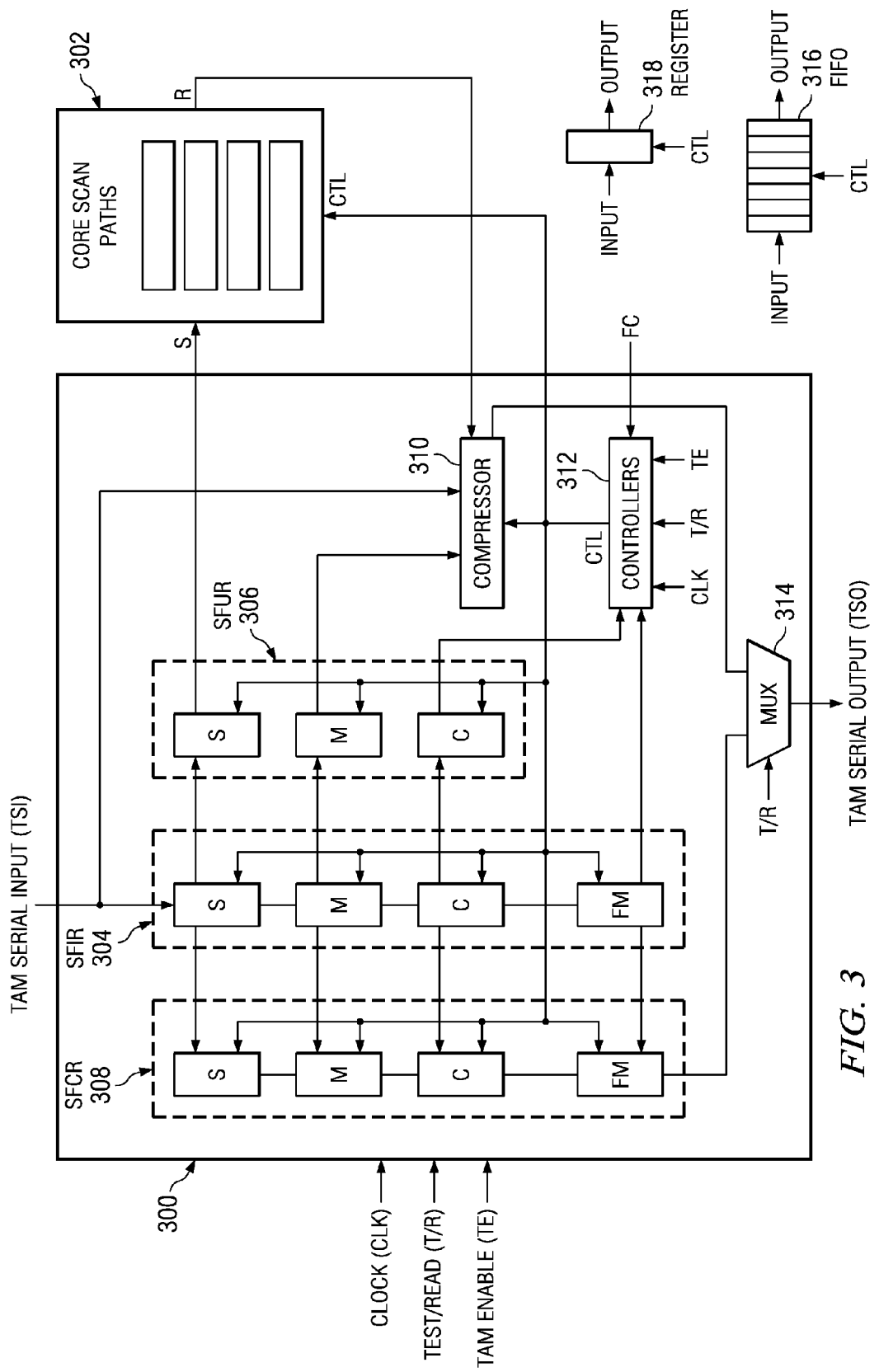
FIG. 3 illustrates a test access mechanism for testing a core according to the present invention.

FIG. 3 illustrates a Stimulus & Maskable Compress TAM 300 that can be coupled to a core within a device to enable testing of the core according to the present invention. This TAM is for use with Core Scan Paths 302 where the response output contains unknown states that need to be masked off. The TAM includes a SFIR 304, a SFCR 308, a SFUR 306, a Compressor 310, a Controller 312, and a multiplexer 314. The SFIR and SFCR both comprise a Stimulus (S) section, a Mask (M) section, a Command (C) section, and a Frame Marker (FM) section. The SFUR comprises a Stimulus (S) section, a Mask (M) section, and a Command (C) section. The TAM has the standardized inputs and outputs described in FIG. 2. The Stimulus (S) bus from the SFUR is input to the core scan paths. The Mask (M) bus from the SFUR is input to the Compressor to mask off unknown response inputs. The Response (R) bus from the core scan paths is input to the Compressor. The Control (CTL) bus from the Controller provides control for the TAM circuits and core scan paths. When TE is set high and T/R is set for Test operation, the Controller is enabled to shift scan frames into the SFIR from TSI and shift scan frames out of the SFCR on TSO, in response to the CLK input. When the FM signal from the SFIR goes high, the Controller transfers the contents of the S, M, and C sections of the SFIR into the S, M, and C sections of the SFUR, the S, M, C, and FM sections of the SFIR into the S, M, C, and FM sections of the SFCR, and then clears the SFIR. Following the transfer and clear operation, the Controller executes the Command (C) output from the SFUR. The Controller can execute the Command in response to either the CLK or FC signal. During the Command execution, the stimulus (S) data from the SFUR is input to the stimulus inputs of the core scan paths while the unmasked response (R) outputs from the core scan paths are compressed into a signature using the Compressor. While the Command is being executed, the next scan frame is shifted into the SFIR via TSI and the previous scan frame is shifted out of the SFCR via TSO. This process of shifting in a new scan frame from TSI, shifting out a previous scan frame from TSO, and executing a Command continues until the TE signal goes low to end the test operation. Following the test operation, the signature contained within the Compressor needs to be shifted out for inspection. This is accomplished by setting TE high and setting T/R for Read operation. During the read operation the Controller causes the Compressor to shift data from TSI to TSO via multiplexer 314 in response to the CLK input to unload the signature.

The S and M sections of the SFUR 306 can be realized as either a register 318 or a FIFO 316. If the S and M sections are registers, only one stimulus and mask pattern is loaded into the registers from the S and M sections of the SFIR to be input to the core scan paths and compressor 310, and only one response pattern from the core scan paths is compressed in the compressor. If the S and M sections are FIFOs a number of stimulus and mask patterns can be stored in the FIFOs from the S and M sections of the SFIR to be output to the core scan paths and compressor, while an equal number of response patterns from the core scan path are compressed in the compressor. An S section register 318 or FIFO 316 has parallel inputs coupled to the S section of the SFIR, parallel outputs coupled to the stimulus inputs of the core scan path, and control inputs from controller. An M section register 318 or FIFO 316 has parallel inputs coupled to the M section of the SFIR, parallel outputs coupled to the mask inputs of the compressor, and control inputs from controller. The advantage of using S and M FIFOs is that, in response to a command, multiple stimulus and mask inputs, buffered up in the FIFOs, can be rapidly input to the core scan paths and compressor, while an equal number of response outputs from the core scan paths can be rapidly compressed into the compressor.

Figure 4:
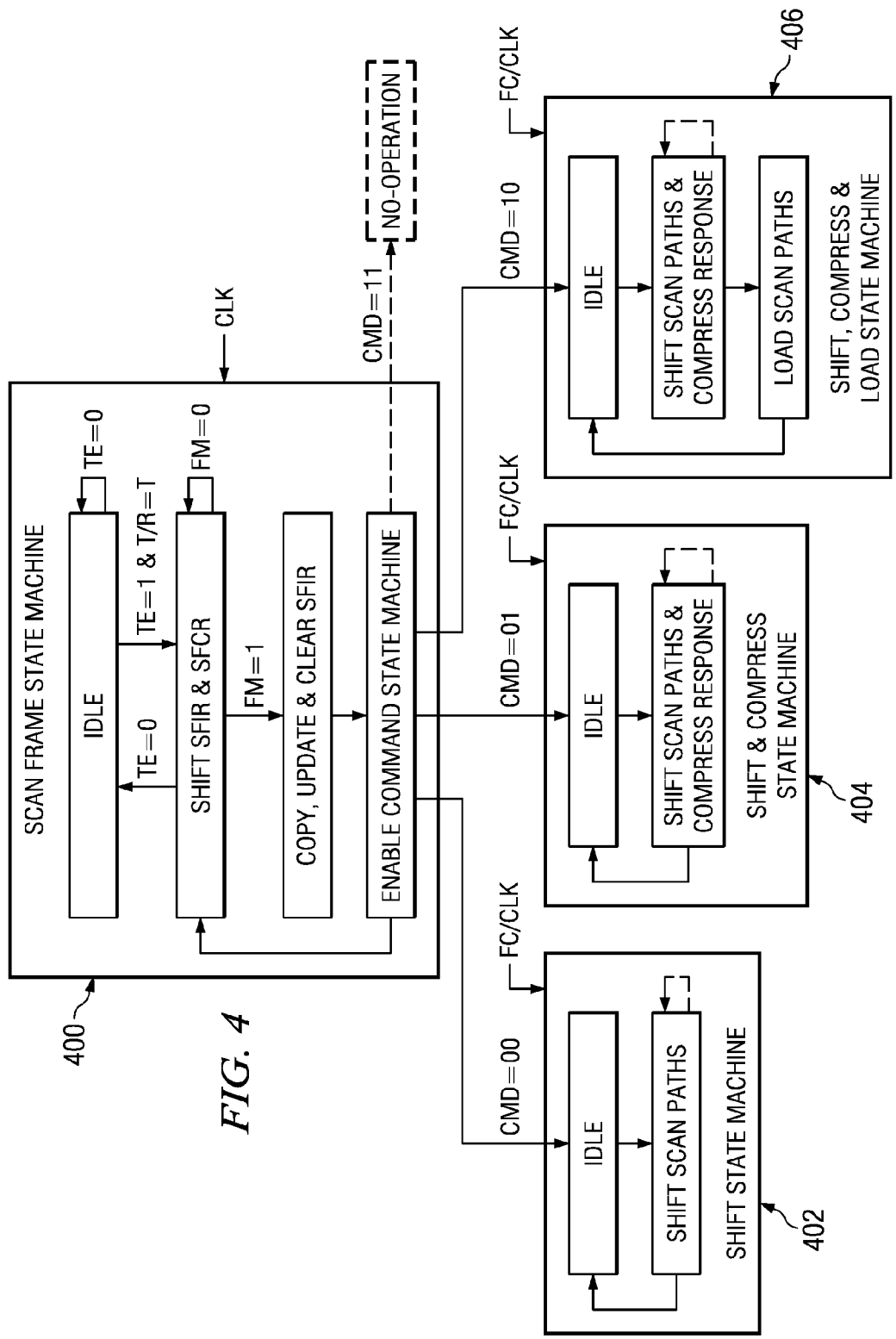
FIG. 4 illustrates the operation of the controller of the test access mechanisms of FIGS. 2 and 3.

FIG. 4 illustrates the operation of the Controllers of the FIGS. 2 and 3 TAMs when TE is high and T/R is set for test operation. The Controller consists of a Scan Frame state machine 400, a Shift state machine 402, a Shift & Compress state machine 404, and a Shift, Load, and Compress state machine 406. The Scan Frame state machine is clocked by the CLK input and is used to input and output scan frames from the SFIR and SFCR, respectively, and to enable one of the Command state machines in response to a Command input from the SFUR. The Scan Frame state machine has an Idle state where is resides when TE is low, a Shift SFIR & SFCR state where is shifts scan frames in from TSI and out on TSO while the FM signal is low, a Copy, Update, & Clear SFIR state where SFIR data is copied, updated and cleared, and an Enable Command State Machine state to enable one of the Command state machines. The Command state machines can be clocked by either the CLK or FC inputs. Clocking the Command state machines using the FC allows the core scan paths to perform test operations at the functional clock rate, which is usually much faster than the CLK rate and allows better at-speed, delay, and timing closure testing. In response to a Command of 00 (in this example) the Shift state machine 402 is enabled to transition from the Idle state to the Shift Scan Paths state and back to the Idle state. The Shift state machine is used to initialize the scan paths with stimulus data at the beginning of a test operation. In response to a Command of 01 (in this example) the Shift & Compress state machine 404 is enabled to transition from the Idle state to the Shift Scan Paths & Compress Response state and then back to the Idle state. The Shift & Compress state machine is used to shift in stimulus data to the core scan paths from the SFUR and to compress the response outputs from the core scan paths into the Compressor. In response to a Command of 10 (in this example) the Shift, Compress & Load state machine 406 is enabled to transition from the Idle state to the Shift Scan Paths & Compress Response state, then to the Load Scan Paths state, and then back to the Idle state. The Shift, Compress & Load state machine is used to shift in the last stimulus data patterns to the core scan paths from the SFUR during a current shift & compress test operation cycle, to compress the last response output patterns from the scan paths into the Compressor during the current shift & compress test operation cycle, and to load the scan paths with parallel response data from combinational logic in preparation for the next shift & compress test operation cycle. When the testing is complete, the TE signal is set low to cause the Scan Frame state machine to return to the Idle state.

As seen in FIG. 4, if FIFOs are used for the S and M sections of the SFURs of FIGS. 2 and 3, the Shift state machine 402 will remain in the shift scan paths state, the Shift & Compress state machine 404 will remain in the shift scan paths & compress response state, and the Shift, Compress & Load state machine 406 will remain in the shift scan paths & compress response state, as indicated by dotted line, for the number of FC/CLK cycles required to output buffered stimulus patterns from the S FIFO to the core scan path and buffered mask patterns from the M FIFO to the compressor.

FIG. 4 illustrates the operation of the Controllers of the FIGS. 2 and 3 TAMs when TE is high and T/R is set for test operation. The Controller consists of a Scan Frame state machine 400, a Shift state machine 402, a Shift & Compress state machine 404, and a Shift, Load, and Compress state machine 406. The Scan Frame state machine is clocked by the CLK input and is used to input and output scan frames from the SFIR and SFCR, respectively, and to enable one of the Command state machines in response to a Command input from the SFUR. The Scan Frame state machine has an Idle state where it resides when TE is low, a Shift SFIR & SFCR state where it shifts scan frames in from TSI and out on TSO while the FM signal is low, a Copy, Update, & Clear SFIR state where SFIR data is copied, updated and cleared, and an Enable Command State Machine state to enable one of the Command state machines. The Command state machines can be clocked by either the CLK or FC inputs. Clocking the Command state machines using the FC allows the core scan paths to perform test operations at the functional clock rate, which is usually much faster than the CLK rate and allows better at-speed, delay, and timing closure testing. In response to a Command of 00 (in this example) the Shift state machine 402 is enabled to transition from the Idle state to the Shift Scan Paths state and back to the Idle state. The Shift state machine is used to initialize the scan paths with stimulus data at the beginning of a test operation. In response to a Command of 01 (in this example) the Shift & Compress state machine 404 is enabled to transition from the Idle state to the Shift Scan Paths & Compress Response state and then back to the Idle state. The Shift & Compress state machine is used to shift in stimulus data to the core scan paths from the SFUR and to compress the response outputs from the core scan paths into the Compressor. In response to a Command of 10 (in this example) the Shift, Compress & Load state machine 406 is enabled to transition from the Idle state to the Shift Scan Paths & Compress Response state, then to the Load Scan Paths state, and then back to the Idle state. The Shift, Compress & Load state machine is used to shift in the last stimulus data patterns to the core scan paths from the SFUR during a current shift & compress test operation cycle, to compress the last response output patterns from the scan paths into the Compressor during the current shift & compress test operation cycle, and to load the scan paths with parallel response data from combinational logic in preparation for the next shift & compress test operation cycle. When the testing is complete, the TE signal is set low to cause the Scan Frame state machine to return to the Idle state.

Figure 1A:
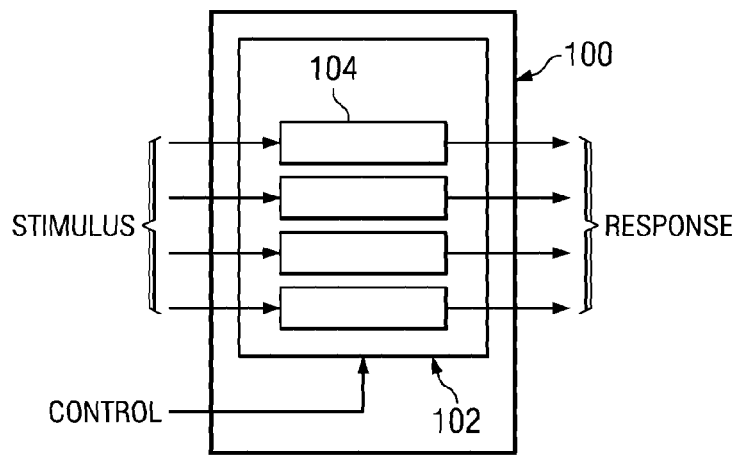
FIG. 1A illustrates testing of a core using parallel scan testing.
Figure 1B:
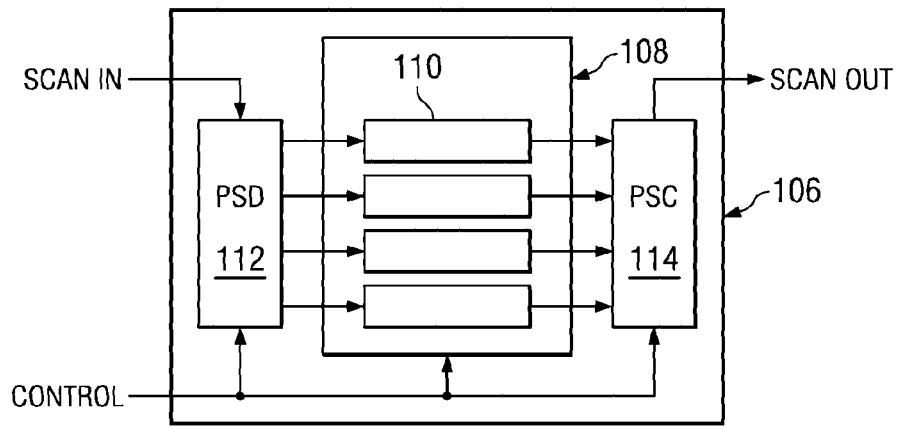
FIG. 1B illustrates scan testing of a core using Parallel Scan Distributor (PSD) and Parallel Scan Collector (PSC) circuits.
Figure 1C:
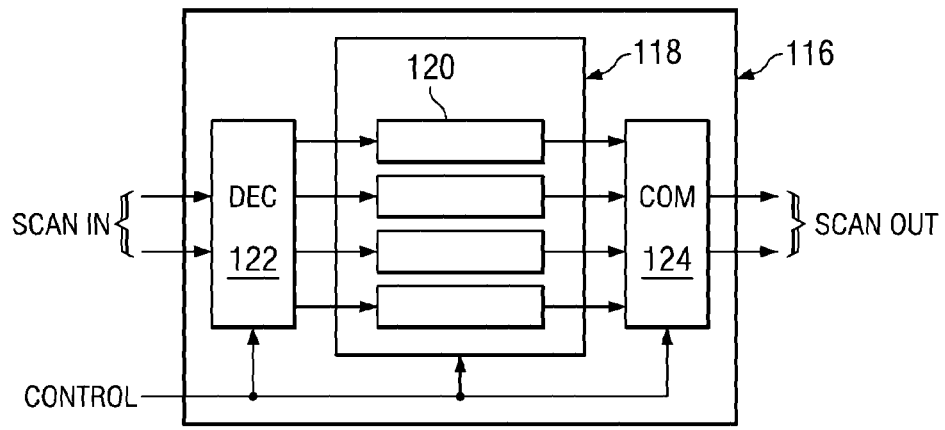
FIG. 1C illustrates scan testing of a core using Decompressor and Compressor circuits.
Figure 1D:
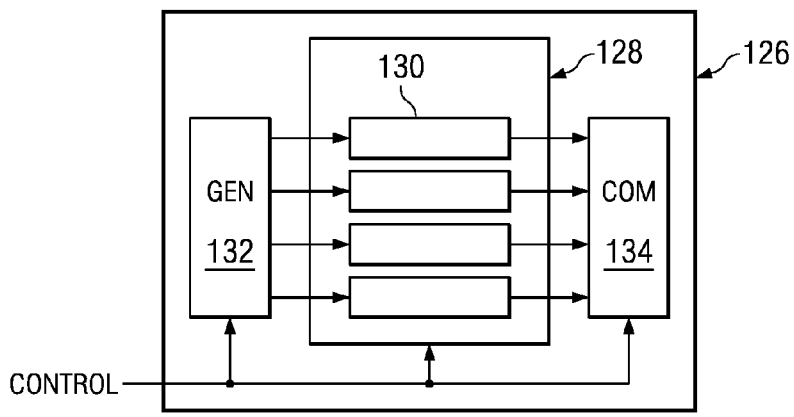
FIG. 1D illustrates scan testing of a core using Built-In Self test circuits.
Figure 5:
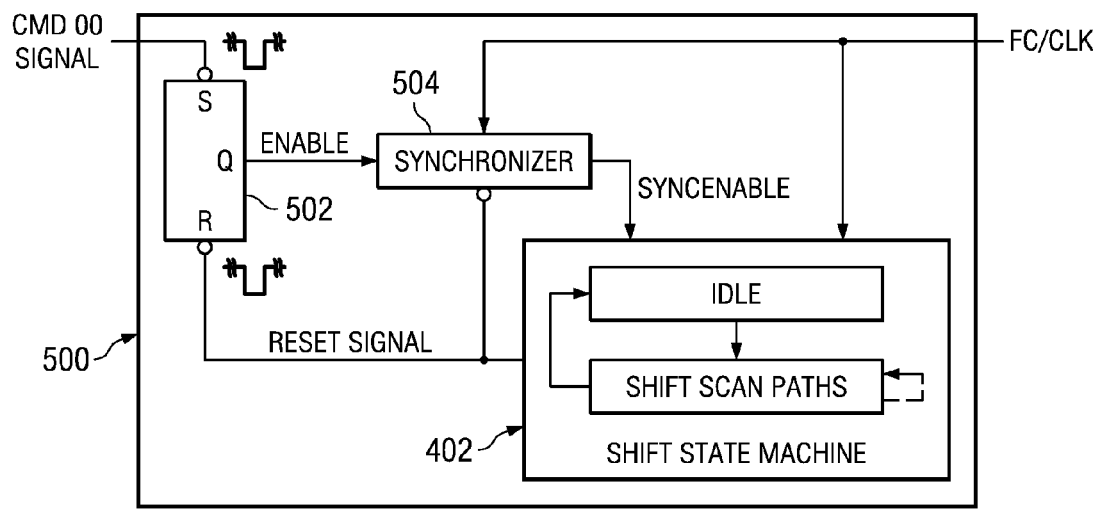
FIG. 5 illustrates a circuit for synchronizing the starting and stopping of a controller of a test access mechanism according to the present invention.

FIG. 5 illustrates an example circuit 500 for enabling the command state machines of the present invention when TE is high and T/R is set for test operation. The circuit consists of a set/reset latch 502, a synchronizer 504, and, in this example, the shift state machine 402 of FIG. 4. When a Command 00 signal pulse is output from the Scan Frame state machine 400 the latch's Enable output goes high and is input to the synchronizer. The synchronizer synchronizes the Enable signal with either the FC or CLK clock signal and outputs a synchronized enable (SyncEnable) signal to the Shift state machine. In response to the SyncEnable signal, the Shift state machine transitions from the Idle state to the Shift Scan Path state and back to the Idle state in response to the FC or CLK signal. Again as seen in dotted line, if FIFOs are used the Shift Scan Path state will be maintained until the FIFOs empty of data. The transition back into the Idle state produces a Reset signal pulse that resets the set/reset latch and synchronizer to disable the Shift state machine. The other command state machines in this presentation can be substituted for the Shift state machine of FIG. 5. All command state machines have the SyncEnable input to enable their operation, the FC or CLK inputs to time their operations, and the Reset signal output to terminate their operations upon returning back to their Idle state. The purpose of the synchronizer is to synchronize the Enable signal output from the set/reset latch in response to the CLK signal to the FC signal so that the command state machines start and operate synchronously with the FC signal. The CLK and FC are separate clock signals. The CLK clock is a test clock provided to the device from a tester. The FC clock is a functional clock that may be provided from a device pin, an oscillator, a PLL, or other clock providing source. If the command state machines are timed by the CLK signal, the synchronizer may be eliminated if desired since the CLK signal times both the Scan Frame state machine that produces the Enable signal and the starting and the operating of command state machines. Without the synchronizer the Enable signal from the set/reset latch is input directly to the command state machine in place of the SyncEnable input.

Figure 6:
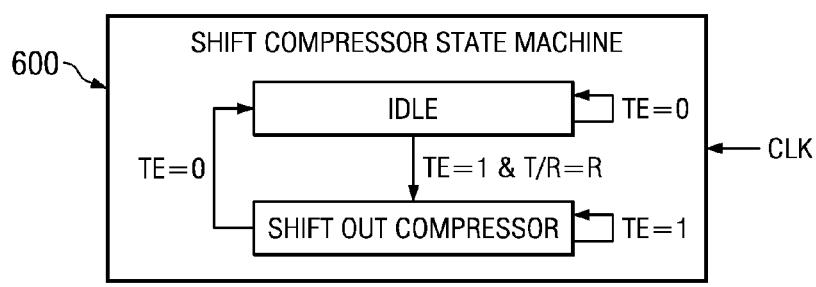
FIG. 6 illustrates the operation of the controller of the test access mechanisms of present invention during a signature read operation.

FIG. 6 illustrates the operation of the Shift Compressor state machine 600 of the TAM Controllers of FIGS. 2 and 3 when TE is high and T/R is set for Read operation. As seen, when the TE is high, the Shift Compressor state machine transitions from the Idle state to the Shift Out Compressor state. The state machine remains in the Shift Out Compressor state until TE returns low. In the Shift Out Compressor state the controller outputs control (CTL) to cause the Compressor to shift in data from TSI and shift out data on TSO. The shift out operation unloads the signature contained within the Compressor following a test operation. As seen in FIGS. 2 and 3, when T/R is set for Read operation multiplexer 214 or 314 couples the serial output from the Compressor to the TSO output of the TAM. This Shift Compressor state machine is used by all TAMs that have Compressors.

Figure 7A:
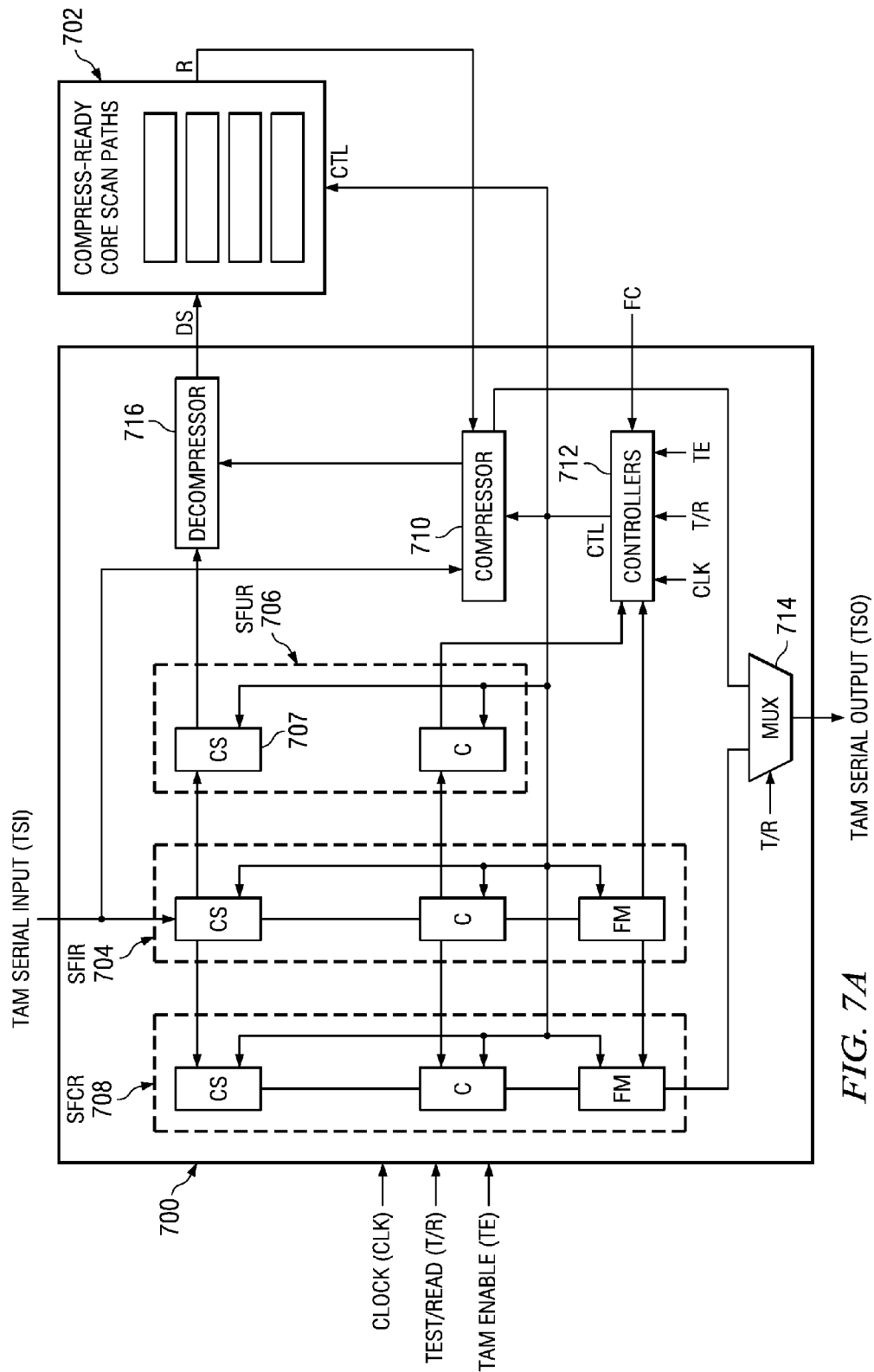
FIG. 7A illustrates a test access mechanism for testing a core according to the present invention.

FIG. 7A illustrates a Decompress & Compress TAM 700 that can be coupled to a core within a device to enable testing of the core according to the present invention. This TAM is for use with Compress-Ready Core Scan Paths 702, i.e. the response from the scan paths does not contain unknown states. The TAM includes a SFIR 704, a SFCR 708, a SFUR 706, a Decompressor 716, a Compressor 710, a multiplexer 714, and a Controller 712. The SFIR and SFCR both comprise a Compressed Stimulus (CS) section, a Command (C) section, and a Frame Marker (FM) section. The SFUR comprises a Compressed Stimulus (CS) section 707 and a Command (C) section. The TAM has the standardized inputs and outputs described in FIG. 2. The CS bus from the SFUR is input to the Decompressor. The Decompressed Stimulus (DS) output from the Decompressor is input to the core scan paths. The R bus from the core scan paths is input to the Compressor. The CTL bus from the Controller provides control for the TAM circuits and core scan paths. When TE is set high and T/R is set for Test operation, the Controller is enabled to shift scan frames into the SFIR from TSI and shift scan frames out of the SFCR on TSO, in response to the CLK input. When the FM signal from the SFIR goes high, the Controller transfers the contents of the CS and C sections of the SFIR into the CS and C sections of the SFUR, the CS, C, and FM sections of the SFIR into the CS, C, and FM sections of the SFCR, and then clears the SFIR. Following the transfer and clear operation, the Controller executes the Command (C) output from the SFUR. The Controller can execute the Command in response to either the CLK or FC signal. During the Command execution, the Decompressor 716 decompresses the CS input and applies the Decompressed Stimulus (DS) patterns to the stimulus inputs of the core scan path while the Compressor inputs the R outputs from the core scan paths and compresses them into a signature. Each CS input may provide an N number of DS patterns for input to the core scan paths. While the Command is being executed, the next scan frame is shifted into the SFIR via TSI and the previous scan frame is shifted out of the SFCR via TSO. This process of shifting in a new scan frame from TSI, shifting out a previous scan frame from TSO, and executing a Command continues until the TE signal goes low to end the test operation. Following the test operation, the signature contained within the Compressor needs to be shifted out for inspection. This is accomplished by setting TE high and setting T/R for Read operation. During the read operation the Controller causes the Compressor to shift data from TSI to TSO in response to the CLK input to unload the signature as described in FIG. 6.

Figure 7B:
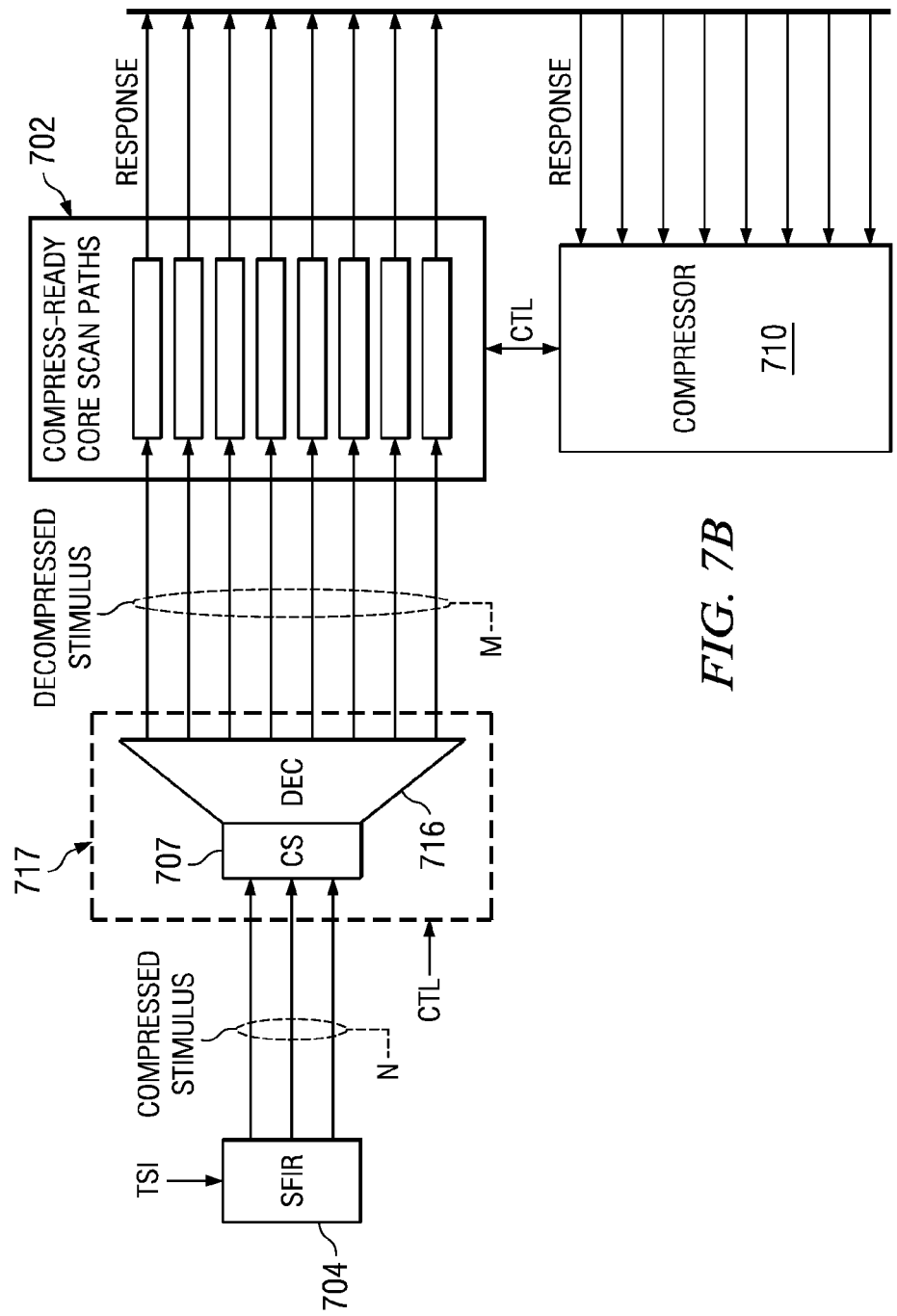
FIG. 7B illustrates a detail view of the stimulus decompression and response compression circuits of FIG. 7A.

FIG. 7B illustrates a more detailed view of the stimulus decompression and response compression circuits of FIG. 7A. When compressed stimulus data is updated from the SFIR 704 to the CS register section 707 of the SFUR 706, the CS register 707 and decompressor 716 circuit combination 717 is enabled by control input from the controller to decompress the compressed stimulus data in the CS register and output the decompressed stimulus data to the stimulus inputs of the core scan paths. The CS register 707 operates as an LFSR or other pseudorandom pattern generation circuit to produce multiple stimulus patterns from the single CS input pattern. The decompressor 716 receives the multiple stimulus patterns from the CS register 707 and outputs stimulus data to each scan path. As seen, the CS and decompressor circuit combination 717 expands a small N channel wide CS input pattern into a number of larger M channel wide stimulus output patterns for input to a large number of core scan paths. Stimulus decompression circuits that receive a small compressed stimulus input pattern and produce a number of wide decompressed stimulus output patterns, similar to circuit 717, are known in the art as indicated in the paper listed in the Reference of Related Art.

Figure 8A:
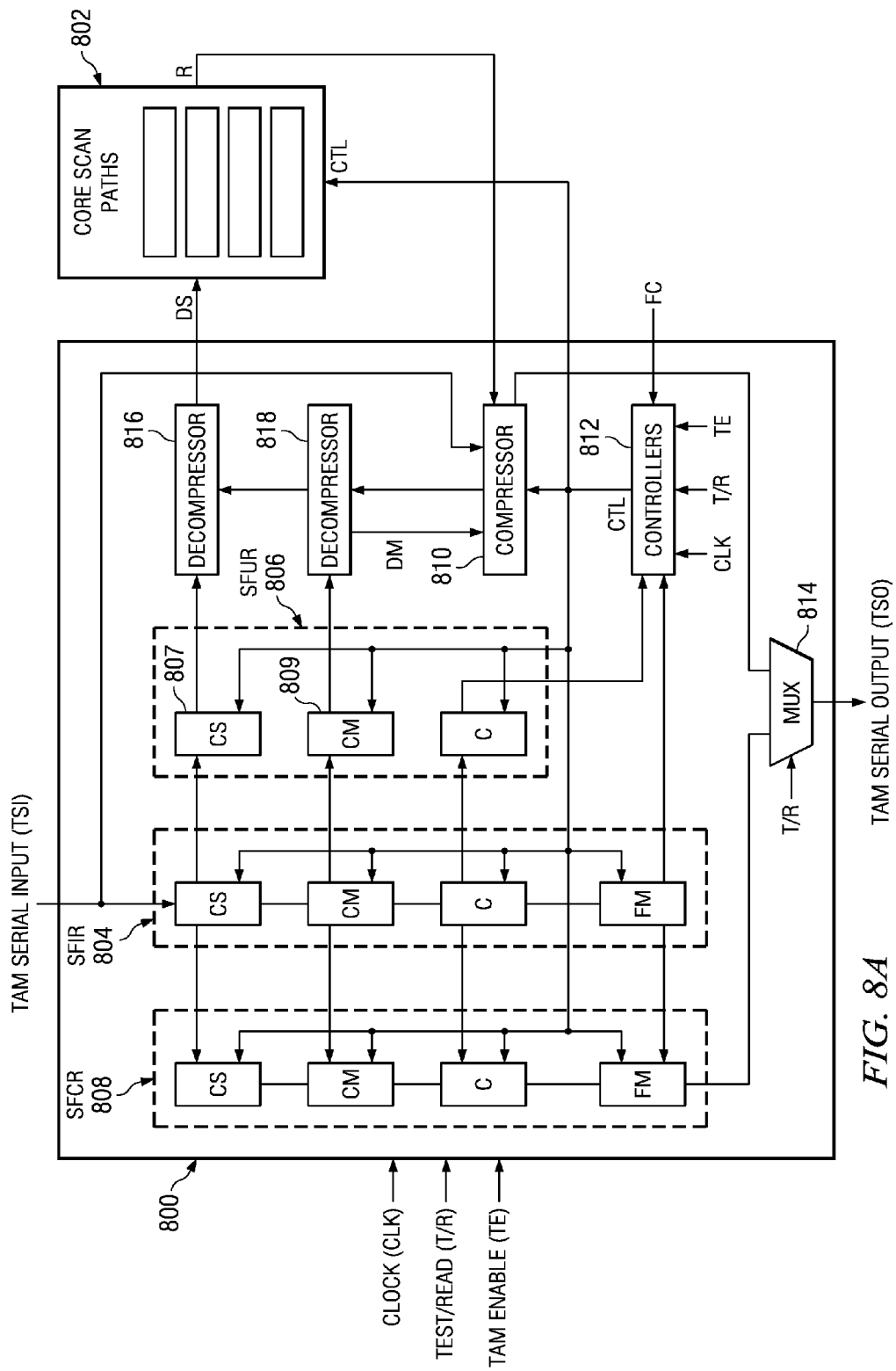
FIG. 8A illustrates a test access mechanism for testing a core according to the present invention.

FIG. 8A illustrates a Decompress & Maskable Compress TAM 800 that can be coupled to a core within a device to enable testing of the core according to the present invention. This TAM is for use with Core Scan Paths 802 where the response output contains unknown states that need to be masked off. The TAM includes a SFIR 804, a SFCR 808, a SFUR 806, a stimulus Decompressor 816, a mask Decompressor 818, a Compressor 810, a multiplexer 814, and a Controller 812. The SFIR and SFCR both comprise a Compressed Stimulus (CS) section, a Compressed Mask (CM) section, a Command (C) section, and a Frame Marker (FM) section. The SFUR comprises a Compressed Stimulus (CS) section 807, a Compressed Mask (CM) section 809, and a Command (C) section. The TAM has the standardized inputs and outputs described in FIG. 2. The CS bus from the SFUR is input to the stimulus Decompressor 816. The Decompressed Stimulus (DS) output from Decompressor 816 is input to the core scan paths. The CM bus from the SFUR is input to the mask Decompressor 818. The Decompressed Mask (DM) output from Decompressor 818 is input to the Compressor along with the R bus from the core scan paths. The CTL bus from the Controller provides control for the TAM circuits and core scan paths. When TE is set high and T/R is set for Test operation, the Controller is enabled to shift scan frames into the SFIR from TSI and shift scan frames out of the SFCR on TSO, in response to the CLK input. When the FM signal from the SFIR goes high, the Controller transfers the contents of the CS, CM, and C sections of the SFIR into the CS, CM, and C sections of the SFUR, the CS, CM, C, and FM sections of the SFIR into the CS, CM, C, and FM sections of the SFCR, and then clears the SFIR. Following the transfer and clear operation, the Controller executes the Command (C) output from the SFUR. The Controller can execute the Command in response to either the CLK or FC signal. During the Command execution, Decompressor 816 decompresses the CS input and applies the Decompressed Stimulus (DS) patterns to the stimulus inputs of the core scan path, Decompressor 818 decompresses the CM input and applies the Decompressed Mask (DM) patterns to the Compressor, and the Compressor inputs the response (R) outputs from the core scan paths and compresses the unmasked response inputs into a signature. Each CS and CM input may provide an N number of DS and CM patterns for input to the core scan paths and Compressor, respectively. While the Command is being executed, the next scan frame is shifted into the SFIR via TSI and the previous scan frame is shifted out of the SFCR via TSO. This process of shifting in a new scan frame from TSI, shifting out a previous scan frame from TSO, and executing a Command continues until the TE signal goes low to end the test operation. Following the test operation, the signature contained within the Compressor needs to be shifted out for inspection. This is accomplished by setting TE high and setting T/R for Read operation. During the read operation the Controller causes the Compressor to shift data from TSI to TSO in response to the CLK input to unload the signature and described in FIG. 6.

Figure 8B:
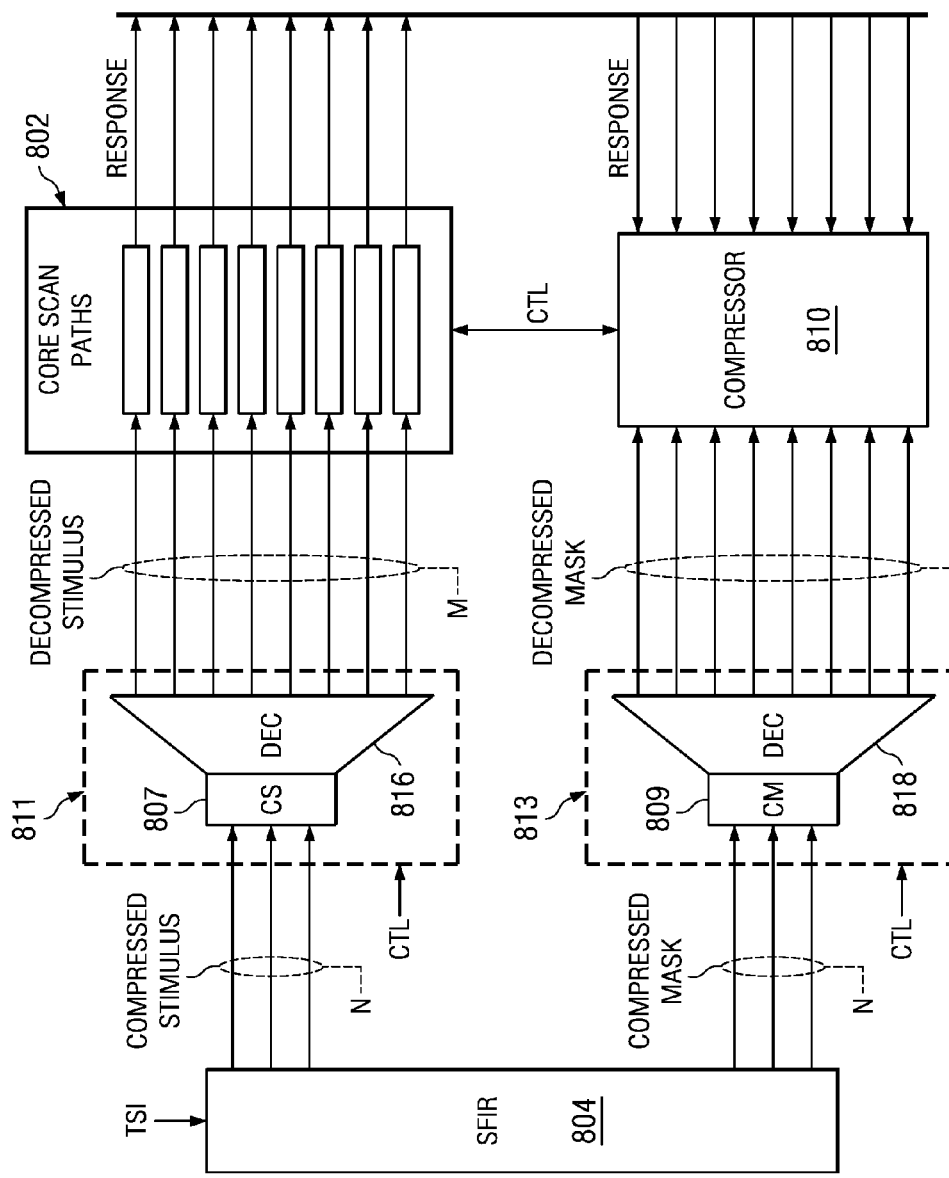
FIG. 8B illustrates a detail view of the stimulus decompression, mask decompression, and response compression circuits of FIG. 8A.

FIG. 8B illustrates a more detailed view of the stimulus decompression, mask decompression, and response compression circuits of FIG. 8A. When compressed stimulus and mask data is updated from the SFIR 804 to the CS 807 and CM 809 register sections of the SFUR 806, the CS register 807 and decompressor 816 circuit combination 811, and the CM register 809 and decompressor 818 circuit combination 813 are enabled by control input from the controller to decompress the compressed the stimulus and mask data in the CS and CM registers. The decompressed stimulus data is input to the core scan paths, and the decompressed mask data is input to the compressor 810. The CS and CM registers operate as LFSRs or other pseudorandom pattern generation circuits to produce multiple stimulus and mask patterns from the single CS and CM input patterns. The decompressor 816 receives the multiple stimulus patterns from the CS register 807 and outputs stimulus data to each scan path. The decompressor 818 receives the multiple mask patterns from the CM register 809 and outputs mask data to the compressor 810. To allow for masking each response input from the scan paths, there will be one mask input for each response input to the compressor. As seen, circuit combinations 811 and 813 expand a small N channel wide CS and CM input pattern into a number of larger M channel wide stimulus and mask output patterns for input to the core scan paths and compressor, respectively.

Figure 8C:
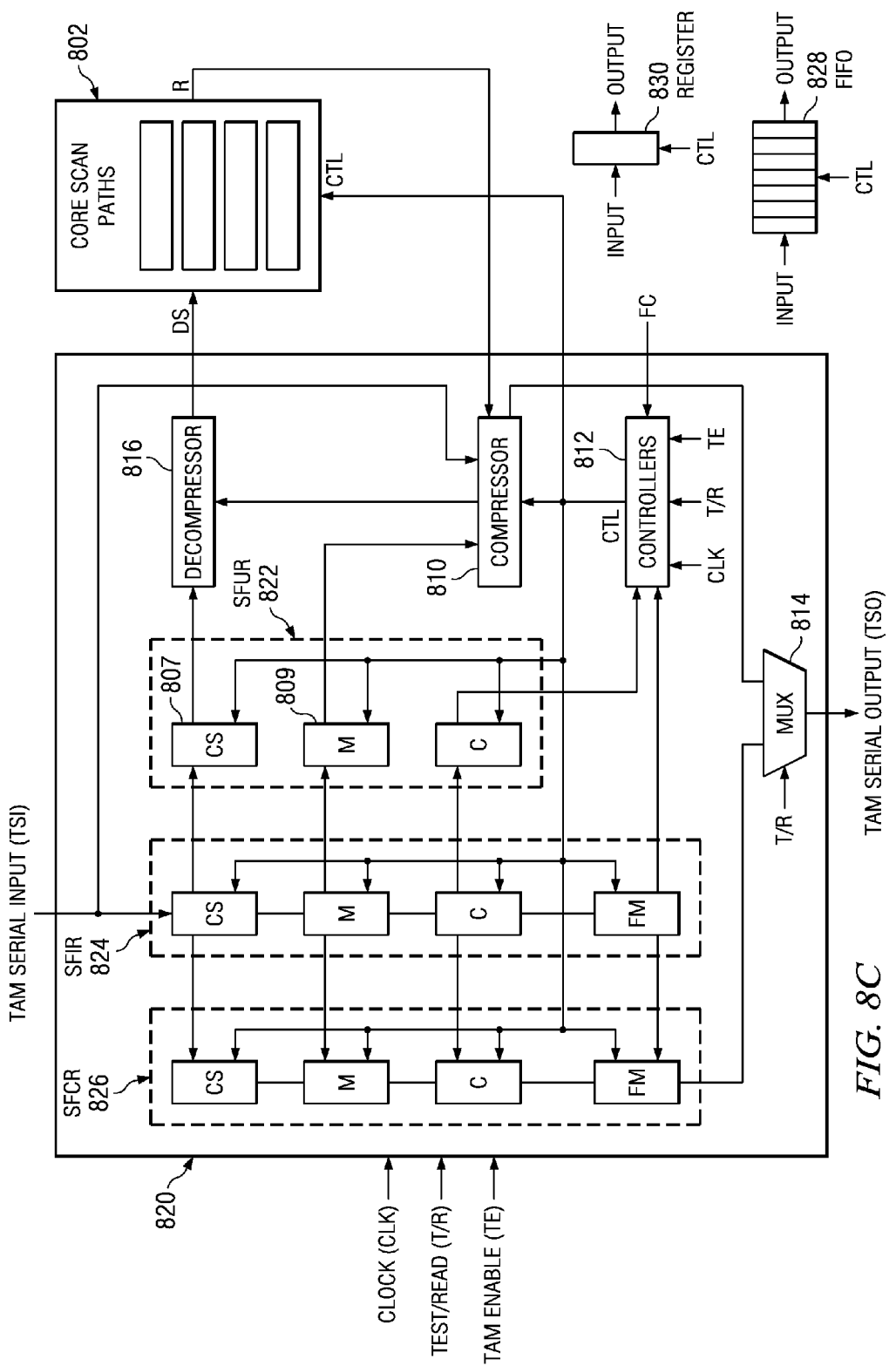
FIG. 8C illustrates a test access mechanism for testing a core according to the present invention.

FIG. 8C illustrates a Decompress & Maskable Compress TAM 820 that can be coupled to a core within a device to enable testing of the core according to the present invention. This TAM is for use with Core Scan Paths 802 where the response output contains unknown states that need to be masked off. The TAM of FIG. 8C is the same the TAM of FIG. 8A with the exceptions that; (1) the SFUR 822 contains a mask (M) FIFO 828 section instead of the CM register section of FIG. 8A, (2) the SFIR 824 contains an M register section instead of the CM register section of FIG. 8A, and (3) the SFCR 826 contains an M register section instead of the CM register section of FIG. 8A. In FIG. 8C, the masking of the response outputs from the core scan paths is achieved by buffering up mask data into the M FIFO of SFUR 822 and outputting the mask data to the compressor 810 as the decompressed stimulus data from the decompressor is being input to the core scan paths. With the exception that the FIG. 8C TAM uses buffered mask data as opposed to the FIG. 8A TAM using decompressed mask data, the test and read operations of the two TAMs are identical.

Figure 9:
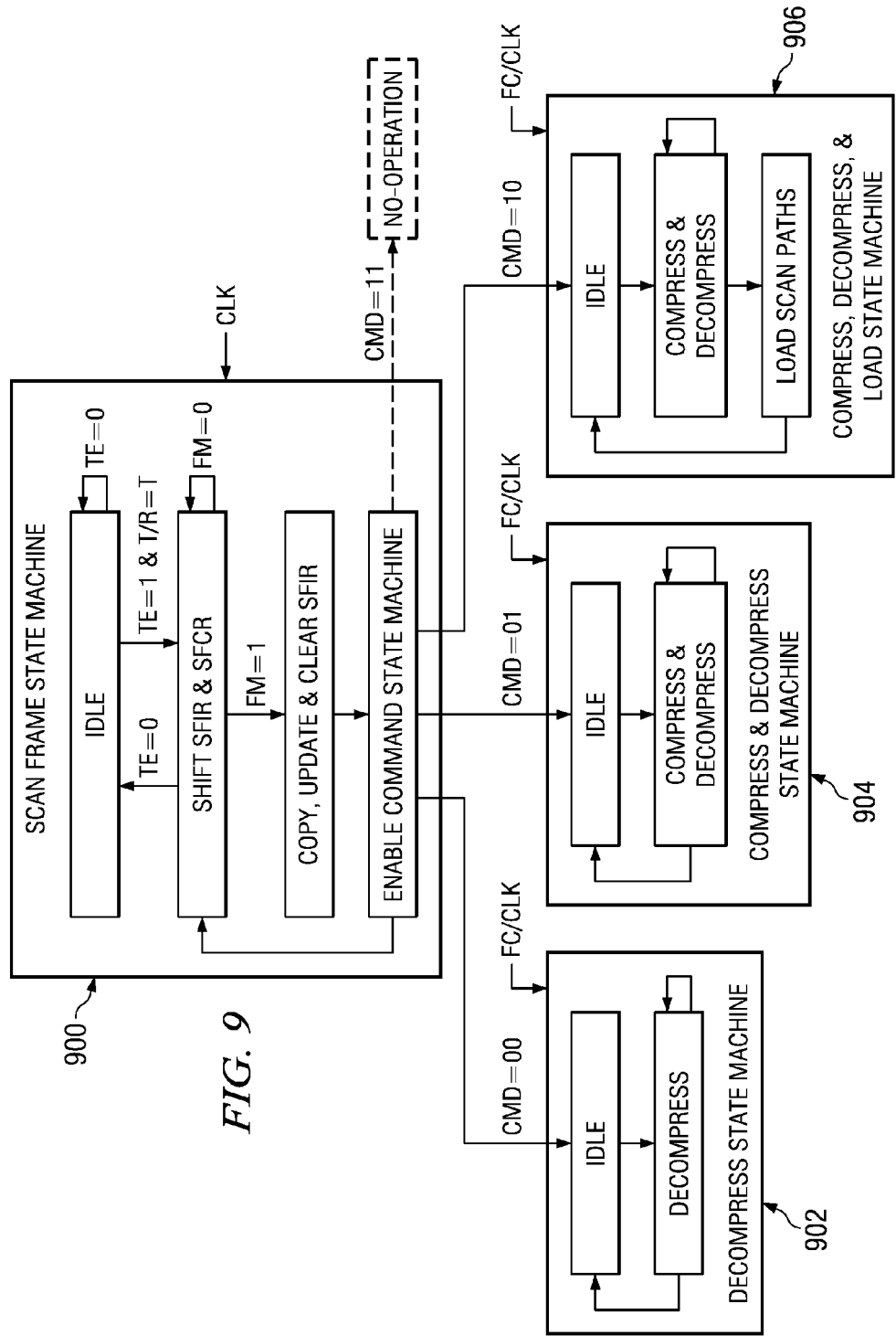
FIG. 9 illustrates the operation of the controller of the test access mechanisms of FIGS. 7A, 8A, and 8C.

FIG. 9 illustrates the operation of the Controllers of the FIGS. 7A, 8A, and 8C TAMs when TE is high and T/R is set for test operation. The Controller consists of a Scan Frame state machine 900, a Decompress state machine 902, a Compress & Decompress state machine 904, and a Load, Compress & Decompress state machine 906. The Scan Frame state machine is clocked by the CLK input and is used to input and output scan frames from the SFIR and SFCR, respectively, and to enable one of the Command state machines in response to a Command input from the SFUR. The Scan Frame state machine has an Idle state where is resides when TE is low, a Shift SFIR & SFCR state where it shifts scan frames in from TSI and out on TSO while the FM signal is low, a Copy, Update, & Clear SFIR state where SFIR data is copied, updated and cleared, and an Enable Command State Machine state to enable one of the Command state machines. The Command state machines can be clocked by either the CLK or FC inputs. In response to a Command of 00 (in this example) the Decompress state machine 902 is enabled to transition from the Idle state to the Decompress state where it resides during the decompression of the CS inputs. After the decompression step is performed, the Decompress state machine transitions back to the Idle state. The Decompress state machine is used to initialize the scan paths with stimulus data at the beginning of a test operation. In response to a Command of 01 (in this example) the Compress & Decompress state machine 904 is enabled to transition from the Idle state to the Compress & Decompress state where it resides during the decompression of the CS input of FIG. 7A, the decompression of the CS and CM inputs of FIG. 8A, or the decompression of the CS input and outputting of mask data from the M FIFO of FIG. 8C. After the compress and decompress step is preformed, the Compress & Decompress state machine transitions back to the Idle state. The Compress & Decompress state machine is used to decompress the CS input into stimulus data to the core scan paths, to decompress the CM input into mask data to the Compressor or to output buffered mask data from the M FIFO to the Compressor, and to compress the response outputs from the core scan paths into the Compressor. In response to a Command of 10 (in this example) the Compress, Decompress & Load state machine 906 is enabled to transition from the Idle state to the Compress & Decompress state where it resides during the decompression of the CS input of FIG. 7A, the decompression of the CS and CM inputs of FIG. 8A, or the decompression of the CS input and outputting of mask data from the M FIFO of FIG. 8C. After the compress and decompress step is preformed, the Compress, Decompress & Load state machine transitions to the Load Scan Paths state to load data from combinational logic, and then back to the Idle state. The Compress, Decompress & Load state machine is used to shift in the last decompressed stimulus to the core scan paths during a current compress & decompress test operation cycle, to compress the last non-masked response outputs from the core scan paths during the current compress & decompress test operation cycle, and to load response data from combinational logic into the core scan paths in preparation for the next compress & decompress test operation cycle. When testing is complete, the TE signal is set low to cause the Scan Frame state machine to return to the Idle state.

Figure 10:
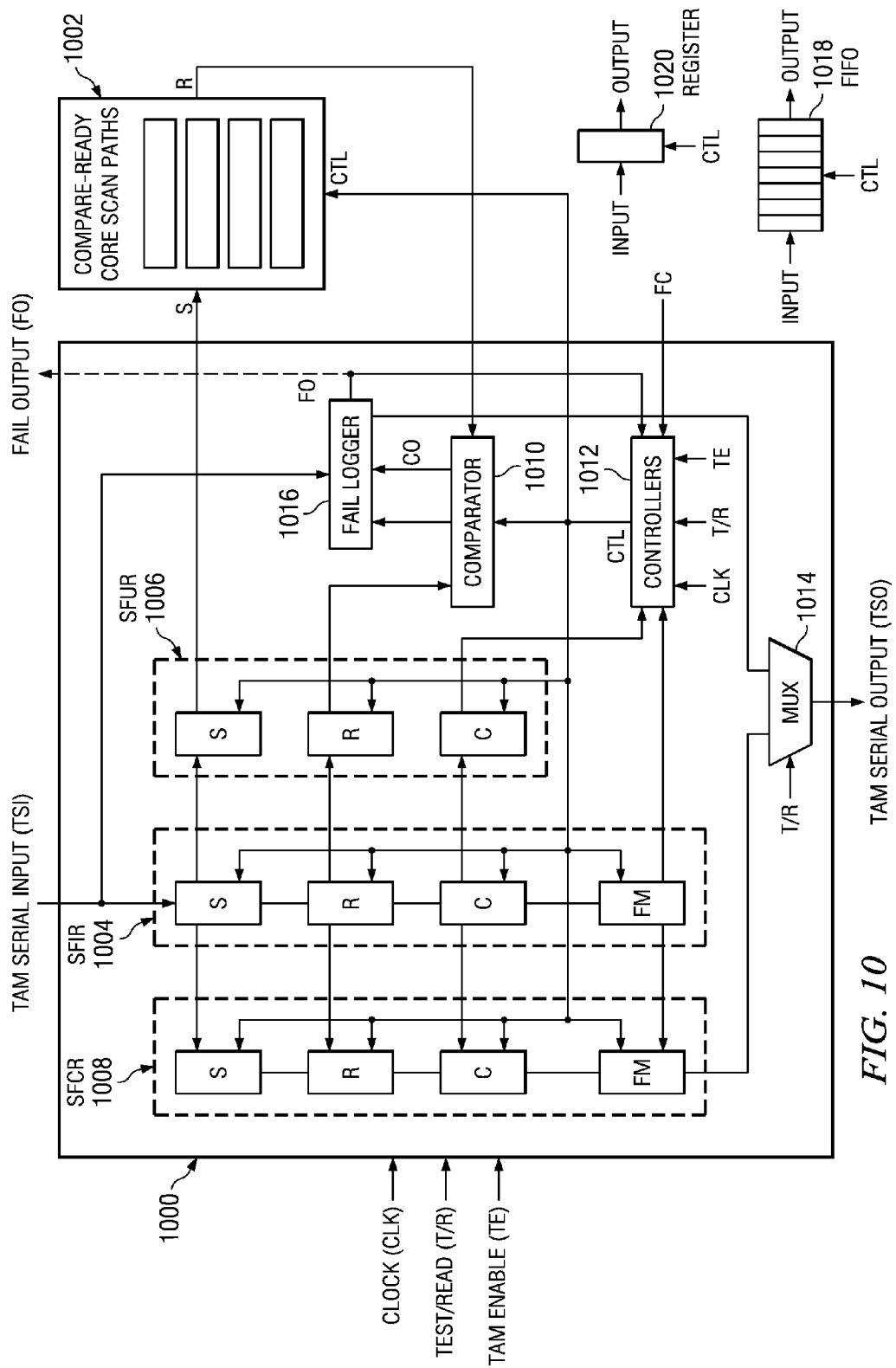
FIG. 10 illustrates a test access mechanism for testing a core according to the present invention.

FIG. 10 illustrates a Stimulus & Compare TAM 1000 that can be coupled to a core within a device to enable testing of the core according to the present invention. This TAM is for use with Compare-Ready Core Scan Paths 1002, i.e. the response from the scan paths does not contain unknown states. The TAM includes a SFIR 1004, a SFCR 1008, a SFUR 1006, a Fail Logger circuit 1016, a Comparator 1010, a multiplexer 1014, and a Controller 1012. The SFIR and SFCR both comprise a Stimulus (S) section, a Response (R) section, a Command (C) section, and a Frame Marker (FM) section. The SFUR comprises a Stimulus (S) section, a Response (R) section, and a Command (C) section. The TAM has the standardized inputs and outputs described in FIG. 2. The S bus from the SFUR is input to the stimulus inputs of the core scan paths. The R bus from the SFUR is input to the Comparator. The R bus from the core scan paths is input to the Comparator. The Compare Outputs (CO) from the Comparator are input to the Fail Logger. The Fail Logger outputs a Fail Output (FO) indication signal to the Controller in response to a failing CO input. The FO signal may optionally be output from the TAM to immediately indicate a failure to a tester. The CTL bus from the Controller provides control for the TAM circuits and core scan paths. When TE is set high and T/R is set for Test operation, the Controller is enabled to shift scan frames into the SFIR from TSI and shift scan frames out of the SFCR on TSO, in response to the CLK input. When the FM signal from the SFIR goes high, the Controller transfers the contents of the S, R, and C sections of the SFIR into the S, R, and C sections of the SFUR, the S, R, C, and FM sections of the SFIR into the S, R, C, and FM sections of the SFCR, and then clears the SFIR. Following the transfer and clear operation, the Controller executes the Command (C) output from the SFUR. The Controller can execute the Command in response to either the CLK or FC signal. During the Command execution, the stimulus (S) data from the SFUR is input to the stimulus inputs of the core scan paths while the response (R) outputs from the core scan paths are compared against the response (R) inputs from the SFUR. The results of each response compare operation are input to the Fail Logger. While the Command is being executed, the next scan frame is shifted into the SFIR via TSI and the previous scan frame is shifted out of the SFCR via TSO. This process of shifting in a new scan frame from TSI, shifting out a previous scan frame from TSO, and executing a Command continues until the TE signal goes low to end the test operation. Following the test operation, the failure data contained within the Fail Logger needs to be shifted out for inspection. This is accomplished by setting TE high and setting T/R for Read operation. During the read operation the Controller causes the Fail Logger to shift data from TSI to TSO in response to the CLK input to unload the fail data.

The S and R sections of the SFUR 1006 can be realized as either a register 1020 or a FIFO 1018. If the S and R sections are registers, only one stimulus and response pattern is loaded into the registers from the S and R sections of the SFIR to be input to the core scan paths and comparator 1010, and only one response pattern from the core scan paths is compared in the comparator. If the S and R sections are FIFOs, a number of stimulus and response patterns can be stored in the FIFOs from the S and R sections of the SFIR to be output to the core scan paths and comparator, while an equal number of response patterns from the core scan path are compared in the comparator. An S section register 1020 or FIFO 1018 has parallel inputs coupled to the S section of the SFIR, parallel outputs coupled to the stimulus inputs of the core scan path, and control inputs from controller. An R section register 1020 or FIFO 1018 has parallel inputs coupled to the R section of the SFIR, parallel outputs coupled to the response inputs of the comparator, and control inputs from controller. The advantage of using S and R FIFOs is that, in response to a command, multiple stimulus and response inputs, buffered up in the FIFOs, can be rapidly input to the core scan paths and comparator, while an equal number of response outputs from the core scan paths can be rapidly compared in the comparator.

Figure 11:
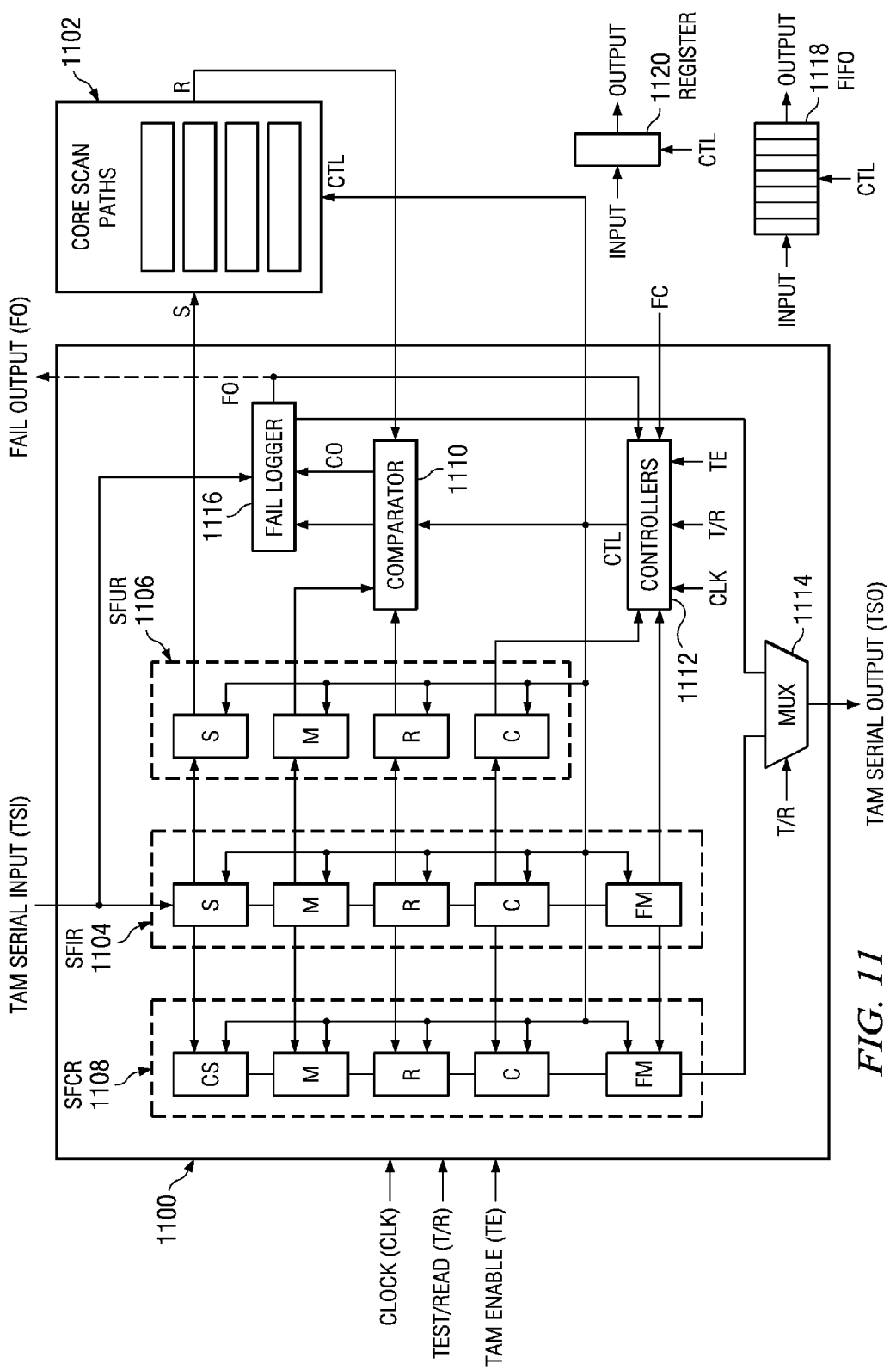
FIG. 11 illustrates a test access mechanism for testing a core according to the present invention.

FIG. 11 illustrates a Stimulus & Maskable Compare TAM 1100 that can be coupled to a core within a device to enable testing of the core according to the present invention. This TAM is for use with Core Scan Paths 1102 where the response output contains unknown states that need to be masked off. The TAM includes a SFIR 1104, a SFCR 1108, a SFUR 1106, a Fail Logger circuit 1116, a Comparator 1110, a multiplexer 1114, and a Controller 1112. The SFIR and SFCR both comprise a Stimulus (S) section, a Mask (M) section, a Response (R) section, a Command (C) section, and a Frame Marker (FM) section. The SFUR comprises a Stimulus (S) section, a Mask (M) section, a Response (R) section, and a Command (C) section. The TAM has the standardized inputs and outputs described in FIG. 2. The S bus from the SFUR is input to the stimulus inputs of the core scan paths. The M and R buses from the SFUR are input to the Comparator. The R bus from the core scan paths is input to the Comparator. The Compare Outputs (CO) from the Comparator are input to the Fail Logger. The Fail Logger outputs a Fail Output (FO) indication signal to the Controller in response to a failing CO input. The FO signal may optionally be output from the TAM to immediately indicate a failure to a tester. The CTL bus from the Controller provides control for the TAM circuits and core scan paths. When TE is set high and T/R is set for Test operation, the Controller is enabled to shift scan frames into the SFIR from TSI and shift scan frames out of the SFCR on TSO, in response to the CLK input. When the FM signal from the SFIR goes high, the Controller transfers the contents of the S, M, R, and C sections of the SFIR into the S, M, R, and C sections of the SFUR, the S, M, R, C, and FM sections of the SFIR into the S, M, R, C, and FM sections of the SFCR, then clears the SFIR. Following the transfer and clear operation, the Controller executes the Command (C) output from the SFUR. The Controller can execute the Command in response to either the CLK or FC signal. During the Command execution, the stimulus (S) data from the SFUR is input to the stimulus inputs of the core scan paths, the mask (M) data from the SFUR is input to the comparator along with the response (R) outputs from the scan paths. The comparator compares the unmasked response (R) outputs from the core scan paths against the response (R) inputs from the SFUR. The results of each response compare operation are input to the Fail Logger. While the Command is being executed, the next scan frame is shifted into the SFIR via TSI and the previous scan frame is shifted out of the SFCR via TSO. This process of shifting in a new scan frame from TSI, shifting out a previous scan frame from TSO, and executing a Command continues until the TE signal goes low to end the test operation. Following the test operation, the failure data contained within the Fail Logger needs to be shifted out for inspection. This is accomplished by setting TE high and setting T/R for Read operation. During the read operation the Controller causes the Fail Logger to shift data from TSI to TSO in response to the CLK input to unload the fail data.

The S, M, and R sections of the SFUR 1106 can be realized as either a register 1120 or a FIFO 1118. If the S, M, and R sections are registers, only one stimulus, mask, and response pattern is loaded into the registers from the S, M, and R sections of the SFIR to be input to the core scan paths and comparator 1110, and only one response pattern from the core scan paths is compared in the comparator. If the S, M, and R sections are FIFOs, a number of stimulus, mask, and response patterns can be stored in the FIFOs from the S, M, and R sections of the SFIR to be output to the core scan paths and comparator, while an equal number of response patterns from the core scan path are compared in the comparator. An S section register 1120 or FIFO 1118 has parallel inputs coupled to the S section of the SFIR, parallel outputs coupled to the stimulus inputs of the core scan path, and control inputs from controller. An M section register 1120 or FIFO 1118 has parallel inputs coupled to the M section of the SFIR, parallel outputs coupled to the mask inputs of the comparator, and control inputs from controller. An R section register 1120 or FIFO 1118 has parallel inputs coupled to the R section of the SFIR, parallel outputs coupled to the response inputs of the comparator, and control inputs from controller. The advantage of using S, M, and R FIFOs is that, in response to a command, multiple stimulus, mask, and response inputs, buffered up in the FIFOs, can be rapidly input to the core scan paths and comparator, while an equal number of response outputs from the core scan paths can be rapidly compared in the comparator.

Figure 12:
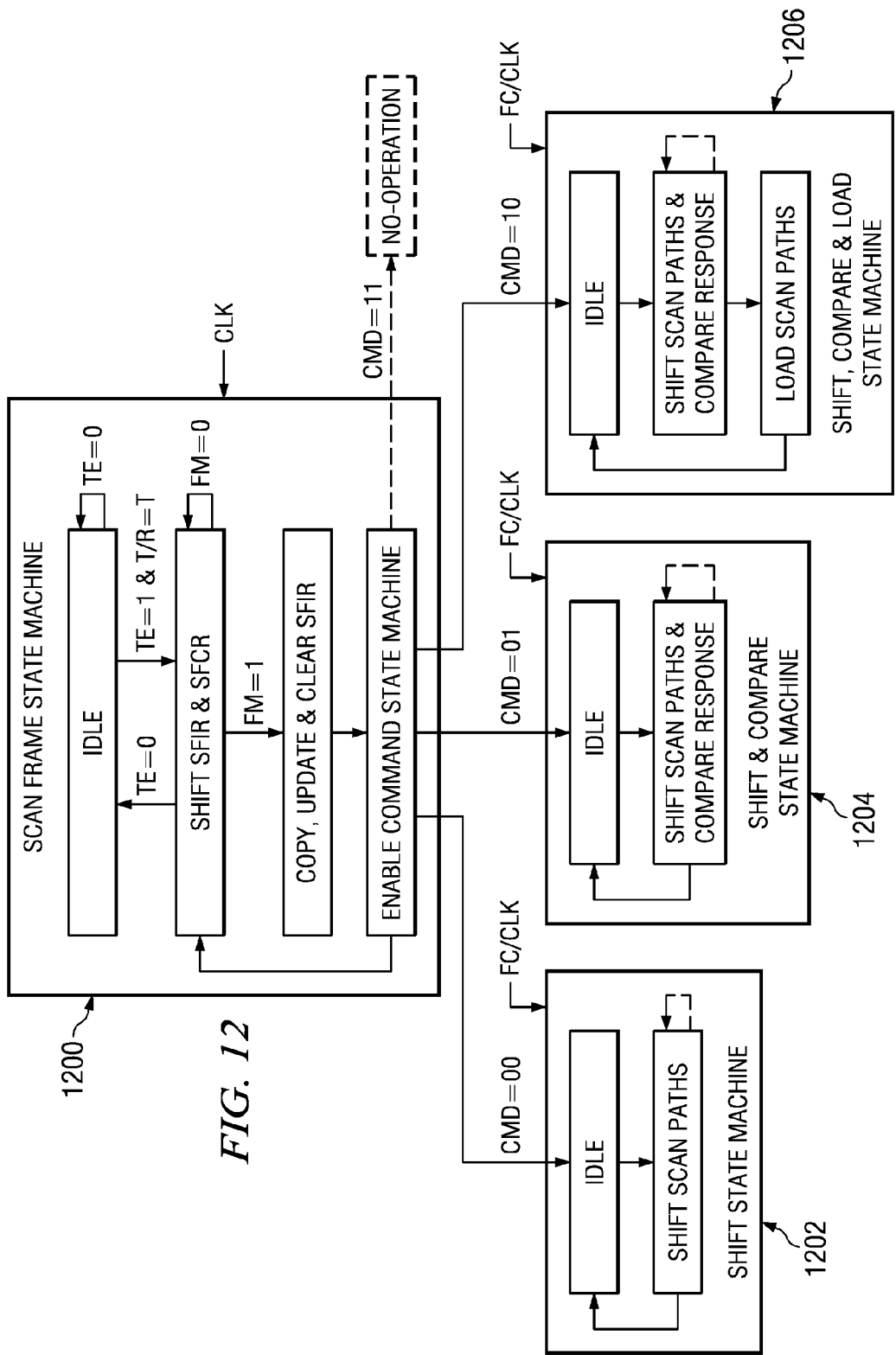
FIG. 12 illustrates the operation of the controller of the test access mechanisms of FIGS. 10 and 11.

FIG. 12 illustrates the operation of the Controllers of the FIGS. 10 and 11 TAMs when TE is high and T/R is set for test operation. The Controller consists of a Scan Frame state machine 1200, a Shift state machine 1202, a Shift & Compare state machine 1204, and a Shift, Compare & Load state machine 1206. The Scan Frame state machine is clocked by the CLK input and is used to input and output scan frames from the SFIR and SFCR, respectively, and to enable one of the Command state machines in response to a Command input from the SFUR. The Scan Frame state machine has an Idle state where is resides when TE is low, a Shift SFIR & SFCR state where is shifts scan frames in from TSI and out on TSO while the FM signal is low, a Copy, Update, & Clear SFIR state where SFIR data is copied, updated and cleared, and an Enable Command State Machine state to enable one of the Command state machines. The Command state machines can be clocked by either the CLK or FC inputs. In response to a Command of 00 (in this example) the Shift state machine 1202 is enabled to transition from the Idle state to the Shift Scan Paths state and back to the Idle state. The Shift state machine is used to initialize the scan paths with stimulus data at the beginning of a test operation. In response to a Command of 01 (in this example) the Shift & Compare state machine 1204 is enabled to transition from the Idle state to the Shift Scan Paths & Compare state then back to the Idle state. The Shift & Compare state machine is used to shift in stimulus data to the core scan paths from the SFUR and to compare unmasked response outputs from the core scan paths using the Comparator. In response to a Command of 10 (in this example) the Shift, Compare & Load state machine 1206 is enabled to transition from the Idle state to the Shift Scan Paths & Compare state, to the Load Scan Paths state, and back to the Idle state. The Shift, Compare & Load state machine is used to shift in the last stimulus data to the core scan paths during a current shift & compare test operation cycle, to compare the last non-masked response outputs from the core scan paths during the current shift & compare test operation cycle, and to load response data from combinational logic into the core scan paths in preparation for the next shift & compare test operation cycle. When testing is complete, the TE signal is set low to cause the Scan Frame state machine to return to the Idle state.

As seen in FIG. 12, if FIFOs are used for the S and R sections of the SFUR of FIG. 10 or the S, M, and R sections of the SFUR of FIG. 11, the Shift state machine 1202 will remain in the shift scan paths state, the Shift & Compare state machine 1204 will remain in the shift scan paths & compare response state, and the Shift, Compare & Load state machine 1206 will remain in the shift scan paths & compare response state, as indicated by dotted line, for the number of FC/CLK cycles required to output buffered patterns from the S and R FIFOs of FIG. 10 or buffered S, M, and R patterns from the FIFOs of FIG. 11.

Figure 13A:
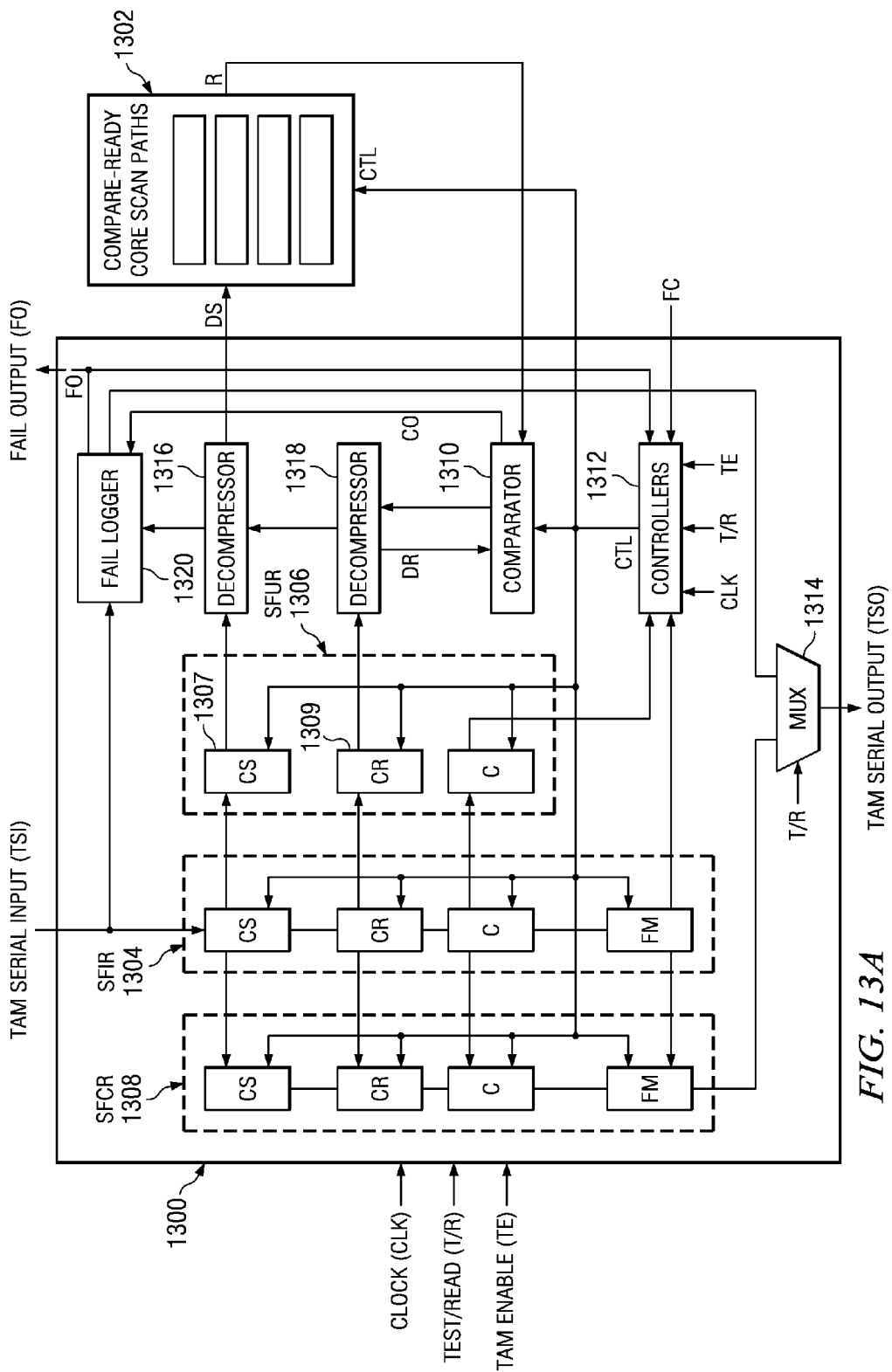
FIG. 13A illustrates a test access mechanism for testing a core according to the present invention.

FIG. 13A illustrates a Decompress & Compare TAM 1300 that can be coupled to a core within a device to enable testing of the core according to the present invention. This TAM is for use with Compress-Ready Core Scan Paths 1302, i.e. the response from the scan paths does not contain unknown states. The TAM includes a SFIR 1304, a SFCR 1308, a SFUR 1306, a stimulus Decompressor 1316, a response Decompressor 1318, a Comparator 1310, a Fail Logger 1320, a multiplexer 1314, and a Controller 1312. The SFIR and SFCR both comprise a Compressed Stimulus (CS) section, a Compressed Response (CR) section, a Command (C) section, and a Frame Marker (FM) section. The SFUR comprises a Compressed Stimulus (CS) section, a Compressed Response (CR) section, and a Command (C) section. The TAM has the standardized inputs and outputs described in FIG. 2. The CS bus from the SFUR is input to the stimulus Decompressor 1316. Decompressor 1316 outputs decompressed stimulus (DS) patterns to the core scan paths. The CR bus from the SFUR is input to the response Decompressor 1318. The Comparator inputs decompressed response (DR) patterns from the response Decompressor and response (R) patterns from the core scan paths. The Comparator outputs Compare Outputs (CO) to the Fail Logger circuit. The Fail Logger outputs a Fail Output (FO) indication signal to the Controller in response to a failing CO input. The FO signal may optionally be output from the TAM to immediately indicate a failure to a tester. The CTL bus from the Controller provides control for the TAM circuits and core scan paths. When TE is set high and T/R is set for Test operation, the Controller is enabled to shift scan frames into the SFIR from TSI and shift scan frames out of the SFCR on TSO, in response to the CLK input. When the FM signal from the SFIR goes high, the Controller transfers the contents of the CS, CR, and C sections of the SFIR into the CS, CR, and C sections of the SFUR, the CS, CR, C, and FM sections of the SFIR into the CS, CR, C, and FM sections of the SFCR, and then clears the SFIR. Following the transfer and clear operation, the Controller executes the Command (C) output from the SFUR. The Controller can execute the Command in response to either the CLK or FC signal. During the Command execution, Decompressor 1316 decompresses the CS input and applies the Decompressed Stimulus (DS) patterns to the stimulus inputs of the core scan path, Decompressor 1318 decompresses the CR input and applies the Decompressed Response (DR) patterns to the Comparator, and the Comparator compares the Decompressed Response inputs to the response (R) outputs from the core scan paths and outputs Compare Output (CO) results to the Fail Logger. Each CS and CR input may provide an N number of DS and DR patterns for input to the core scan paths and Comparator, respectively. While the Command is being executed, the next scan frame is shifted into the SFIR via TSI and the previous scan frame is shifted out of the SFCR via TSO. This process of shifting in a new scan frame from TSI, shifting out a previous scan frame from TSO, and executing a Command continues until the TE signal goes low to end the test operation. Following the test operation, the fail data contained in the Fail Logger needs to be shifted out for inspection. This is accomplished by setting TE high and setting T/R for Read operation. During the read operation the Controller causes the Fail Logger to shift data from TSI to TSO in response to the CLK input to unload the fail data.

Figure 13B:
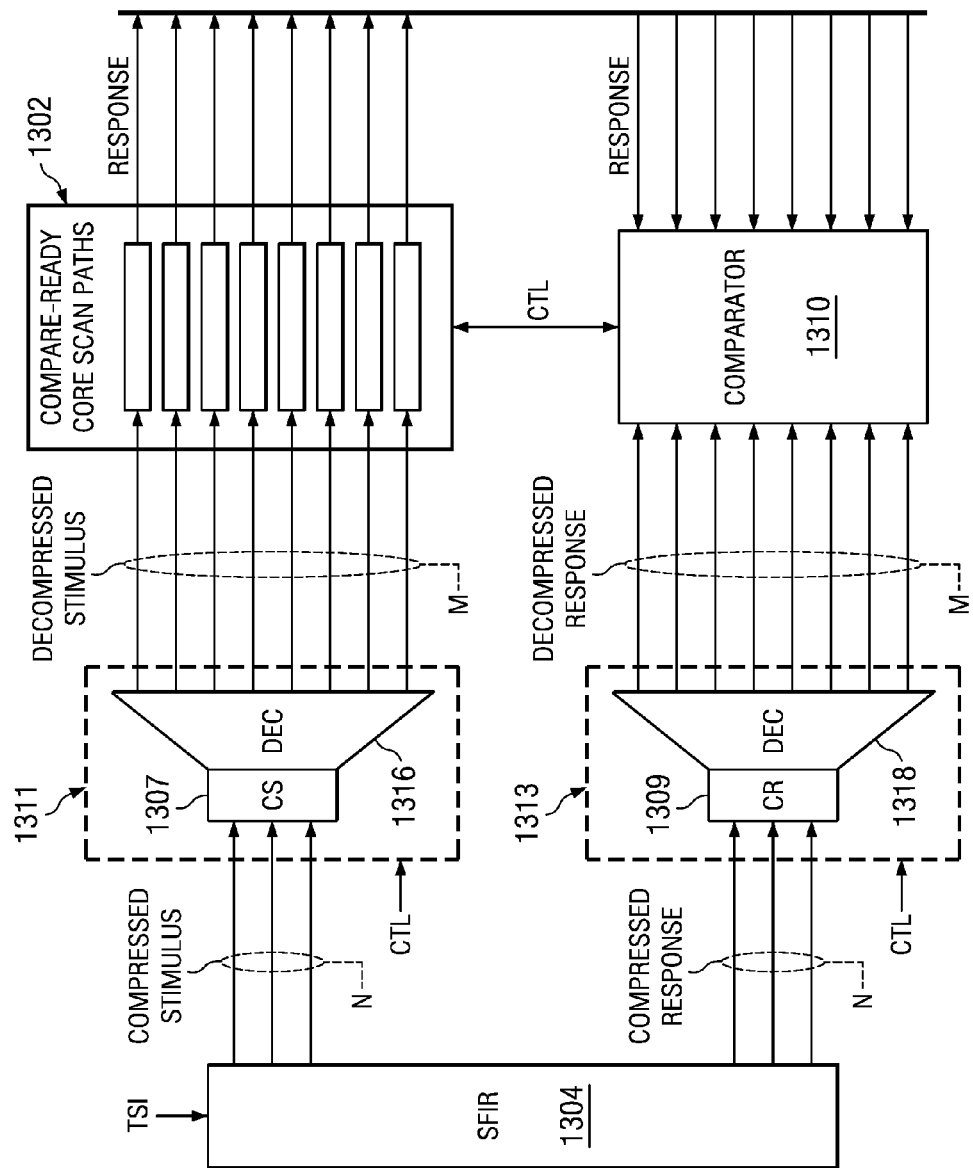
FIG. 13B illustrates a detail view of the stimulus decompression, response decompression, and response comparator circuits of FIG. 13A.

FIG. 13B illustrates a more detailed view of the stimulus decompression, response decompression, and response comparator circuits of FIG. 13A. When compressed stimulus and response data is updated from the SFIR 1304 to the CS 1307 and CR 1309 register sections of the SFUR 1306, the CS register 1307 and decompressor 1316 circuit combination 1311, and the CR register 1309 and decompressor 1318 circuit combination 1313 are enabled by control input from the controller to decompress the compressed stimulus and response data in the CS and CR registers. The decompressed stimulus data is input to the core scan paths, and the decompressed response data is input to the comparator 1310. The CS and CR registers operate as LFSRs or other pseudorandom pattern generation circuits to produce multiple stimulus and response patterns from the single CS and CR input patterns. The decompressor 1316 receives the multiple stimulus patterns from the CS register 1307 and outputs stimulus data to each scan path. The decompressor 1318 receives the multiple response patterns from the CR register 1309 and outputs response data to the comparator 1310. To allow for comparing each response input from the scan paths, there will be one response input from decompressor 1318 for each response input from the scan path. As seen, circuit combinations 1311 and 1313 expand a small N channel wide CS and CR input pattern into a number of larger M channel wide stimulus and response output patterns for input to the core scan paths and comparator, respectively.

Figure 13C:
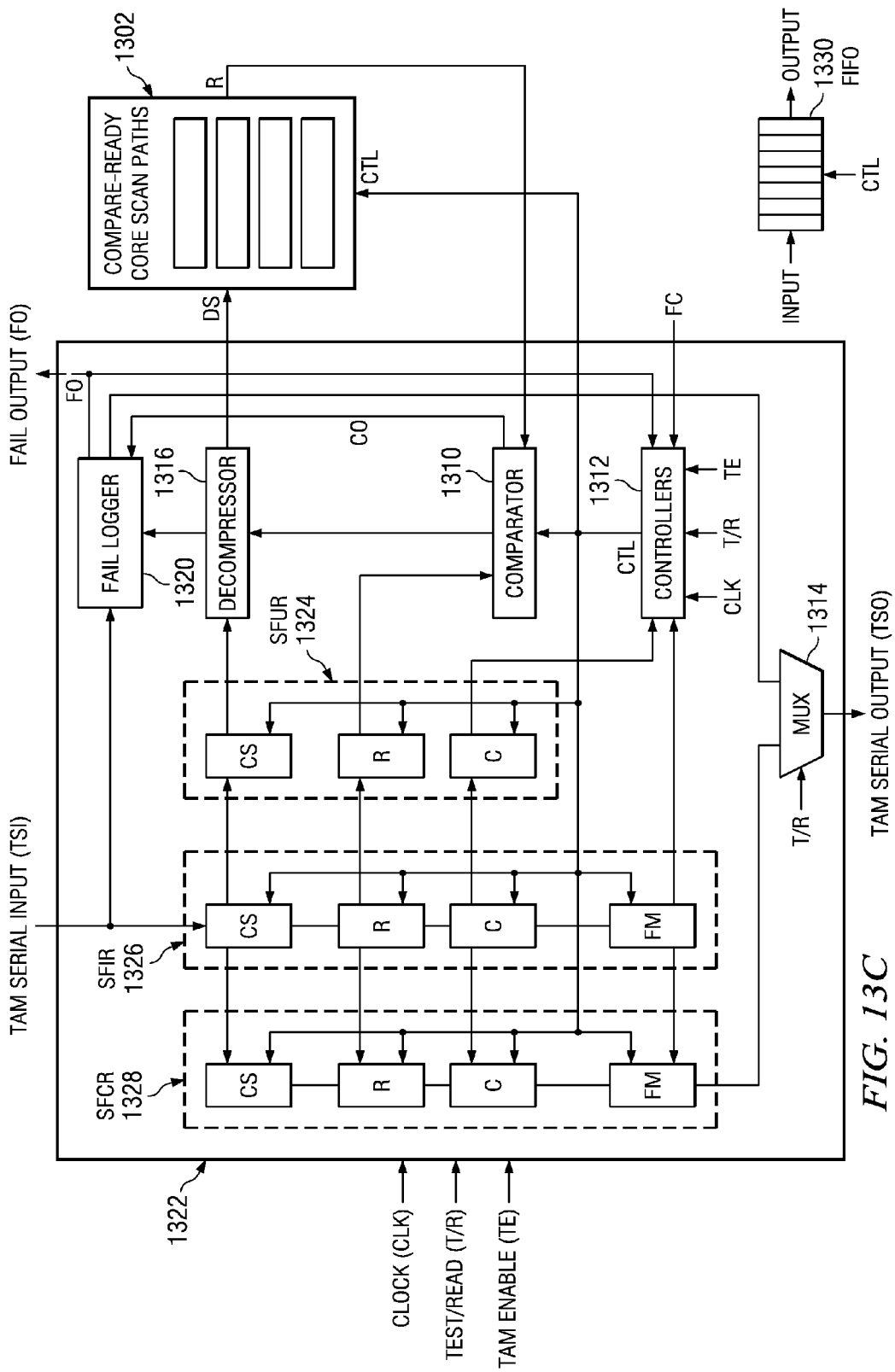
FIG. 13C illustrates a test access mechanism for testing a core according to the present invention.

FIG. 13C illustrates a Decompress & Compare TAM 1322 that can be coupled to a core within a device to enable testing of the core according to the present invention. This TAM is for use with Core Scan Paths 1302 where the response output does not contain unknown states. The TAM of FIG. 13C is the same the TAM of FIG. 13A with the exceptions that; (1) the SFUR 1324 contains a response (R) FIFO 1330 section instead of the CR register section of FIG. 13A, (2) the SFIR 1326 contains an R register section instead of the CR register section of FIG. 13A, and (3) the SFCR 1328 contains an R register section instead of the CR register section of FIG. 13A. In FIG. 13C, the comparing of the response outputs from the core scan paths is achieved by buffering up response data into the R FIFO of SFUR 1324 and outputting the buffered response data to the comparator 1310 as the decompressed stimulus data from the decompressor is being input to the core scan paths. With the exception that the FIG. 13C TAM uses buffered response data as opposed to the FIG. 13A TAM using decompressed response data, the test and read operations of the two TAMs are identical.

Figure 14A:
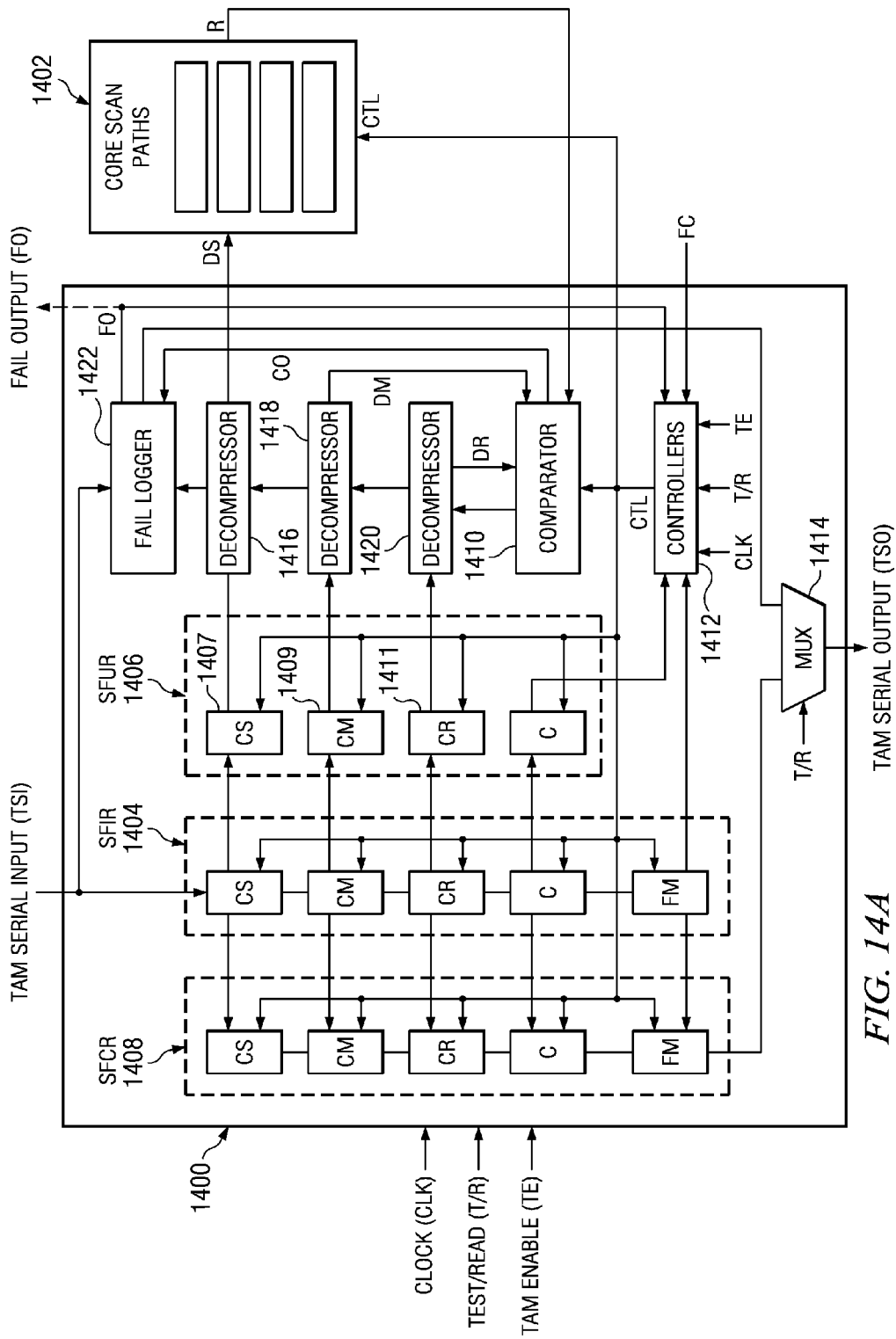
FIG. 14A illustrates a test access mechanism for testing a core according to the present invention.

FIG. 14A illustrates a Decompress & Maskable Compare TAM 1400 that can be coupled to a core within a device to enable testing of the core according to the present invention. This TAM is for use with Core Scan Paths 1402 where the response output contains unknown states that need to be masked off. The TAM includes a SFIR 1404, a SFCR 1408, a SFUR 1406, a stimulus Decompressor 1416, a mask Decompressor 1418, a response Decompressor 1420, a Comparator 1410, a Fail Logger 1422, a multiplexer 1414, and a Controller 1412. The SFIR and SFCR both comprise a Compressed Stimulus (CS) section, a Compressed Mask (CM) section, a Compressed Response (CR) section, a Command (C) section, and a Frame Marker (FM) section. The SFUR comprises a CS section, a CM section, a CR section, and a C section. The TAM has the standardized inputs and outputs described in FIG. 2. The CS bus from the SFUR is input to the stimulus Decompressor 1416. Decompressor 1416 outputs decompressed stimulus (DS) patterns to the core scan paths. The CM bus from the SFUR is input to the mask Decompressor 1418. The CR bus from the SFUR is input to the response Decompressor 1420. The Comparator inputs decompressed response patterns from Decompressor 1420, decompressed mask patterns from Decompressor 1418, and response (R) patterns from the core scan paths. The Comparator outputs Compare Outputs (CO) to the Fail Logger circuit. The Fail Logger outputs a Fail Output (FO) indication signal to the Controller in response to a failing CO input. The FO signal may optionally be output from the TAM to immediately indicate a failure to a tester. The CTL bus from the Controller provides control for the TAM circuits and core scan paths. When TE is set high and T/R is set for Test operation, the Controller is enabled to shift scan frames into the SFIR from TSI and shift scan frames out of the SFCR on TSO, in response to the CLK input. When the FM signal from the SFIR goes high, the Controller transfers the contents of the CS, CM, CR, and C sections of the SFIR into the CS, CM, CR, and C sections of the SFUR, the CS, CM, CR, C, and FM sections of the SFIR into the CS, CM, CR, C, and FM sections of the SFCR, then clears the SFIR. Following the transfer and clear operation, the Controller executes the Command (C) output from the SFUR. The Controller can execute the Command in response to either the CLK or FC signal. During the Command execution, the stimulus Decompressor 1416 decompresses the CS input and applies the Decompressed Stimulus (DS) patterns to the stimulus inputs of the core scan path, the response Decompressor 1418 decompresses the CR input and applies the Decompressed Response (DR) patterns to the Comparator, the mask Decompressor 1420 decompresses the CM input and applies the Decompressed Mask (DM) patterns to the Comparator, and the Comparator compares the Decompressed Response inputs to the unmasked response (R) outputs from the core scan paths and outputs Compare Output (CO) results to the Fail Logger. Each CS, CM, and CR input may provide an N number of DS, DM, and DR patterns for input to the core scan paths and Comparator. While the Command is being executed, the next scan frame is shifted into the SFIR via TSI and the previous scan frame is shifted out of the SFCR via TSO. This process of shifting in a new scan frame from TSI, shifting out a previous scan frame from TSO, and executing a Command continues until the TE signal goes low to end the test operation. Following the test operation, the fail data contained in the Fail Logger needs to be shifted out for inspection. This is accomplished by setting TE high and setting T/R for Read operation. During the read operation the Controller causes the Fail Logger to shift data from TSI to TSO in response to the CLK input to unload the fail data.

Figure 14B:
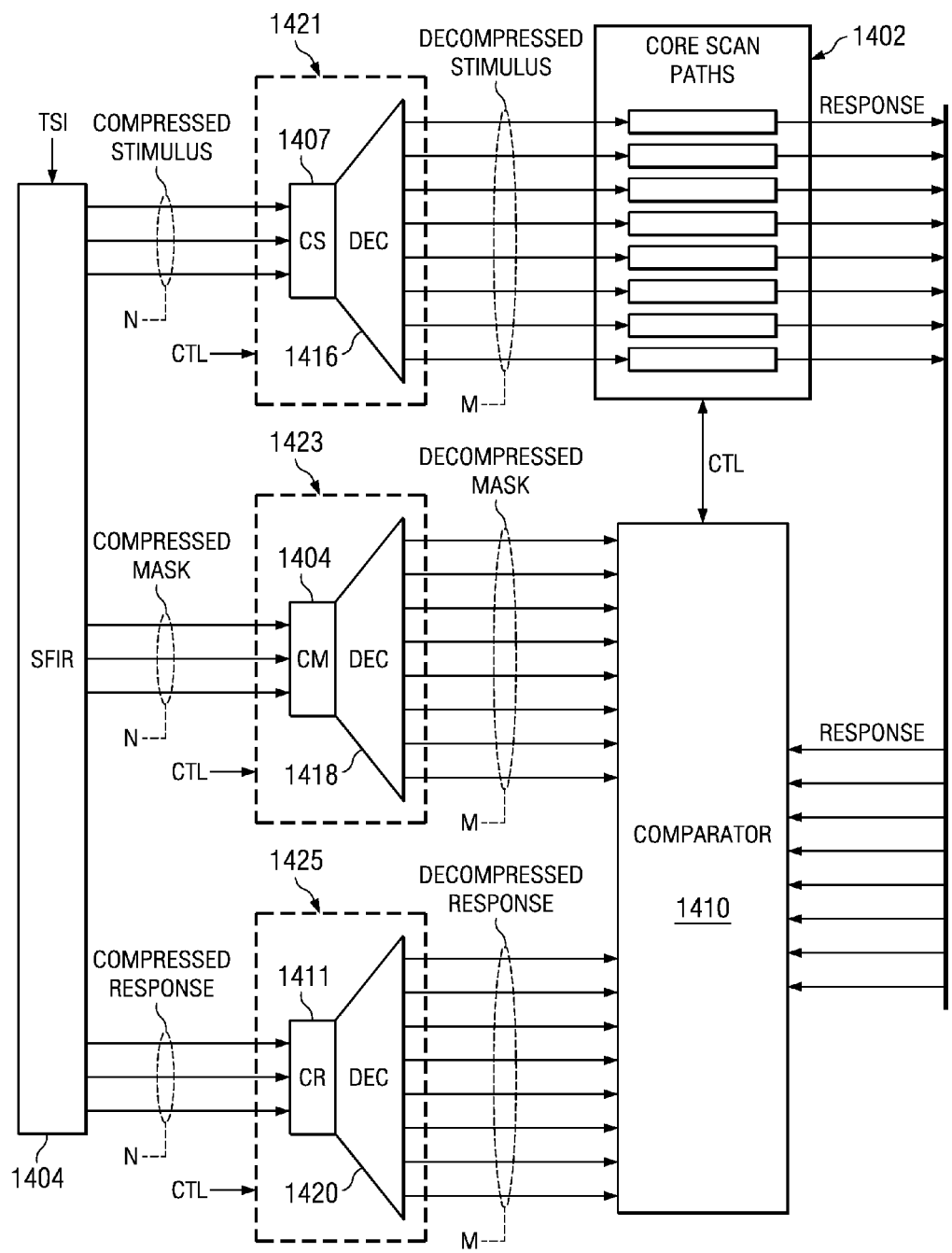
FIG. 14B illustrates a detail view of the stimulus decompression, mask decompression, response decompression, and response comparator circuits of FIG. 14A.

FIG. 14B illustrates a more detailed view of the stimulus decompression, mask decompression, response decompression, and response comparator circuits of FIG. 14A. When compressed stimulus, mask, and response data is updated from the SFIR 1404 to the CS 1407, CM 1409, and CR 1411 register sections of the SFUR 1406, the CS register 1407 and decompressor 1416 circuit combination 11421, the CM register 1409 and decompressor 1418, and the CR register 1411 and decompressor 1420 circuit combination 1425 are enabled by control input from the controller to decompress the compressed stimulus, mask, and response data in the CS, CM, and CR registers. The decompressed stimulus data is input to the core scan paths, the decompressed mask data is input to comparator 1410, and the decompressed response data is input to comparator 1410. The CS, CM, and CR registers operate as LFSRs or other pseudorandom pattern generation circuits to produce multiple stimulus, mask, and response patterns from the single CS, CM, and CR input patterns. The decompressor 1416 receives the multiple stimulus patterns from the CS register 1407 and outputs stimulus data to each scan path. The decompressor 1418 receives the multiple mask patterns from the CM register 1409 and outputs mask data to comparator 1410. The decompressor 1420 receives the multiple response patterns from the CR register 1411 and outputs response data to comparator 1410. To allow for masking or comparing each response input from the scan paths, there will be one mask input from decompressor 1418 and one response input from decompressor 1420 for each response input from the scan path. As seen, circuit combinations 1421, 1423, and 1425 expand a small N channel wide CS, CM, and CR input pattern into a number of larger M channel wide stimulus, mask, and response output patterns for input to the core scan paths and comparator.

In the examples illustrated in FIGS. 7A, 8A, 13A, and 14A it is seen that by using TAMs with CS, CM, and CR scan frame patterns, the bit length of the TAM SFIR can be significantly reduced over the SFIR bit length of TAMs that use C, M, and R scan frame patterns (i.e. TAMs of FIGS. 2, 3, 10, and 11). For example, if the core 1102 of FIG. 11 had an 8-bit wide stimulus input and an 8-bit wide response output, the SFIR 1104 of TAM 1100 would have to have an 8-bit wide S section, an 8-bit wide M section, and an 8-bit wide R section in series with the C and FM sections. Each scan frame input to the SFIR 1104 would contain 8 bits for the S section, 8 bits for the M section, 8 bits for the R section, and say 3 bits for the C and FM sections, or 27 bits. If the same core with 8 stimulus inputs and 8 response outputs was tested using the TAM 1400 of FIG. 14A, and assuming the CS, CM, and CR sections of SFIR 1406 required only 3 bits each, each scan frame input to the SFIR 1406 would contain 3 bits for the CS section, 3 bits for the CM section, 3 bits for the CR section, and 3 bits for the C and FM sections, or 12 bits. For the same CLK rate, the scan framing rate of the 12 bit SFIR 1406 of FIG. 14A would be double that of the 27 bit SFIR 1104 of FIG. 11. Increasing the scan frame rate of the SFIR decreases the time it takes to test to a core. In addition, since the TAM of FIG. 14A can apply a number of stimulus patterns to the core and compare the same number of response patterns from the core during each scan frame due to the decompression circuits 1421, 1423, and 1425, the test time is further reduced, which further reduces the cost of testing die and ICs.

Figure 14C:
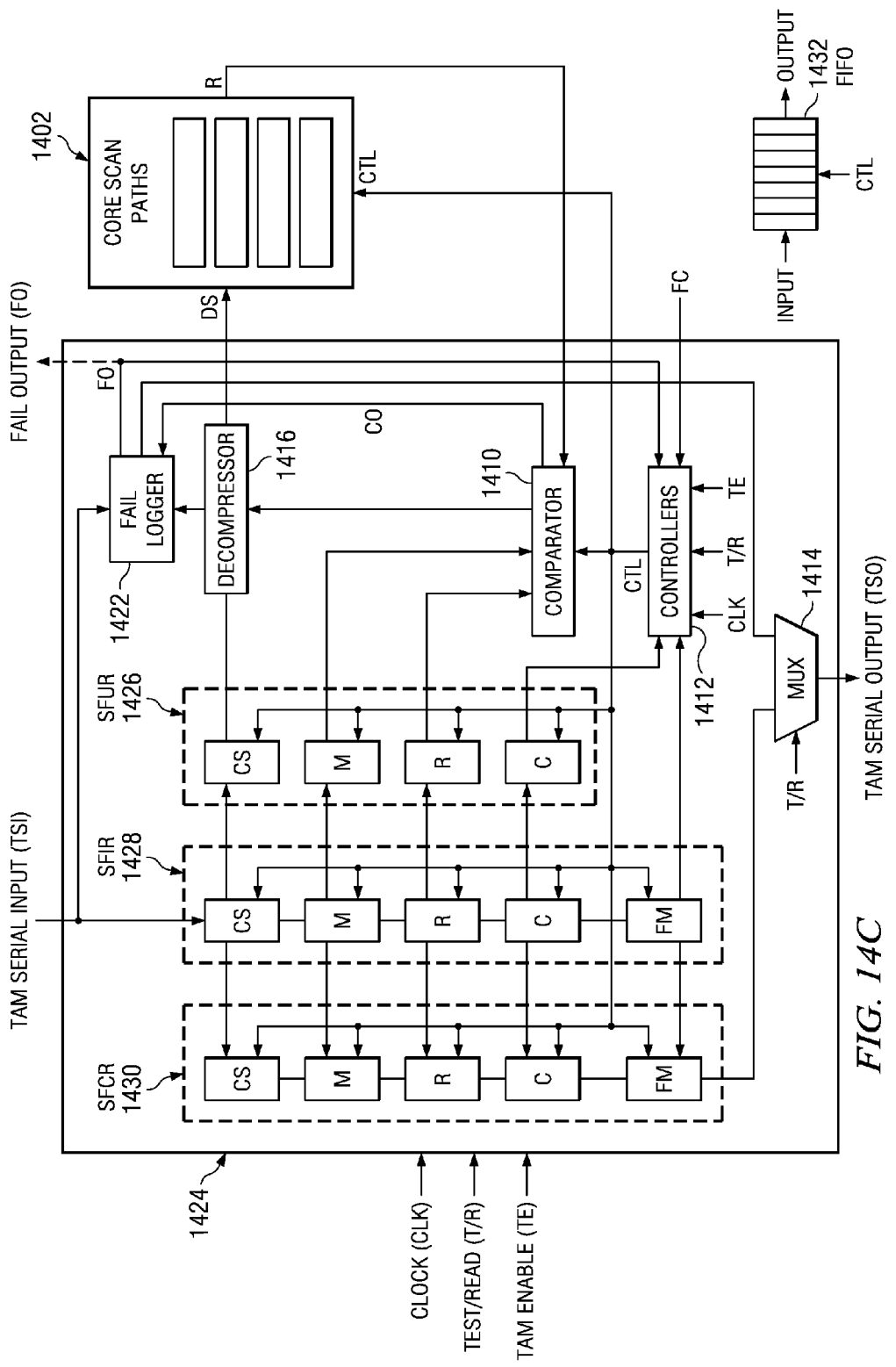
FIG. 14C illustrates a test access mechanism for testing a core according to the present invention.

FIG. 14C illustrates a Decompress & Maskable Compare TAM 1424 that can be coupled to a core within a device to enable testing of the core according to the present invention. This TAM is for use with Core Scan Paths 1402 where the response output contains unknown states. The TAM of FIG. 14C is the same the TAM of FIG. 14A with the exceptions that; (1) the SFUR 1426 contains mask (M) and response (R) FIFO 1432 sections instead of the CM and CR register sections of FIG. 14A, (2) the SFIR 1428 contains M and R register sections instead of the CM and CR register sections of FIG. 14A, and (3) the SFCR 1430 contains M and R register sections instead of the CM and CR register sections of FIG. 14A. In FIG. 14C, the maskable comparing of the response outputs from the core scan paths is achieved by buffering up mask and response data into the M and R FIFOs of SFUR 1426 and outputting the buffered mask and response data to the comparator 1410 as the decompressed stimulus data from the decompressor is being input to the core scan paths. With the exception that the FIG. 14C TAM uses buffered mask and response data as opposed to the FIG. 14A TAM using decompressed mask and response data, the test and read operations of the two TAMs are identical.

Figure 15:
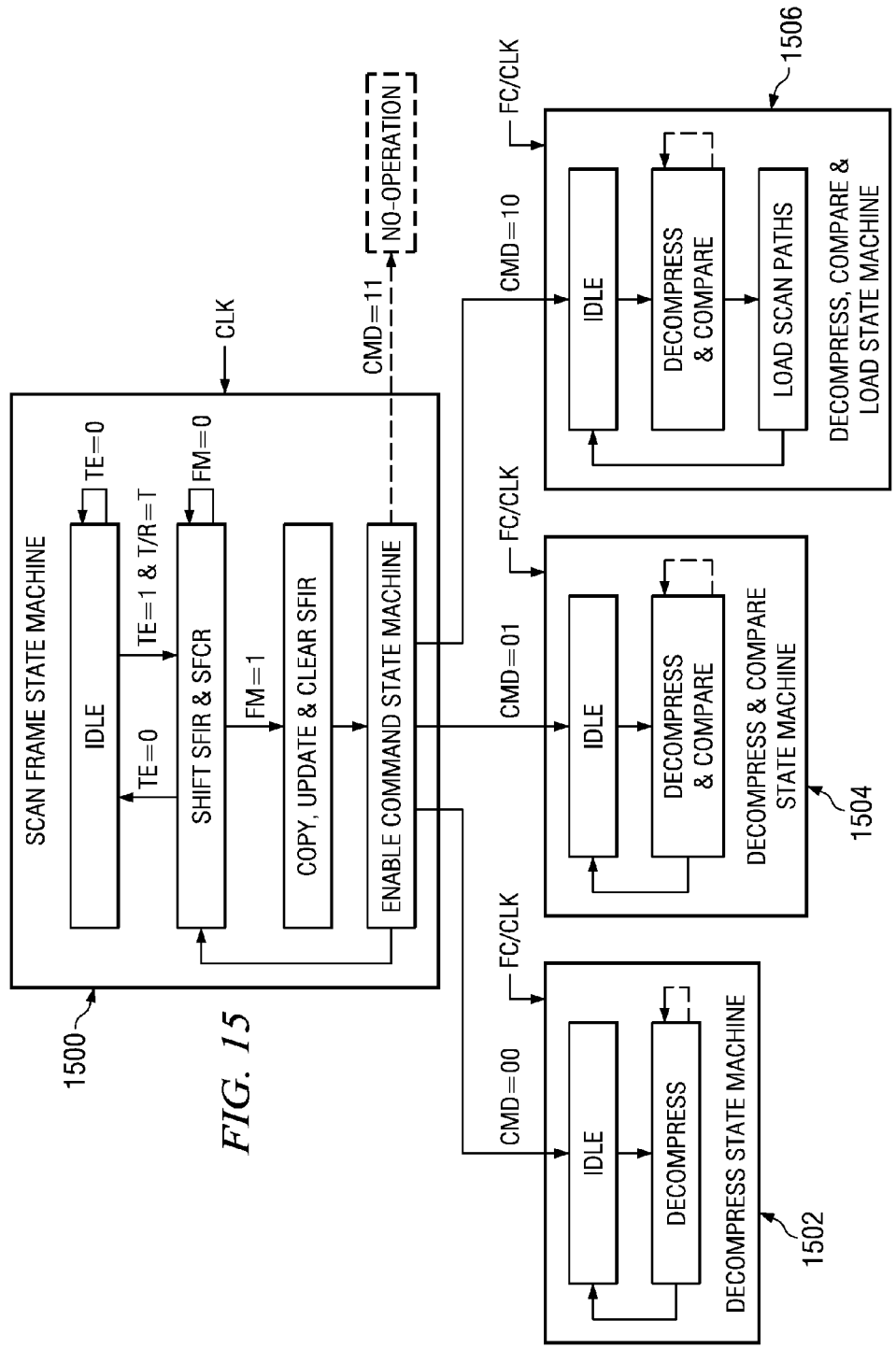
FIG. 15 illustrates the operation of the controller of the test access mechanisms of FIGS. 13A, 13C, 14A, and 14C.

FIG. 15 illustrates the operation of the Controllers of the FIGS. 13A, 13C, 14A, and 14C TAMs when TE is high and T/R is set for test operation. The Controller consists of a Scan Frame state machine 1500, a Decompress state machine 1502, a Decompress & Compare state machine 1504, and a Decompress, Compare & Load state machine 1506. The Scan Frame state machine is clocked by the CLK input and is used to input and output scan frames from the SFIR and SFCR, respectively, and to enable one of the Command state machines in response to a Command input from the SFUR. The Scan Frame state machine has an Idle state where it resides when TE is low, a Shift SFIR & SFCR state where it shifts scan frames in from TSI and out on TSO while the FM signal is low, a Copy, Update, & Clear SFIR state where SFIR data is copied, updated and cleared, and an Enable Command State Machine state to enable one of the Command state machines. The Command state machines can be clocked by either the CLK or FC inputs. In response to a Command of 00 (in this example) the Decompress state machine 1502 is enabled to transition from the Idle state to the Decompress state where it resides during the decompression of the CS inputs of FIGS. 13A, 13C, 14A, and 14C. After the decompression step is performed, the Decompress state machine transitions back to the Idle state. The Decompress state machine is used to initialize the scan paths with stimulus data at the beginning of a test operation. In response to a Command of 01 (in this example) the Decompress & Compare state machine 1504 is enabled to transition from the Idle state to the Decompress & Compare state where it resides during the decompression of the CS and CR inputs of FIG. 13A, the decompression of the CS inputs and the outputting of buffered response data of FIG. 13C, the decompression of the CS, CM and CR inputs of FIG. 14A, or the decompression of the CS inputs and the outputting of buffered mask and response data of FIG. 14C. After the decompress and compare step is preformed, the Decompress & Compare state machine transitions back to the Idle state. In response to a Command of 10 (in this example) the Decompress, Compare & Load state machine 1506 is enabled to transition from the Idle state to the decompress & compare state where it resides during the decompression operations of FIGS. 13A and 14A or the decompression and buffered output operations of FIGS. 13C and 14C. After the decompress and compare step is preformed, the Load, Decompress & Compare state machine transitions back to the Idle state. The Decompress, Compare & Load state machine is used to shift in the last stimulus data to the core scan paths during a current decompress and compare test operation cycle, to compare the last non-masked response outputs from the core scan paths during the current decompress and compare test operation cycle, and to load response data from combinational logic into the core scan paths in preparation for the next decompress and compare test operation cycle. When testing is complete, the TE signal is set low to cause the Scan Frame state machine to return to the Idle state.

Figure 16:
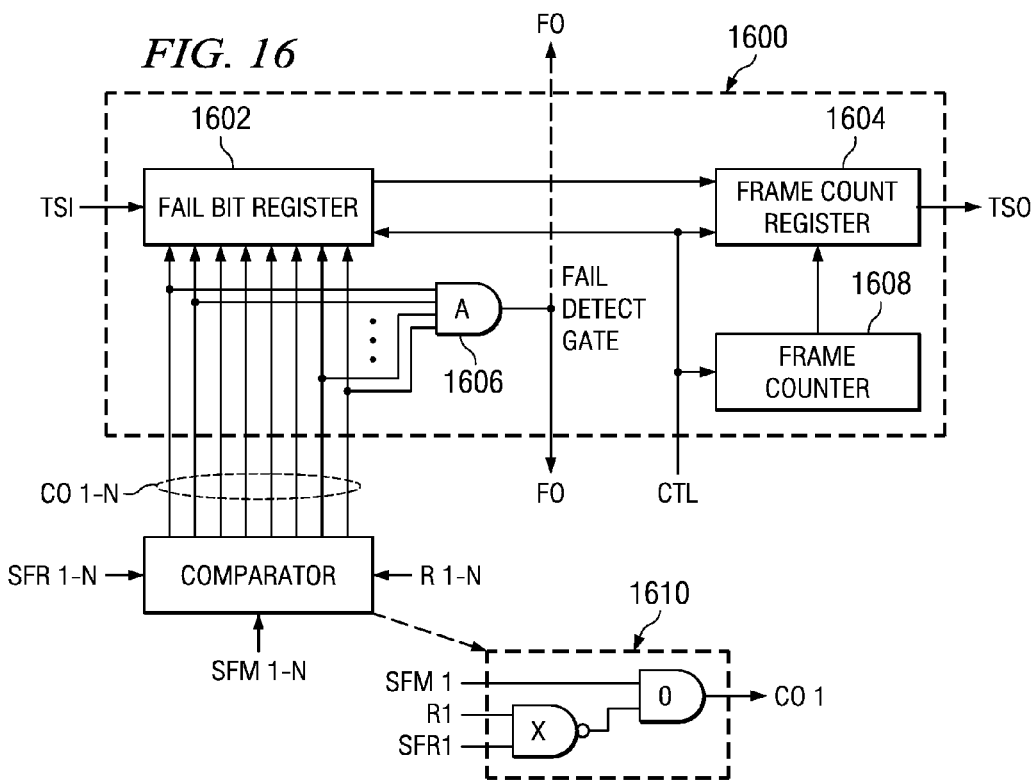
FIG. 16 illustrates a single detect fail logger circuit of the controllers of the test access mechanisms of FIGS. 13A, 13C, 14A, and 14C.

FIG. 16 illustrates an example of a Single Detect Fail Logger Circuit 1600 that can be used in the TAMs of FIGS. 10, 11, 13, and 14. The circuit consists of a Fail Bit Register 1602, a Frame Count Register 1604, a Fail Detect Gate 1606, and a Frame Counter 1608. The Fail Bit Register and Fail Detect Gate receive the Compare Outputs (CO1-N) from the Comparator of FIGS. 10, 11, 13, and 14. The FO output of the Fail Detect Gate is output to the Controller and optionally output from the TAM for input to tester so that the tester can immediately detect when a failure occurs. An example circuit 1610 for comparing SFR1 with R1 or masking (SFM1=1) the compare operation is shown to include a XNOR (X) and OR (O) gate. The Comparator would have one such circuit for each SFR1-N, SFM1-N, and R1-N input. The Fail Bit Register, Frame Count Register, and Frame Counter are controlled by the CTL bus output from the Controller. At the beginning of a test, the Fail Bit Register, Frame Counter and Frame Count Register will be initialized to zero. During test the CTL inputs cause the Frame Counter to count up each time a scan frame occurs, i.e. when the FM goes high. For each scan frame input, the Scan Frame Response (SFR1-N) is compare to the Response (R1-N) output from the core scan paths. The Scan Frame Mask (SFM1-N) can be used to mask off compare operations of unknown response inputs from the core scan paths. Following each compare operation, the CO1-N outputs from the Comparator are written into the Fail Bit Register. If one or more CO1-N signals are at a failing logic low level, the FO output from the Fail Detect Gate will go low (in this example implementation). In response to a low on the FO, the Controller will write the Frame Counter value into the Frame Count Register and cease the operation of the Fail Logger circuit. At the end of the test, the contents of the Fail Bit Register and Frame Count Register can be shifted out for inspection via TSI and TSO. The contents of the Fail Bit Register will indicate the failing one of more CO1-N inputs and the Frame Count Register will indicate the scan frame where the failure occurred. For example, if CO3 and CO7 failed during scan frame 1000 the CO3 and CO7 bits of Fail Bit Register will be low and the Frame Count Register will contain a frame count of 1000. The Fail Logger circuit of FIG. 16 allows for detecting the first scan frame compare failure.

Figure 17:
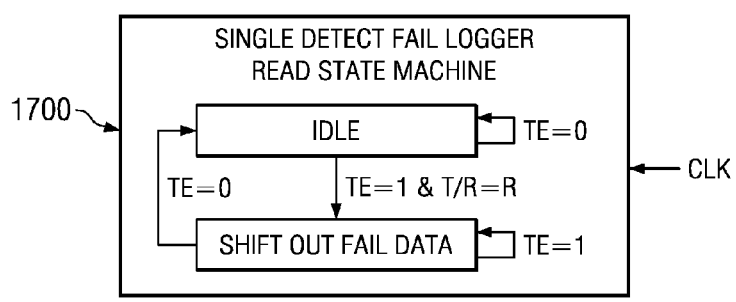
FIG. 17 illustrates the operation of the controller of the test access mechanisms of present invention during a single fail data read operation.

FIG. 17 illustrates the operation of the Single Detect Fail Logger Read state machine 1700 in the TAM Controllers of FIGS. 10, 11, 13, and 14. This state machine is used to read out the contents of the Fail Bit Register and Frame Count Register of FIG. 16. As seen, when TE is high and T/R is set for Read operation the state machine transitions from the Idle state to the Shift Out Fail Data state. The state machine remains in the Shift Out Fail Data state until TE returns low. In the Shift Out Fail Data state, the Fail Bit Register and Frame Counter registers shift from TSI to TSO. The shift out operation unloads the failing CO bit pattern and the failing scan frame count. As seen in FIGS. 10, 11, 13, and 14, when T/R is set for read operation a multiplexer couples the serial output from the Fail Logger circuit to the TSO output of the TAM.

Figure 18:
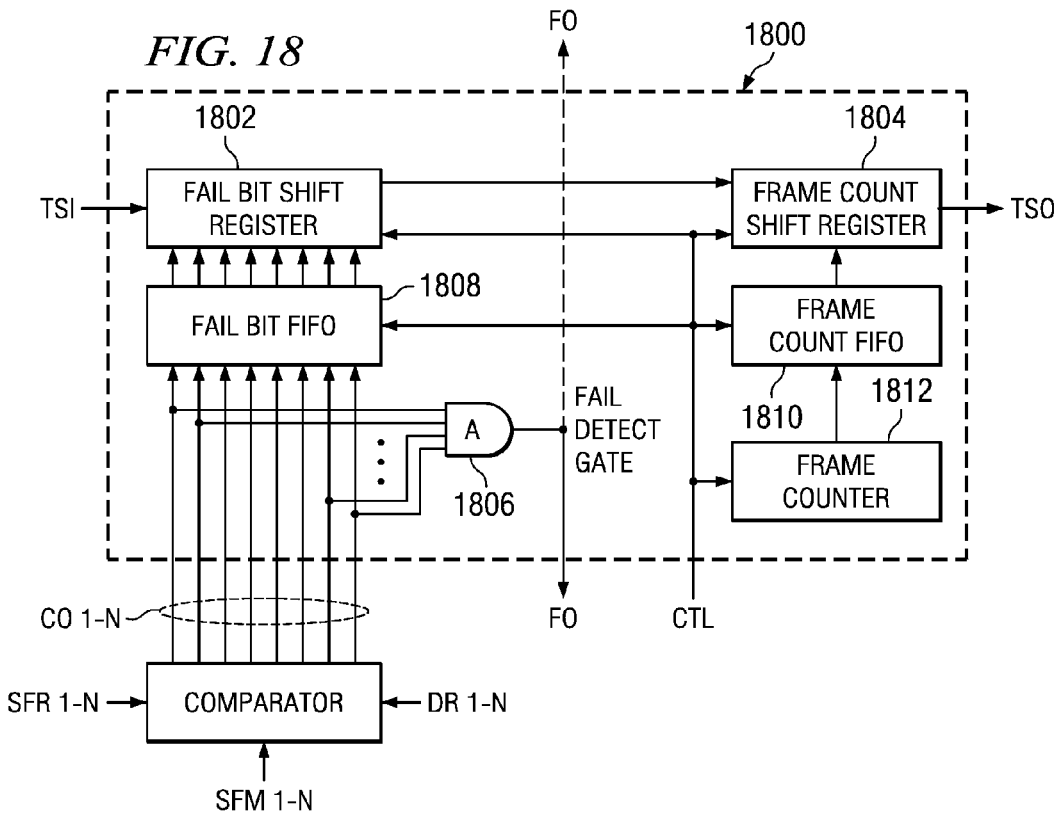
FIG. 18 illustrates a multiple detect fail logger circuit of the controllers of the test access mechanisms of FIGS. 13A, 13C, 14A, and 14C.

FIG. 18 illustrates an example of a Multiple Detect Fail Logger Circuit that can be used in the TAMs of FIGS. 10, 11, 13, and 14. The circuit consists of a Fail Bit Shift Register 1802, a Frame Count Shift Register 1804, a Fail Detect Gate 1806, a Fail Bit FIFO 1808, a Frame Count FIFO 1810, and a Frame Counter 1820. The Fail Bit FIFO and Fail Detect Gate receive the Compare Outputs (CO1-N) from the Comparator. The FO output of the Fail Detect Gate is output to the Controller and optionally output from the TAM for input to tester so that the tester can immediately detect when a failure occurs. The Fail Bit FIFO, Frame Count FIFO, Fail Bit Shift Register, Frame Count Shift Register, and Frame Counter are controlled by the CTL bus output from the Controller. At the beginning of a test, the Fail Bit FIFO, Fail Bit Shift Register, Frame Count FIFO, Frame Count Shift Register, and Frame Counter are initialized to zero. During test the CTL inputs cause the Frame Counter to count up each time a scan frame occurs, i.e. when the FM goes high. For each scan frame input, the Scan Frame Response (SFR1-N) is compare to the Response (R1-N) output from the core scan paths. The Scan Frame Mask (SFM1-N) can be used to mask off compare operations of unknown response inputs from the core scan paths. If one of more CO1-N signals are at a failing logic low level, the FO output from the Fail Detect Gate will go low (in this example implementation). In response to a low on the FO, the Controller will write the CO1-N pattern into the Frame Bit FIFO and the Frame Counter value into the Frame Count FIFO and continue the test. At the end of the test, the contents of the Fail Bit FIFO and Frame Count FIFO can be shifted out for inspection using the Fail Bit Shift Register and Frame Count Shift Register. During each shift out operation, a Fail Bit pattern and a Frame Count Pattern from the FIFOs will be loaded into the Fail Bit Shift Register and Frame Count Shift register, respectively, and shifted out via TSI and TSO. Each pattern shifted out will identify the failing one or more CO1-N bits of each failing scan frame count pattern. The Fail Logger circuit of FIG. 18 allows for detecting multiple scan frame compare failures.

Figure 19:
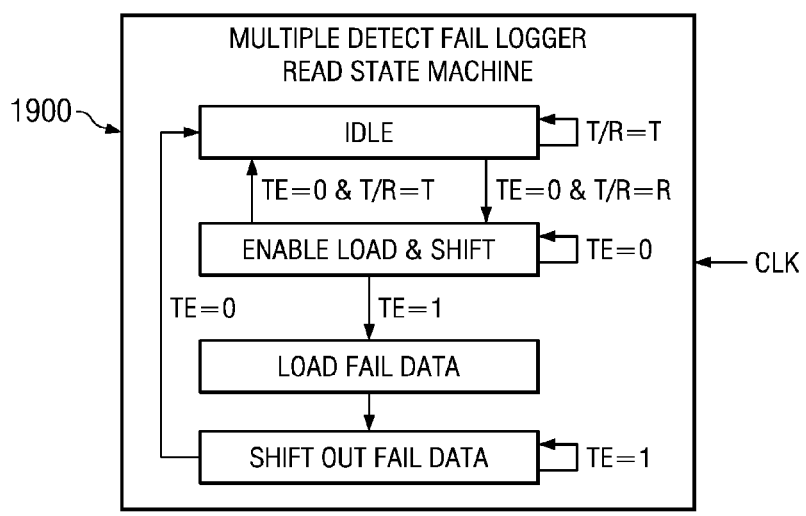
FIG. 19 illustrates the operation of the controller of the test access mechanisms of present invention during a multiple fail data read operation.

FIG. 19 illustrates the operation of the Multiple Detect Fail Logger Read state machine 1900 in the TAM Controllers of FIGS. 10, 11, 13, and 14. This state machine is used to read out the contents of the Fail Bit FIFO and Frame Count FIFO of FIG. 18. As seen, when TE is high and T/R is set for Read operation the state machine transitions from the Idle state to the Enable Load & Shift state. When TE goes high, the state machine transitions to the Load Fail Data state to load a failing CO pattern from the Fail Bit FIFO into the Fail Bit Shift Register and to load the failing scan frame count from the Frame Count FIFO into the Frame Count Shift Register. From the Load Fail Data state the state machine transitions to the Shift Out Fail Data state to shift out the contents of the Fail Bit Shift Register and Frame Count Shift Register. The state machine remains in the Shift Out Fail Data state while TE is high. When TE goes low, the state machine transitions to the Enable Load & Shift state to prepare to load and shift out the next failing CO pattern and scan frame count data from the FIFOs. This process of loading and shifting out the FIFO data continues until all the FIFO data have been read. When the FIFO read operation is complete, TE is set low and T/R is set to test to cause the state machine to return to the Idle state. As seen in FIGS. 10, 11, 13, and 14, when T/R is set for read operation a multiplexer couples the serial output from the Fail Logger circuit to the TSO output of the TAM.

Figure 20:
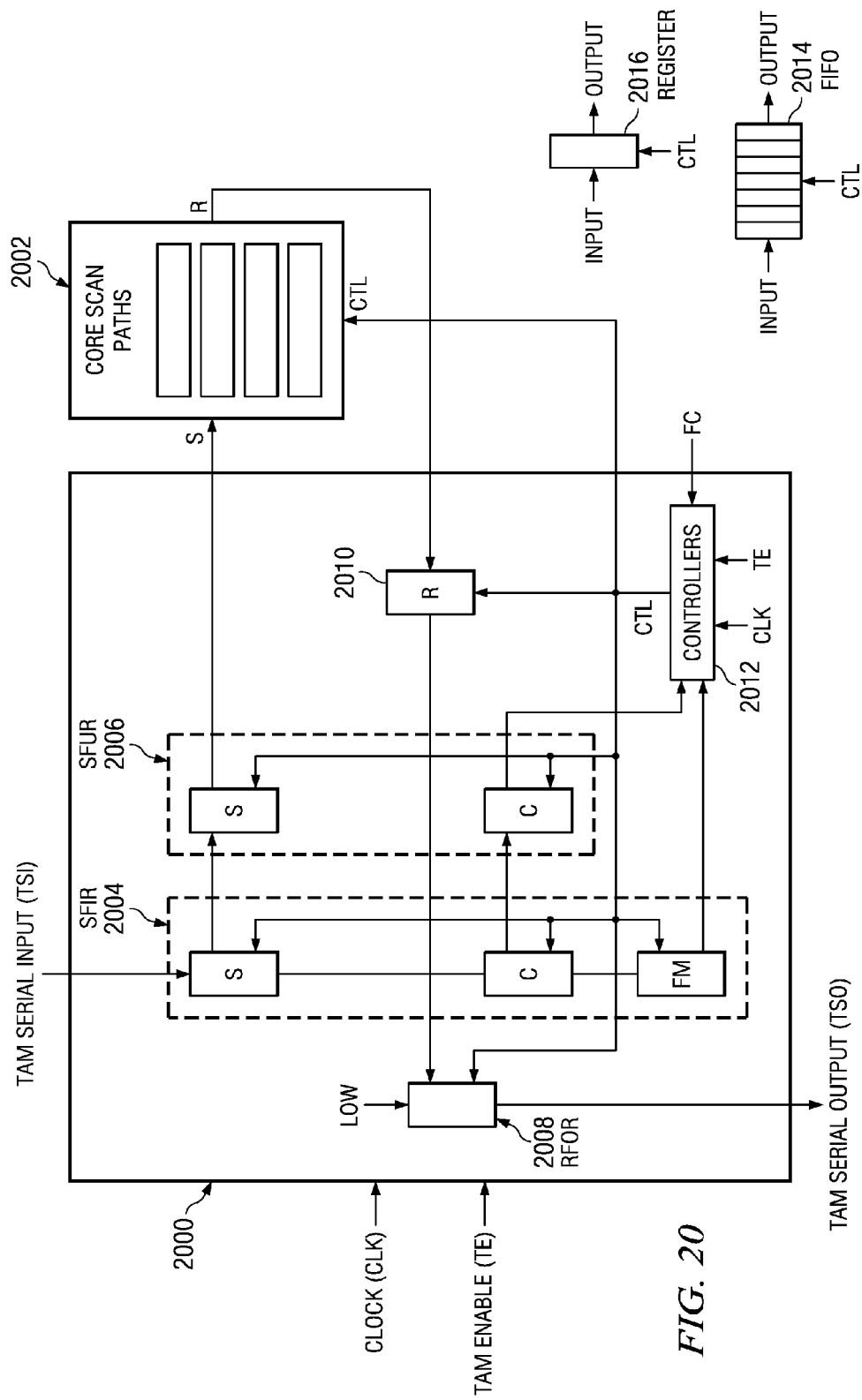
FIG. 20 illustrates a test access mechanism for testing a core according to the present invention.

FIG. 20 illustrates a Stimulus & Response TAM 2000 that can be coupled to a core within a device to enable testing of the core according to the present invention. This TAM can be use with Core Scan Paths 2002 that output either known or unknown responses. The TAM includes a SFIR 2004, a response frame output register (RFOR) 2008, a SFUR 2006, a response (R) 2010 register 2016 or FIFO 2014, and a Controller 2012. The SFIR comprises S, C, and FM sections. The SFUR comprises an S and C section. The S section of the SFUR can be a register 2016 or a FIFO 2014. The TAM has a TSI input, a TSO output, a CLK input, a TE input, an FC input, an S output bus to the core, a R input bus from the core, and a CTL output bus to the core. The S bus from the SFUR is input to the core scan paths, the R bus from the core scan paths is input to the R register/FIFO 2010, the outputs of the R register/FIFO is input to the RFOR 2008, and the CTL bus from the Controller provides control for the TAM circuits and core scan paths. When TE is set high, the Controller is enabled to shift scan frames into the SFIR from TSI and shift scan frames out of the RFOR on TSO in response to the CLK input. When the FM signal from the SFIR goes high, the Controller transfers the contents of the S and C sections of the SFIR into the S and C sections of the SFUR, the response (R) output from the R register/FIFO into the RFOR, and then clears the SFIR. Following the transfer and clear operation, the Controller executes the Command (C) output from the SFUR. The Controller can execute the Command timed by either the CLK or a Functional Clock (FC) signal. During the Command execution, the S data from the SFUR is input to the stimulus inputs of the core scan paths while the R outputs from the core scan paths are input to the R register/FIFO 2010. While the Command is being executed, the next scan frame is shifted into the SFIR via TSI and the response to the previous scan frame is shifted out of the RFOR via TSO. When the response bits contained in the RFOR have been shifted out, logic low bits (or high bits if desired) will be shifted out for the remainder of the scan frame input and output operation. This occurs since the shift length of the RFOR is less than the shift length of the SFIR. This process of shifting in a new scan frame from TSI, shifting out the response of the previous scan frame on TSO, and executing a Command continues until the TE signal goes low to end the test operation. Since this TAM provides the response back to the tester during each scan frame shift operation via the RFOR, there is no need for a Read operation. Thus the T/R input is not required for this TAM. However, all the other standardized TAM interface signals are maintained.

Figure 21:
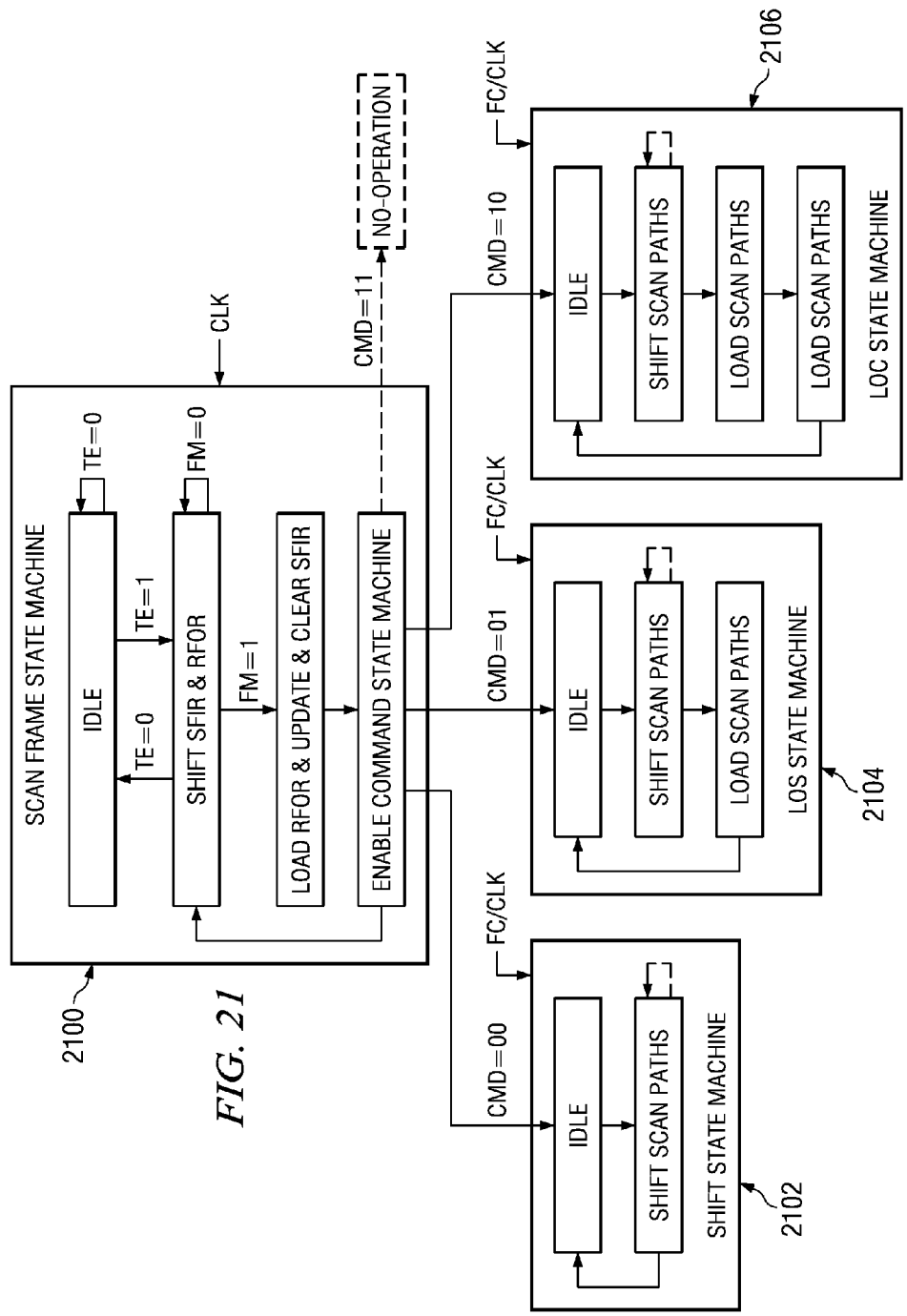
FIG. 21 illustrates the operation of the controller of the test access mechanisms of FIG. 20.

FIG. 21 illustrates the operation of the Controllers of the FIG. 20 TAM when TE is high. The Controller consists of a Scan Frame state machine 2100, a Shift state machine 2102, a Launch on Shift (LOS) state machine 2104, and a Launch on Capture (LOC) state machine 2106. LOS is a term commonly used when delay, at-speed, or timing closure testing of the combinational logic is performed by capturing (i.e. loading) the response output from the combinational logic into the scan path as soon as possible (i.e. next clock edge) following the last stimulus input to the combinational logic from the scan path. LOC is a term commonly used when delay, at-speed, or timing closure testing of the combinational logic is performed by capturing (i.e. loading) the response output from the combinational logic into the scan path as soon as possible (i.e. next clock edge) following a back-to-back response capture operation from the combinational logic into the scan path. It is important to note that the command state machines of 406 of FIG. 4, 906 of FIG. 9, 1206 of FIG. 12, 1506 of FIG. 15, and 2106 have all been defined to perform LOS type delay, at-speed, and timing closure test operations on combinational logic by the scan framing approach of the present invention.

The Scan Frame state machine 2100 is clocked by the CLK input and is used to input scan frames to the SFIR, output response scan frames from the RFOR, and to enable one of the Command state machines in response to a Command input from the SFUR. The Scan Frame state machine has an Idle state where it resides when TE is low, a Shift SFIR & RFOR state where it shifts scan frames in from TSI and out on TSO while the FM signal is low, a Load RFOR & Update & Clear SFIR state where response data from the R register/FIFO 2010 is loaded into the RFOR 2008, the SFIR data is updated into the SFUR, and the SFIR is cleared, and an Enable Command State Machine state to enable one of the Command state machines. The Command state machines can be clocked by either the CLK or FC inputs. In response to a Command of 00 (in this example) the Shift state machine 2102 is enabled to transition from the Idle state to the Shift Scan Paths state then back to the Idle state. During the Shift Scan Paths state, the stimulus (S) data from the SFUR's S register 2016 or FIFO 2014 is input to the core scan paths and the response (R) data from the scan paths is input to the R 2010 register 2016 or FIFO 2014. In response to a Command of 01 (in this example) the LOS state machine 2104 is enabled to transition from the Idle state to the Shift Scan Paths state, to the Load Scan Paths state, and back to the Idle state. During the Shift Scan Paths state, the stimulus (S) data from the SFUR'S register/FIFO is input to the core scan paths and the response (R) data from the core scan paths is input to the R register/FIFO 2010. During the Load Scan Path state, the scan paths load response data from combinational logic. The LOS state machine enables the response data from combinational logic to be captured immediately after the scan paths shift in the last stimulus data that fills the scan paths. In response to a Command of 10 (in this example) the LOC state machine 2106 is enabled to transition from the Idle state to the Shift Scan Paths state, to a first Load Scan Paths state, to a second Load Scan Paths state, and back to the Idle state. During the Shift Scan Paths state, the stimulus (S) data from the SFUR's S register/FIFO is input to the core scan paths and the response (R) data from the core scan paths is input to the R register/FIFO 2010. During the first Load Scan Paths state, the scan paths load response data from combinational logic in response to the stimulus data shifted into the scan paths. During the second Load Scan Paths state, the scan paths load response data from the combinational logic in response to the response data captured into the scan paths during the first Load Scan Paths state. The LOC state machine enables response data from combinational logic to be captured following the first load scan path operation and then again during the second load scan paths operation. When testing is complete, the TE signal is set low to cause the Scan Frame state machine 2100 to return to the Idle state.

As seen in FIG. 21, if FIFOs 2014 are used for the S section of the SFUR and the TAM's R section 2010, the Shift state machine 2102 will remain in the shift scan paths state, the LOS state machine 2104 will remain in the shift scan paths state, and the LOC state machine 2106 will remain in the shift scan paths state, as indicated by dotted line, for the number of FC/CLK cycles required to output a number of buffered stimulus patterns from the S FIFO section of the SFUR and to input an equal number of response patterns from the core scan paths to the R FIFO 2010 section.

Figure 22:
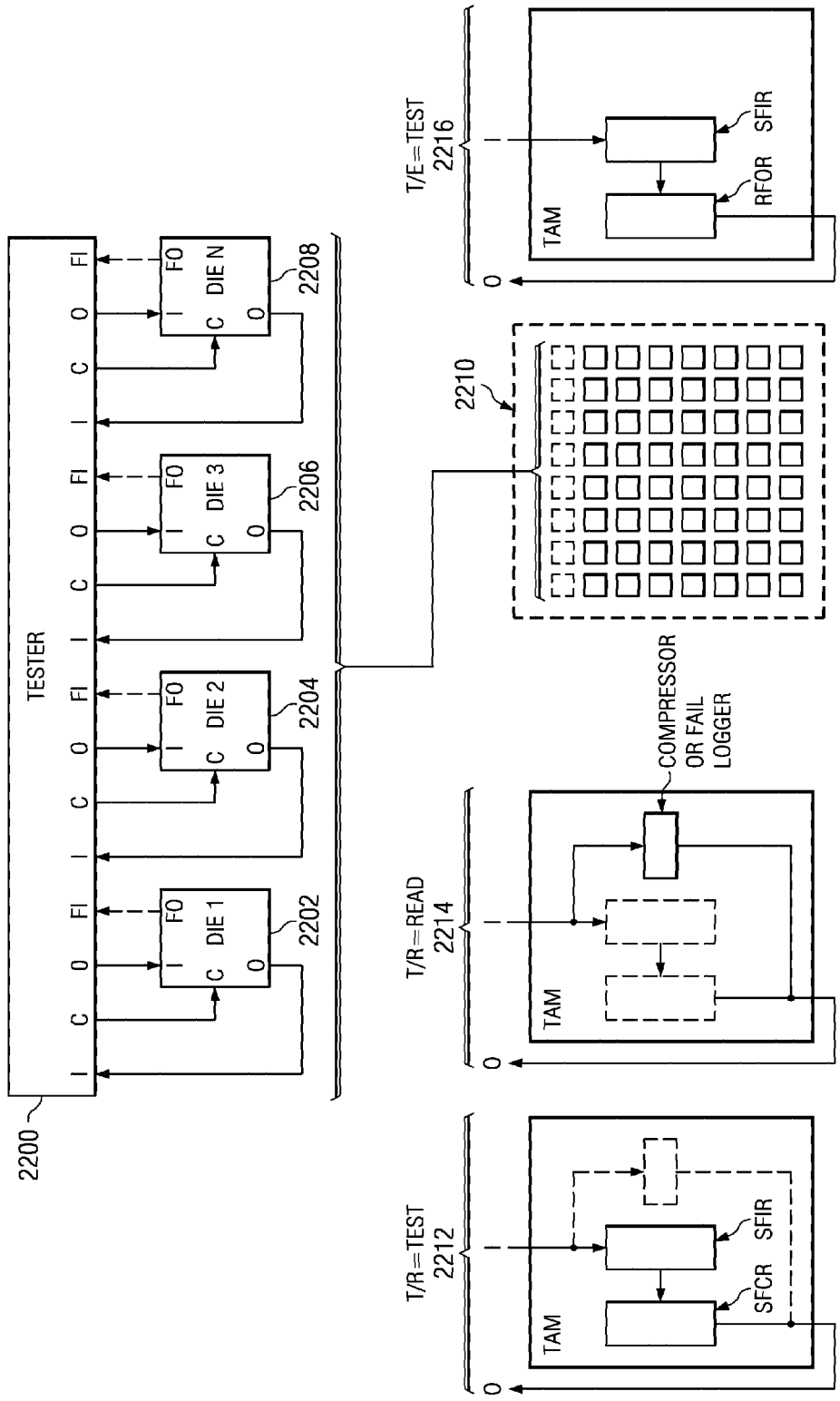
FIG. 22 illustrates the testing and reading of individual die/ICs according to the present invention.
Figure 23:
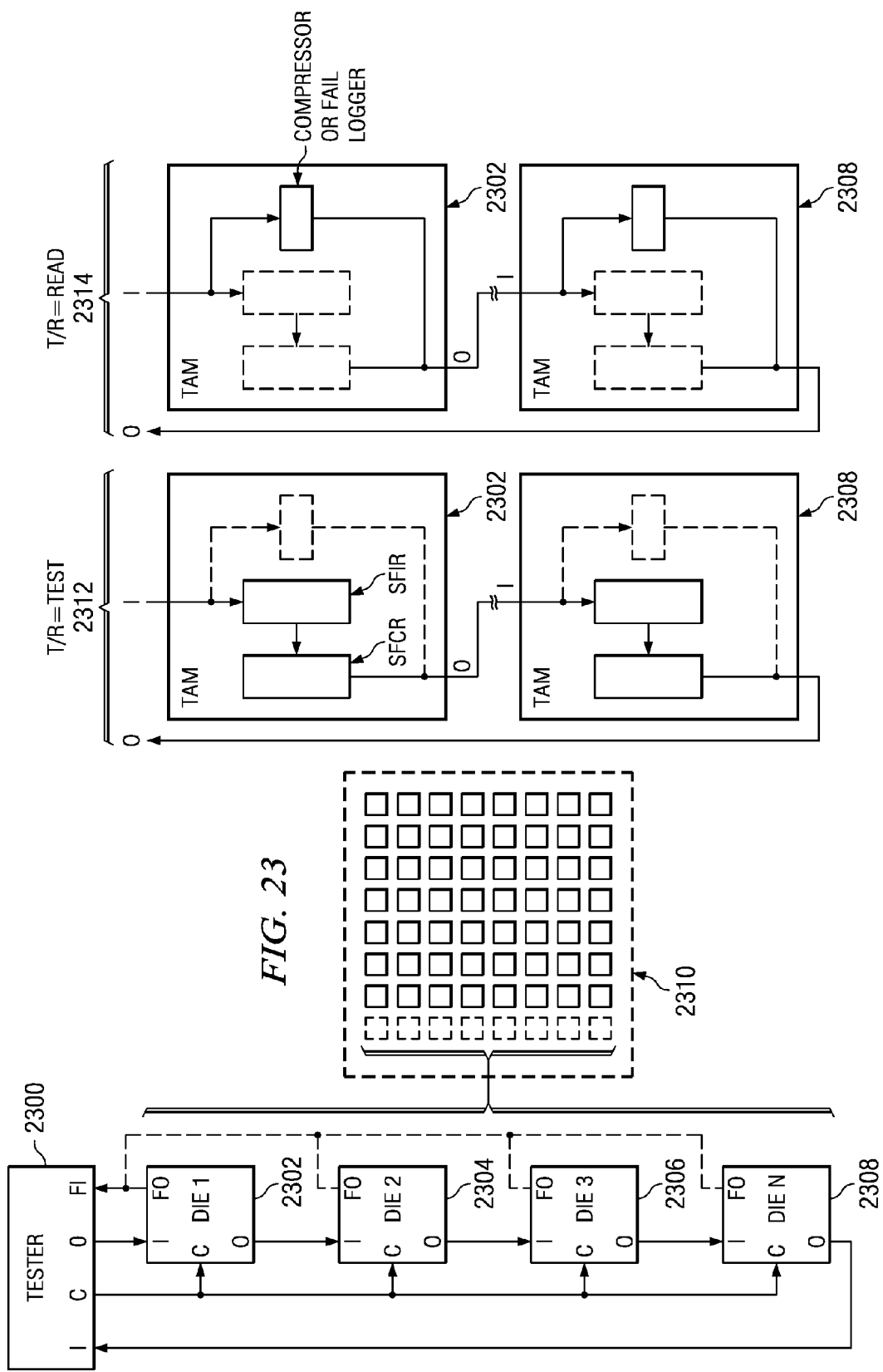
FIG. 23 illustrates the testing and reading of strings of die/ICs according to the present invention.

The following examples in FIGS. 22 and 23 illustrate how the Scan Frame Based TAMs of this application can be used to test individual die on wafer, or to test strings of die on wafer. While the figures represent die on wafer being tested individually or in strings, it should be understood that FIGS. 22 and 23 could represent packaged or un-packaged ICs on a carrier or other substrate being tested individually or in strings as well. The term "device" will be used in the following description to indicate both die on wafer and ICs on a carrier or other substrate.

FIG. 22 illustrates a tester 2200 contacting N individual die/ICs (devices) 2202-2208 on a wafer/substrate 2210. The tester has a data output (O), a data input (I), and a control (C) output(s) for each device. Each device has a data input (I) coupled to the tester's data output (O), a data output (O) coupled to the tester's data input (I), and control (C) input(s) coupled to the tester's control (C) output(s). The I input of each device is coupled to a TSI input of a TAM within the device, the O output of is coupled a TSO output of a TAM within the device, and the C inputs of each device controls the TE, T/R, and CLK inputs of a TAM within the device. As seen in TAM example 2212, when T/R is set for a TAM Test operation, the tester inputs scan frames to the TAM's SFIR via the I input, outputs copied scan frames from the TAM's SFCR via the O output, and inputs control to the TAMs controller via the C input. The copied scan frame data output to the tester from SFCR is not required for testing, but it does allow the tester to verify that the correct scan frame data was input to the SFIR. Each die on wafer could be tested simultaneously by the tester having an I, O, and C interface for each die. Also as seen in TAM example 2214, when T/R is set for a TAM Read operation, the tester inputs data to the TAMs Compressor or Fail Logger via the I input, outputs data from the TAM's Compressor or Fail Logger via the O output, and inputs control to the TAMs controller via the C input. As previously mentioned the Read operation allows the tester to inspect the signature in the Compressor and the fail data in the Fail Logger following a test operation. TAM example 2216 illustrates how the TAM of FIG. 20 would receive input (I) from the tester and transmit output (O) to the tester via the SFIR and RFOR, respectively, when the TAM's TE input is set for test operation. The one exception to the above described test operation is the test operation of TAM 2000 of FIG. 20. As previously described in FIG. 20, TAM 2000 outputs response frames on the O output of the device instead of copied scan frames. While the contacted die of FIG. 22 are shown as being die in a row on the wafer, the contacted die could be die randomly distributed around the wafer as well.

FIG. 23 illustrates a tester 2300 contacting a String of N devices 2302-2308 on a wafer 2310. The tester has a data output (O), a data input (I), and a control (C) output(s) for each device. Each device has a data input (I), a data output (O), and control (C) input(s). The data input (I) of the first device 2302 of the string is coupled to the data output (O) from the tester and the data output (O) output of the last device 2308 in the string is coupled to the data input (I) to the tester. Devices existing between the first and last devices of a string are serially connected such that a leading device data output (O) is connected to the data input (I) of a trailing device. Each device in the string is connected to the control input (C) from the tester. The I input of each device in the string is coupled to the TSI input of a device TAM, the O output is coupled to the TSO output of a device TAM, and the C input controls each device TAM's TE, T/R, and CLK inputs. As seen in the example device TAM string arrangement 2312, when T/R is set for a TAM Test operation, the tester inputs a first scan frame to a TAM SFIR of the first device 2302. The TAM of the first device copies the first scan frame into its SFCR and outputs the copied scan frame to a TAM SFIR of the second device. The SFIR of the TAM of the second device inputs the scan frame, copies the first scan frame into its SFCR, then outputs the copied scan frame to a TAM SFIR of the third device. This scan frame input, copy, and output process repeats until eventually the last device 2308 in the string inputs the first scan frame from the next to last device in the string. The second and subsequent scan frames from the tester are similarly input, copied and output from the first device in the string to all trailing devices in the string according to the above described scan frame relaying technique. As each device is outputting the copied scan frame to a trailing device, it is also inputting the next scan frame and performing a test using the copied scan frame. For example, as the second device is receiving the first scan frame from the first device, the first device is inputting the second scan frame while simultaneously executing a test using the first scan frame. At the beginning of a test operation, i.e. before the first scan frame is copied from the SCIR into the SFCR, the first scan frame output from each device's SFCR will be an all zero scan frame. Initially outputting an all zero scan frame keeps trailing devices from responding to the initial scan frame output from a leading device. Using this scan framing technique, the testing of the first device of the string will complete first, then the testing of the second device of the string, then the testing of the third device of the string, and so on. The last device in the string will be the last device to complete its test. When the first device completes its test, the tester will start inputting scan frames with no-operation commands, as mentioned in regard to FIG. 4. The no-operation commands have the effect of holding devices that have completed their tests in a quiet, low power mode while other devices in the string are completing their test. The advantage of testing strings of devices as seen in FIG. 23 rather than testing individual devices as seen in FIG. 22 is that the number of contacts between the tester and devices under test is reduced. For example, individual device testing requires the tester to receive the output (O) from each device being tested, whereas device string testing only requires the tester to receive the output (O) of the last device in a device string. As seen in the example device TAM string arrangement 2314, when T/R is set for a TAM Read operation, the tester serially accesses the TAM string via the serial I and O path to extract each TAM's Compressor signature or the Fail Logger fail data following a test operation. The TAM Read operations were described previously in regard to FIGS. 6, 17, and 19. While the die string of FIG. 23 is shown as being die in a column on the wafer, the string of die could consist of die randomly distributed around the wafer as well. The TAM of FIG. 20 is not suitable for use in the TAM stringing approach of FIG. 23, since each FIG. 20 TAM needs to output the contents of its RFOR 2008 directly to the tester during each scan frame input and output operation.

As can be seen in FIGS. 22 and 23, it is possible to simply bring a device TAM's TSI, CLK, T/R, TE, and TSO signals out of the device for interfacing to a tester such that the tester's I output drives TSI, the tester's C outputs drive CLK, T/R, and TE, and the tester's O input receives TSO. However, if the device contains more that one TAM, each TAM's TSI, CLK, T/R, TE and TSO would have to be somehow connected to the tester interface during each TAMs test or read operation modes. This connecting could be achieved by bringing out each TAM test interface directly to the tester or by providing multiplexer circuitry in the device to switch each TAM's test interface onto a common test interface to the tester. Either of these TAM access approaches requires additional test interface contacts between the device and tester. To limit the number of test interface contacts between the device and tester each die or IC may be provided with a test port that allows any number of TAMs within the device to be selected, tested, and read using only a minimum number of test interface contacts.

Figure 24:
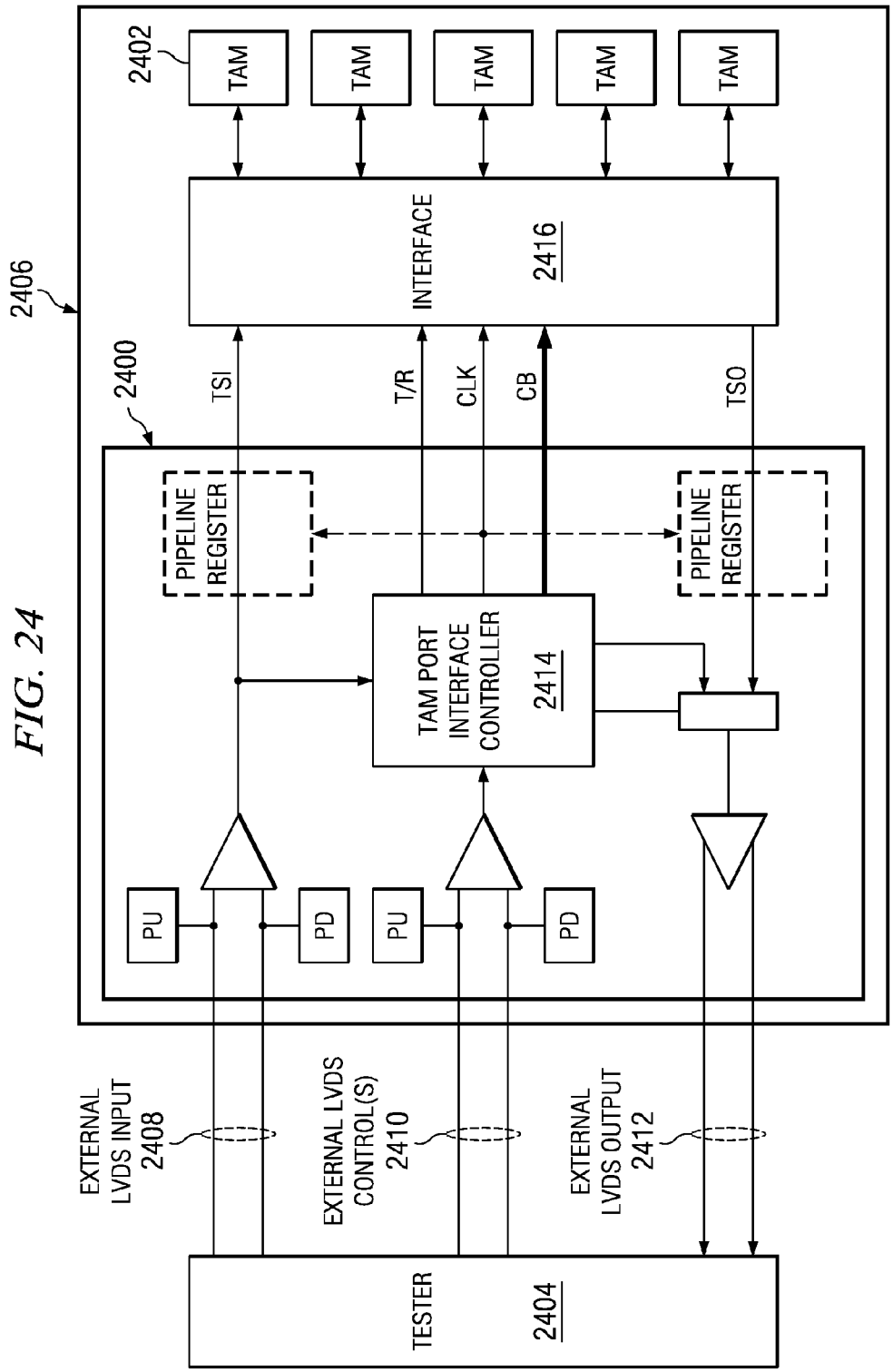
FIG. 24 illustrates a tester connected to a die/IC that includes a TAM Port, a TAM interface, and TAMs according to the present invention.

FIG. 24 illustrates an example model of a TAM Port 2400 that could be used for interfacing multiple TAMs 2402 within a device 2406 to an external tester 2404. The TAM Port consists of an external low voltage differential signal (LVDS) input 2408 for inputting instructions and data to the TAM Port Interface Controller 2414 and for inputting scan frames to a selected TAM 2402, an external LVDS output 2410 for outputting data from the TAM Port Interface Controller and scan frames from a selected TAM 2402, and an external LVDS control input for controlling the TAM Port Interface Controller and TAM Ports. The TAM Port has an internal TSI output for inputting scan frames to a selected TAM, a internal T/R output for placing the selected TAM in Test or Read mode, an internal CLK output for clocking the selected TAM, an internal Control Bus (CB) for selecting a TAM for Test or Read operation, and an internal TSO for inputting scan frames from a selected TAM. As seen, the TSI and TSO signals may be pipelined if desired. The TAM port's controller 2414 receives input from the tester to output control on the CB that enables the interface circuit 2416 to enable and connect one of the TAMs 2402 to the TSI, T/R, CLK, and TSO signals of the TAM port. After enabling and connecting a TAM, the tester begins inputting and outputting scan frame to the TAM as previously described. While the external input, control, and output signals could use non-differential signaling (i.e. single ended), the LVDS signaling provides improved input and output framing bandwidth between the tester and TAMs.

Figure 25:
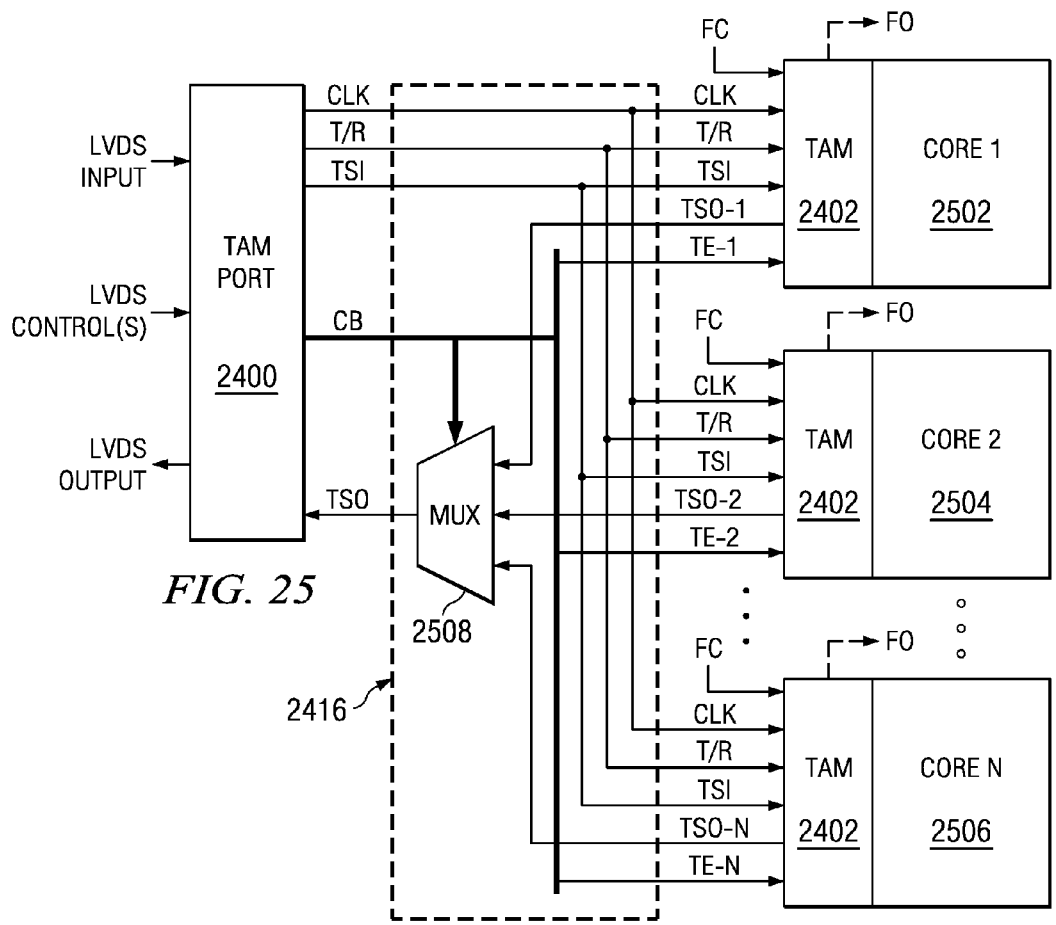
FIG. 25 illustrates a more detail view of the FIG. 24 TAM interface between the TAM Port and TAMs within a die/IC.

FIG. 25 illustrates in more detail the interface 2416 between the TAM Port of FIG. 24 and a set of selectable TAMs 2402, each TAM being coupled to scan paths within cores 2502-2506 as previously described. Each TAM has the standardized CLK, T/R, TSI, TE inputs and TSO output. In response to external input from the tester, the TAM Port sets the control bus (CB) to enable one of the TAMs via TE1-N, to select the TAM for testing or reading via the T/R output, and to couple the selected TAM's TSO output to the TSO input of the TAM Port via multiplexer 2508. After enabling and selecting the TAM, the TAM Port enables its CLK output to time the scan frame input and output operation of the TAM. During test, scan frames input on the external Input of the TAM Port are input to the TSI input of the selected TAM and scan frames from the TSO output of the selected TAM are output the external TAM Port Output. Once started the scan framing input and output operation continues uninterrupted until the TAM test is completed. Following the test operation, the TAM Port receives external input from the tester to switch the T/R output to Read operation. In response to the T/R being set to Read operation, the selected TAM shifts out the results of the test from the Compressor or Fail Logger on the external output to the tester. This TAM selection, test and read process is repeated for each TAM in the device. As seen, each TAM may have a FO signal. If desired the FO signal may be output to the tester by an additional output from the device. Outputting the FO signal allows a tester to immediately detect when a compare failure occurred.

Figure 26:
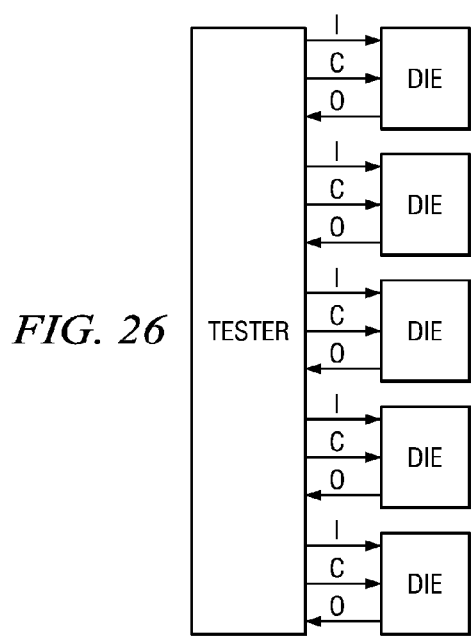
FIG. 26 illustrates individual die/ICs coupled to a tester according to the present invention.

FIG. 26 is provided to illustrate how the TAM port of FIG. 24 could be coupled to the input (I), control (C), and output (O) signals of a tester to allow the individual die testing arrangement described in regard to FIG. 22.

Figure 27:
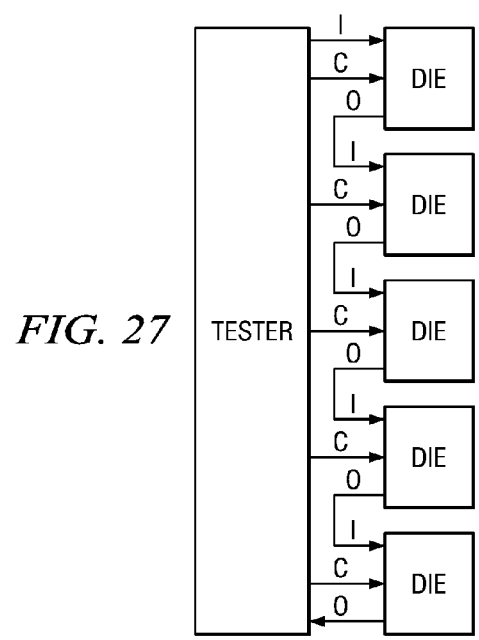
FIG. 27 illustrates a string of die/ICs coupled to a tester according to the present invention.

FIG. 27 is provided to illustrate how the TAM port of FIG. 24 could be coupled to the input (I), control (C), and output (O) signals of a tester to allow the die string testing arrangement described in regard to FIG. 23.

Figure 28:
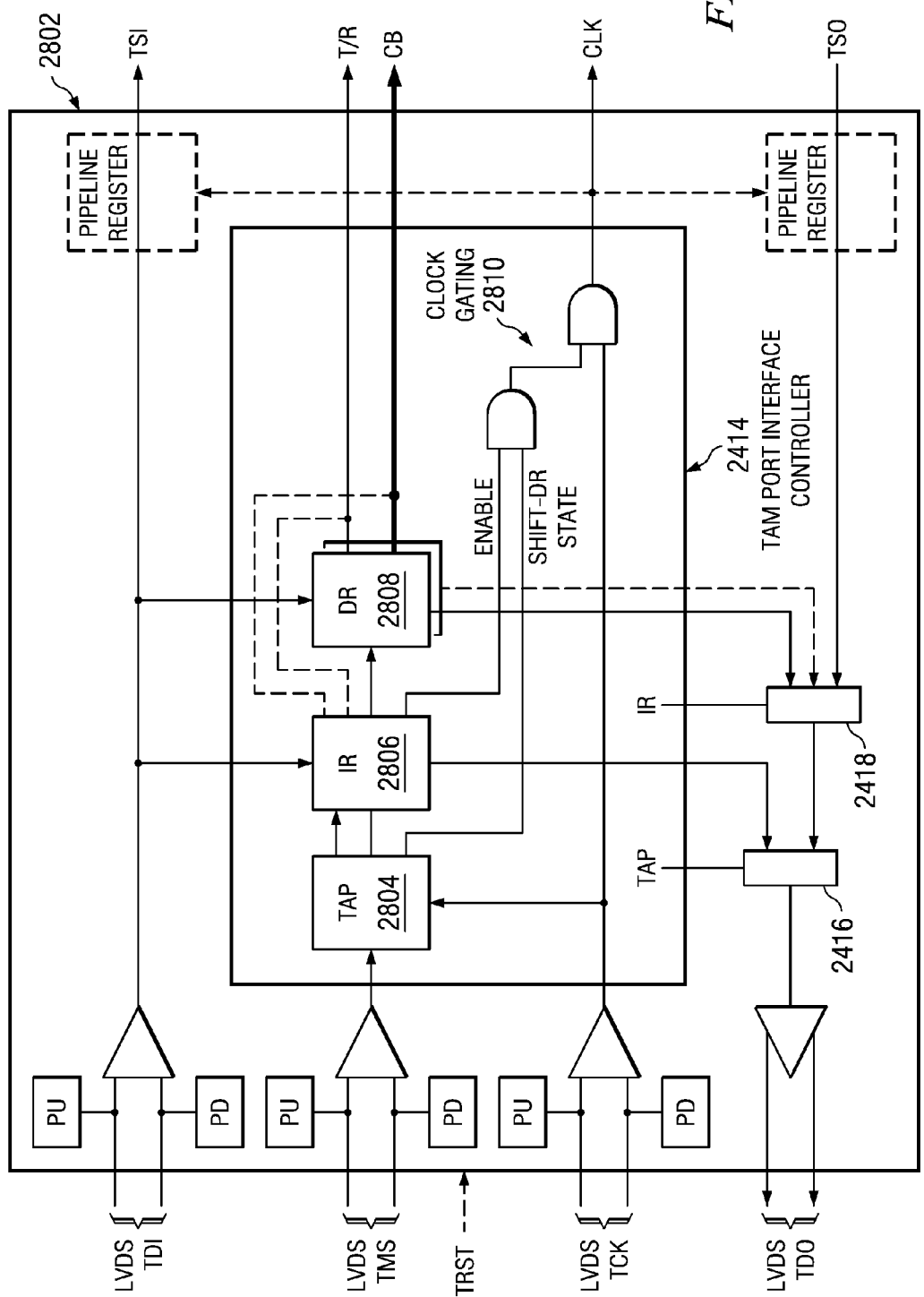
FIG. 28 illustrates a TAP based TAM Port according to the present invention.

FIG. 28 illustrates TAM Port 2802 where the TAM Port Interface Controller 2414 of FIG. 24 is implemented using an IEEE 1149.1 TAP architecture and interface. The TAM Port has a TDI input, a TMS input, an optional TRST input, a TCK input, and a TDO output. The TAM Port Interface Controller consist of a TAP state machine 2804, an instruction register (IR) 2806, data registers (DR) 2808, and clock gating 2810 Multiplexer 2416 is controlled by the TAP to select either the output of the IR or a DR to drive the TDO output. Multiplexer 2418 is controlled by the IR to select the output of a DR or the TSO output from a TAM to be input to multiplexer 2416. While the TAM Port Interface Controller may be realized in many different ways, the TAP based implementation of FIG. 28 is one preferred realization. In response to TMS and TCK input to the TAP 2804, the instruction register (IR) 2806 or data register(s) (DR) 2808 may be serially accessed via TDI and TDO. As seen, the T/R output and CB output may be set by scanning data into a DR 2808. Alternately the T/R and CB outputs may be set by scanning an instruction into the IR 2806, as seen by dotted line. Whether the T/R and CB outputs come from a DR or IR is by design choice. Once the T/R and CB outputs have been setup, an instruction is scanned into the IR to set the clock Enable signal output high. The TAP then transitions to the Shift-DR state where it remains during the selected TAM test or read operation. While in the Shift-DR state, the TAP sets the Shift-DR state signal output high. With the clock Enable and Shift-DR state signal both set high, the Clock Gating circuit 2810 passes the TCK input to the CLK output of the TAM Port to time the selected TAM's test or read operation. During test operation, scan frames input on the TAM Port's TDI are input to the TAM via the TSI output, and scan frames output from the TAM's TSO output are output on the TAM Port's TDO output. This scan framing input and output operation continues uninterrupted at the TCK rate while the TAP is in the Shift-DR state. Note that during test operation, TAM 2000 of FIG. 20 will output response data from RFOR 2008 on TDO instead of scan frames. At the end of test, the TAP transitions from the Shift-DR state which sets the Shift-DR state signal output low and gates off the CLK output to the TAM. Following the test operation, a TAP scan operation is performed to set the T/R output to Read operation. After the T/R output is set to Read operation, the TAP loads an instruction to again set the clock Enable output high, then transitions into the Shift-DR state to enable TCK to drive the CLK output. In response to T/R being set to Read operation and with the CLK output active, the selected TAM shifts out the results of the test from the Compressor or Fail Logger on TDO. This selection, test and read process is repeated for each TAM in the device. As indicated in FIG. 28, LVDS signaling is used on the TAM Port's TDI, TMS, TCK, and TDO terminals. Using LVDS signaling increases the data framing bandwidth between the tester and TAM Port 2802 to 400 Mbps or higher. Alternately, single ended signaling could be used on the TDI, TMS, TCK, and TDO terminals if a lower data framing bandwidth between the tester and TAP Port is acceptable.

Figure 29:
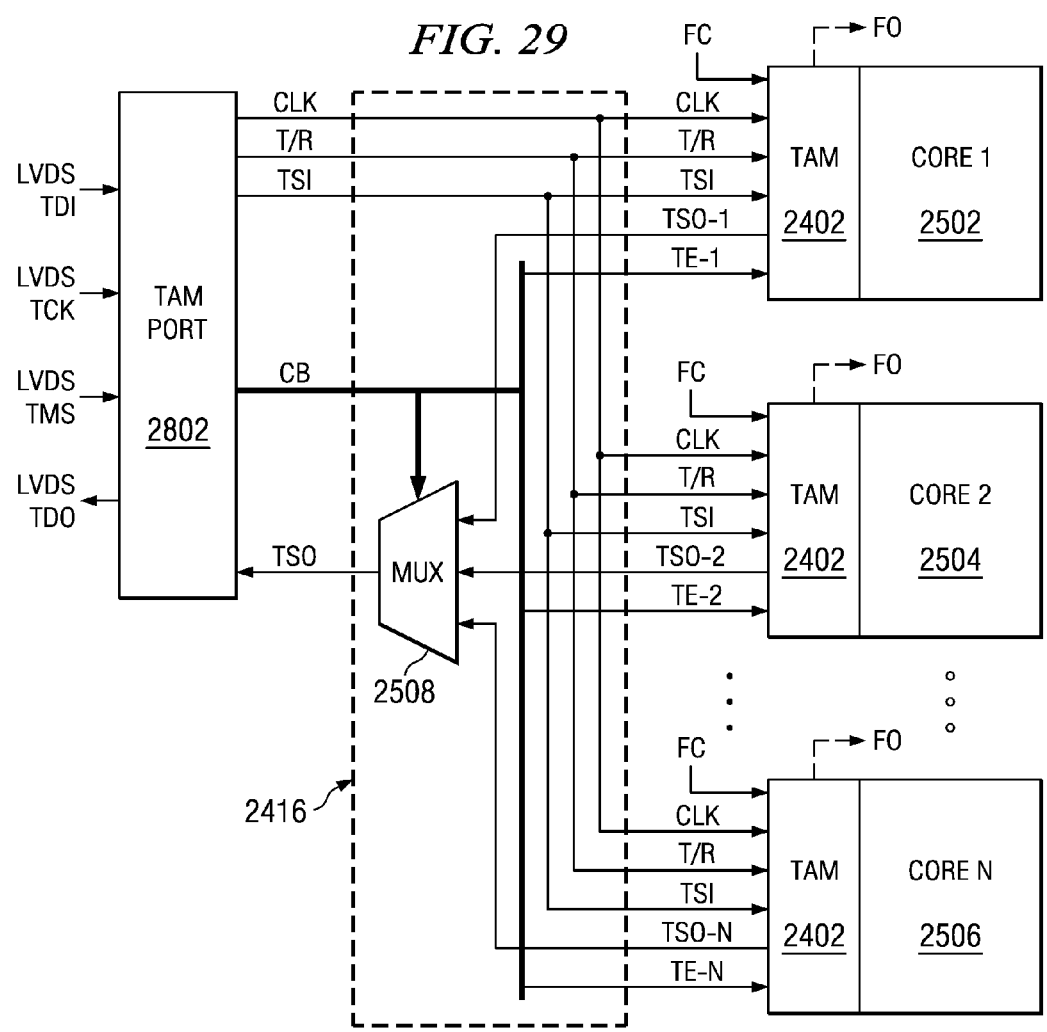
FIG. 29 illustrates a detail view of the TAM interface between the TAP based TAM Port of FIG. 28 and TAMs within a die/IC.

FIG. 29 illustrates the interface between a TAM Port of FIG. 28 and a set of selectable TAMs within a device. This interface is the same as described in FIG. 25 with the exception that the TAM Port of FIG. 28 is used instead of the TAM Port of FIG. 24.

The TAM Port of FIG. 28 can be used to perform test and read operations of individual die/ICs as shown and described in regard to FIGS. 22 and 26, and to perform test and read operations of die/IC strings as shown and described in regard to FIGS. 23 and 27. The input (I) of the devices of FIGS. 22, 23, 26, and 27 will be the TDI input to TAM Port 2802, the control (C) inputs of the devices of FIGS. 22, 23, 26, and 27 will be the TMS, TCK and optional TRST inputs to TAM Port 2802, and the output (O) of the devices of FIGS. 22, 23, 26, and 27 will be the TDO output of TAM Port 2802.

Figure 30:
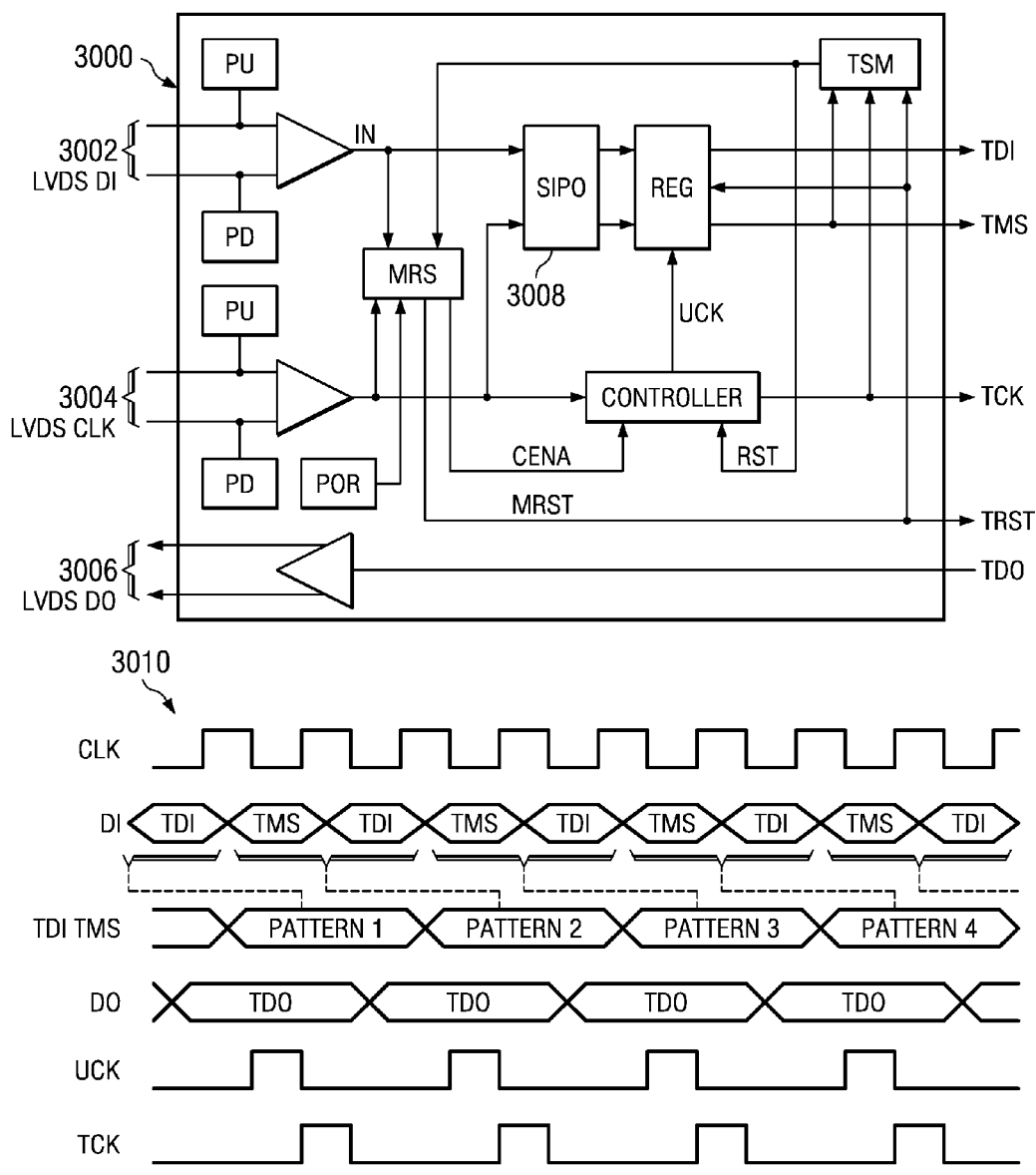
FIG. 30 illustrates a circuit for reducing the number of test signals between a tester and a die/IC according to the present invention.

FIG. 30 illustrates a circuit 3000 for reducing the number of interface signals to the TAM Port of FIG. 28 from 4 or 5 to only 3. The 3 signals include a data input (DI) 3002, a clock input (CLK) 3004, and a data output (DO) 3006. This type of signal reducing circuit is shown and described in FIG. 22A of a pending US patent (TI-60187), which is incorporated herein by reference. The only difference between the previously described circuit of FIG. 22A of the pending patent and the one of FIG. 30 is that the circuit of FIG. 30 uses LVDS signaling on the DI, CLK, and DO signals of FIG. 30, instead of single ended signals OUT, CLK, and TDO of the pending patent's FIG. 22A. Again, LVDS signaling is used to increase the data framing bandwidth between the tester and device. The reduction in interface signals is achieved by sending the TDI and TMS signals in two bit packets over the DI signal 3002. The two bit packets are converted back into individual TDI and TMS signals using serial to parallel register circuitry 3008. As seen in the timing diagram 3010, the CLK 3004 rate is double the TCK rate to allow the signal reducer circuit 3000 to receive the serial two bit packets and convert them into separate TDI and TMS signals. A connected TAM Port 2802 operates using the TDI, TMS, TCK, TRST, and TDO signals at one half the CLK rate.

Figure 31:
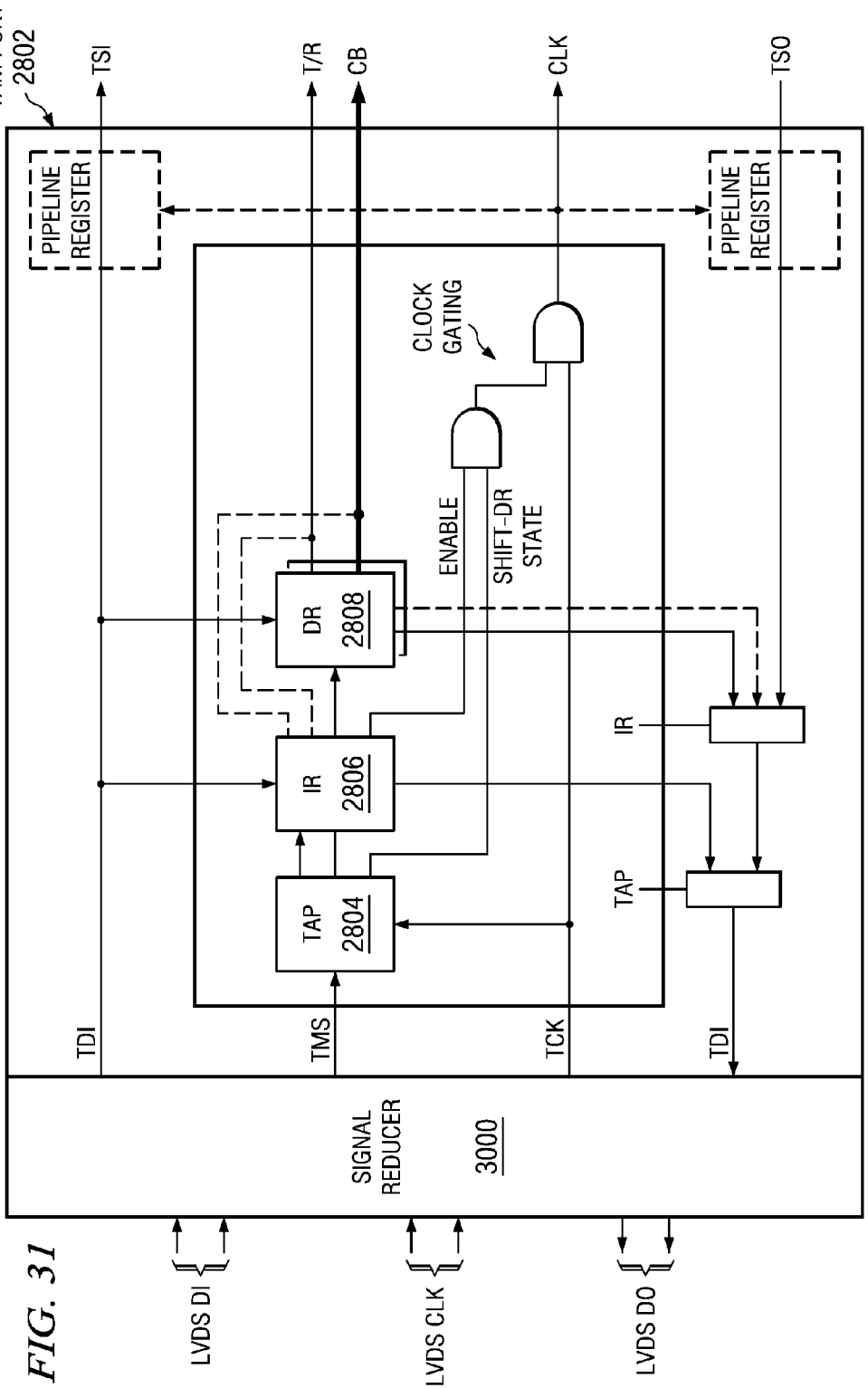
FIG. 31 illustrates the signal reducer circuit of FIG. 30 coupled to a TAP based TAM Port according to the present invention.

FIG. 31 illustrates the signal reducer circuit 3000 of FIG. 30 coupled to the TAM Port 2802 of FIG. 28.

Figure 32:
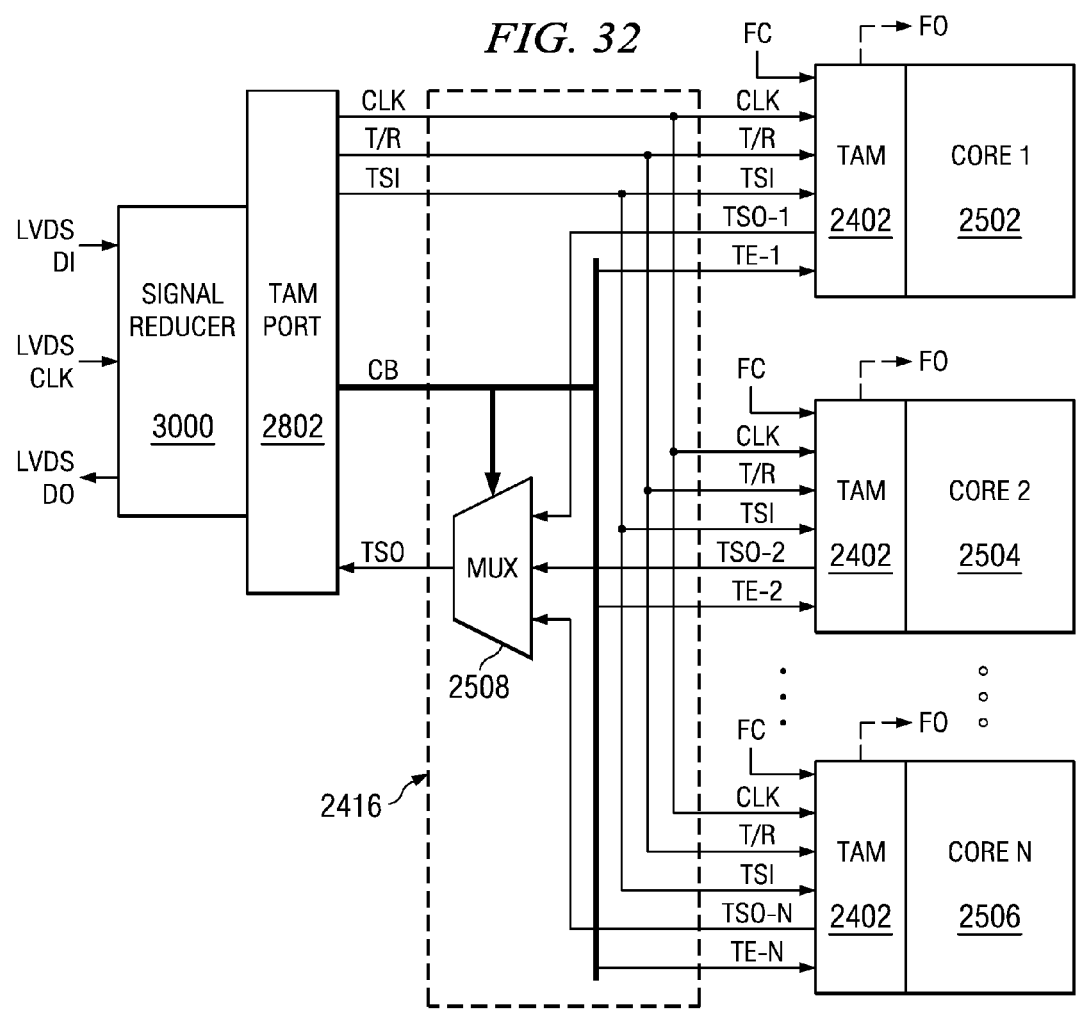
FIG. 32 illustrates a detail view of the TAM interface between the signal reducer and TAP based TAM Port of FIG. 31 and TAMs within a die/IC.

FIG. 32 illustrates the signal reducer circuit 3000 of FIG. 30 and TAM Port 2802 of FIG. 28 interfaced to a set of selectable TAMS 2402 within a device. This interface is the same as described in FIG. 29 with the exception that a signal reducer circuit 3000 is used as the external interface to the TAM Port 2802.

The signal reducer 3000 and TAM Port 2802 of FIG. 32 can only be used to perform test and read operations on individual die/ICs as shown and described in regard to FIGS. 22 and 26. It cannot be used to perform test and read operations of die/IC strings as shown and described in regard to FIGS. 23 and 27. The reason it cannot test and read die/IC strings is that the DI input rate is double the DO output rate, as can be seen in the timing diagram 3010 of FIG. 30. Therefore it is not possible to serially connect the die/ICs into strings and relay data frames to each die/IC in the string as was described earlier in regard FIGS. 23 and 27. The input (I) of the devices of FIGS. 22 and 26 will be the DI input to the signal reducer 3000, the control (C) inputs of the devices of FIGS. 22 and 26 will be the CLK input of the signal reducer 3000, and the output (O) of the devices of FIGS. 22 and 26 will be the DO output of the signal reducer 3000.

Although exemplary embodiments of the present invention are described above, this does not limit the scope of the present invention, which can be practiced in a variety of embodiments.

What is claimed is:

1. An integrated circuit decompress and maskable compress test access mechanism comprising:
   (a) a serial data input lead and a serial data output lead;
   (b) parallel data output leads;
   (c) a scan frame input register having a scan frame input lead connected with the serial data input lead, the scan frame input register including a compressed stimulus section coupled with the parallel data output leads, a compressed mask section, a command section, and a frame marker section connected in series with the serial data input lead; and
   (d) a scan frame copy register having an output coupled with the serial data output lead, the scan frame copy register having a compressed stimulus section coupled to the compressed stimulus section of the scan frame input register, a compressed mask section coupled with the compressed mask section of the scan frame input register, a command section coupled with the command section of the scan frame input register, and a frame marker section coupled to the scan frame marker section of the scan frame input register, the scan frame copy register being coupled to the serial data input lead through the scan frame input register.

2. The integrated circuit of claim 1 including a controller having a clock signal input, a test/read input, a test access mechanism enable input, and control output leads.

3. The integrated circuit of claim 1 in which scan frame input register and the scan frame copy register include control inputs, and including a controller having a clock signal input, a test/read input, a test access mechanism enable input, and control output leads coupled to the control inputs of the scan frame input register and the scan frame copy register.

4. The integrated circuit of claim 1 including core circuitry having scan paths, the scan paths including scan data input leads coupled to the parallel data output leads and scan data output leads coupled to the serial data output lead.

5. The integrated circuit of claim 1 including a controller having a clock signal input, a test/read input, a test access mechanism enable input, and control output leads, and including core circuitry having scan paths, the scan paths including scan data input leads coupled to the parallel data output leads, scan data output leads coupled to the serial data output lead, and control inputs coupled to the control output leads.

* * * * *